United States Patent
Naganuma et al.

(10) Patent No.: US 8,461,459 B2
(45) Date of Patent: Jun. 11, 2013

(54) FLEX-RIGID WIRING BOARD AND METHOD FOR MANUFACTURING THE SAME

(75) Inventors: Nobuyuki Naganuma, Ogaki (JP); Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 149 days.

(21) Appl. No.: 12/894,777

(22) Filed: Sep. 30, 2010

(65) Prior Publication Data

US 2011/0203837 A1 Aug. 25, 2011

Related U.S. Application Data

(60) Provisional application No. 61/307,261, filed on Feb. 23, 2010.

(51) Int. Cl.
*H05K 1/00* (2006.01)

(52) U.S. Cl.
USPC .................. 174/254; 174/255; 174/262

(58) Field of Classification Search
None
See application file for complete search history.

(56) References Cited

U.S. PATENT DOCUMENTS

| | | | | |
|---|---|---|---|---|
| 3,471,348 | A * | 10/1969 | Iles et al. | 216/18 |
| 5,616,888 | A * | 4/1997 | McLaughlin et al. | 174/260 |
| 7,292,448 | B2 * | 11/2007 | Urushibara et al. | 361/748 |
| 7,642,466 | B2 * | 1/2010 | Nikaido et al. | 174/255 |
| 7,977,582 | B2 * | 7/2011 | Clark et al. | 174/262 |
| 2008/0093118 | A1 * | 4/2008 | Takahashi et al. | 174/264 |

FOREIGN PATENT DOCUMENTS

| | | |
|---|---|---|
| JP | 2006-073819 | 3/2006 |
| JP | 2006-210514 | 8/2006 |
| JP | 2006-324406 | 11/2006 |
| JP | 4021472 | 12/2007 |

OTHER PUBLICATIONS

U.S. Appl. No. 12/873,944, filed Sep. 1, 2010, Naganuma, et al.

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A flex-rigid wiring board includes an insulative substrate, a flexible connected body positioned beside the insulative substrate and including multiple flexible wiring boards, and an insulation layer positioned over the insulative substrate and the flexible connected body and having a portion exposing a portion of the flexible connected body. The flexible wiring boards include a double-sided flexible wiring board having a conductive layer on one surface of the double-sided flexible wiring board and a conductive layer on the opposite surface of the double-sided flexible wiring board. The flexible connected body has a conductor on one side of the flexible connected body, a conductor on the opposite side of the flexible connected body, and a through-hole conductor electrically connecting the conductors of the flexible connected body. The through-hole conductor is penetrating from one side through the opposite side of the flexible wiring boards.

32 Claims, 44 Drawing Sheets

FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/307,261, filed Feb. 23, 2010. The contents of that application are incorporated herein by reference in its entirety.

BACKGROUND OF THE INVENTION

1. Field of the Invention

The present invention relates to a bendable wiring board, part of which is formed with a flexible substrate, and to a method for manufacturing such a wiring board.

2. Discussion of the Background

In Japanese Patent Publication No. 4021472, a flex-rigid wiring board is described where wiring patterns on the upper and lower surfaces of a rigid section are connected to each other by a conductor formed in a through hole. In Japanese Laid-Open Patent Publication No. 2006-73819, a flex-rigid wiring board having a double-sided flexible wiring board is described. In such a double-sided flexible wiring board, wiring patterns on the upper and lower surfaces of the flexible substrate are connected to each other by a conductor in a through hole formed in the flexible substrate. In addition, a conductor on the flexible substrate is electrically connected to a conductor in a rigid section. In Japanese Laid-Open Patent Publication No. 2006-324406, a flex-rigid wiring board having multiple flexible wiring boards is described. The direction in which the flexible section is bent is determined beforehand, and the length of a flexible wiring board to be positioned outside when the flexible section is bent is set longer than the length of a flexible wiring board to be positioned inside. In Japanese Laid-Open Patent Publication No. 2006-210514, a flex-rigid wiring board having multiple flexible wiring boards laminated to each other using an adhesive member is described. Such flexible wiring boards are partially detached from each other, while being partially connected. Such flexible wiring boards each have a conductive pattern and a conductor for interlayer connection.

The contents of Japanese Patent Publication No. 4021472 and Japanese Laid-Open Patent Publication Nos. 2006-73819, 2006-324406 and 2006-210514 are incorporated herein by reference in their entirety.

SUMMARY OF THE INVENTION

According to one aspect of the present invention, a flex-rigid wiring board includes an insulative substrate, a flexible connected body positioned beside the insulative substrate and having multiple flexible wiring boards, and an insulation layer positioned over the insulative substrate and the flexible connected body and having a portion exposing a portion of the flexible connected body. The flexible wiring boards include a double-sided flexible wiring board having a conductive layer on one surface of the double-sided flexible wiring board and a conductive layer on the opposite surface of the double-sided flexible wiring board. The flexible connected body has a conductor on one side of the flexible connected body, a conductor on the opposite side of the flexible connected body, and a through-hole conductor electrically connecting the conductor on the one side of the flexible connected body and the conductor on the opposite side of the flexible connected body. The through-hole conductor of the flexible connected body is penetrating from one side of the multiple flexible wiring boards through the opposite side of the multiple flexible wiring boards.

According to another aspect of the present invention, a method for manufacturing a flex-rigid wiring board includes forming a flexible connected body having multiple flexible wiring boards and a through-hole conductor penetrating from one side of the multiple flexible wiring boards through the opposite side of the multiple flexible wiring boards, positioning the flexible connected body beside an insulative substrate, positioning an insulation layer over the insulative substrate and the flexible connected body such that a portion of the flexible connected body is exposed from the insulation layer, and connecting the insulative substrate, the flexible connected body and the insulation layer. The flexible wiring boards include a double-sided flexible wiring board having a conductive layer on one surface of the double-sided flexible wiring board and a conductive layer on the opposite surface of the double-sided flexible wiring board. The flexible connected body has a conductor on one side of the flexible connected body and a conductor on the opposite side of the flexible connected body. The through-hole conductor is electrically connecting the conductor on the one side of the flexible connected body and the conductor on the opposite side of the flexible connected body.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 51A is a view showing a first alternative example of a horizontal cross-sectional shape of a connection conductor or the like;

FIG. 51B is a view showing a second alternative example of a horizontal cross-sectional shape of a connection conductor or the like;

FIG. 51C is a view showing a third alternative example of a horizontal cross-sectional shape of a connection conductor or the like;

DETAILED DESCRIPTION OF THE EMBODIMENTS

Figure 1:
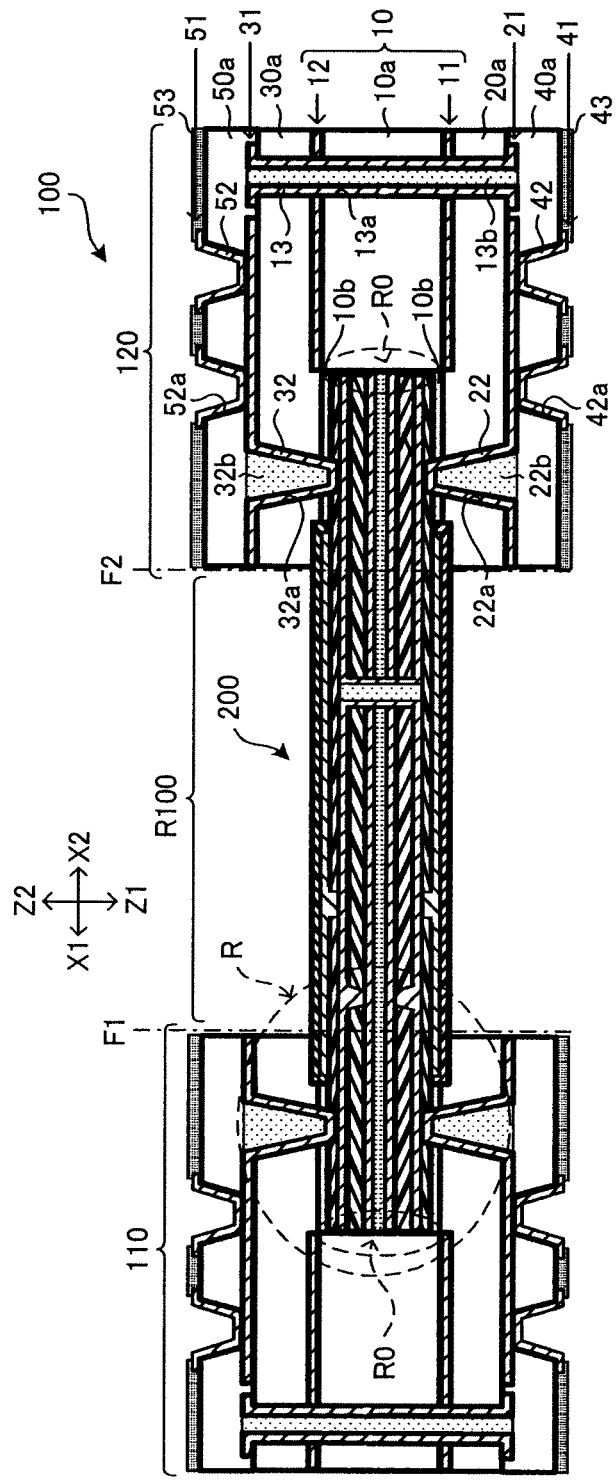
FIG. 1 is a cross-sectional view of a flex-rigid wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding connection conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as a circuit (including ground), a layer with only a plain pattern is also referred to as a wiring layer. Among the conductors formed inside holes, the conductive film formed on wall surfaces (side and bottom surfaces) of a hole is referred to as a conformal conductor, and the conductor filled in a hole is referred to as a filled conductor. Wiring layers may include lands or the like of connection conductors along with the above conductive patterns.

Plating indicates depositing conductors (such as metal) to form layers on the surfaces of metal, resin or the like, and such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values, average values, or maximum values and the like of corresponding portions. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

Flex-rigid wiring board 100 of the present embodiment is a printed wiring board. As shown in FIG. 1 (cross-sectional view) and FIG. 2 (plan view), flex-rigid wiring board 100 has rigid sections (110, 120) and flexible connected body 200. Rigid section 110 and rigid section 120 are connected to each other by flexible connected body 200. Namely, rigid section 110 and rigid section 120 face each other by sandwiching flexible connected body 200. In particular, both end portions of flexible connected body 200 are inserted into rigid sections (110, 120). Then, rigid sections (110, 120) and flexible connected body 200 are connected to each other in the inserted portion. In the following, connected sections of flexible connected body 200 and rigid sections (110, 120) are referred to as F-R connection sections.

Figure 2:
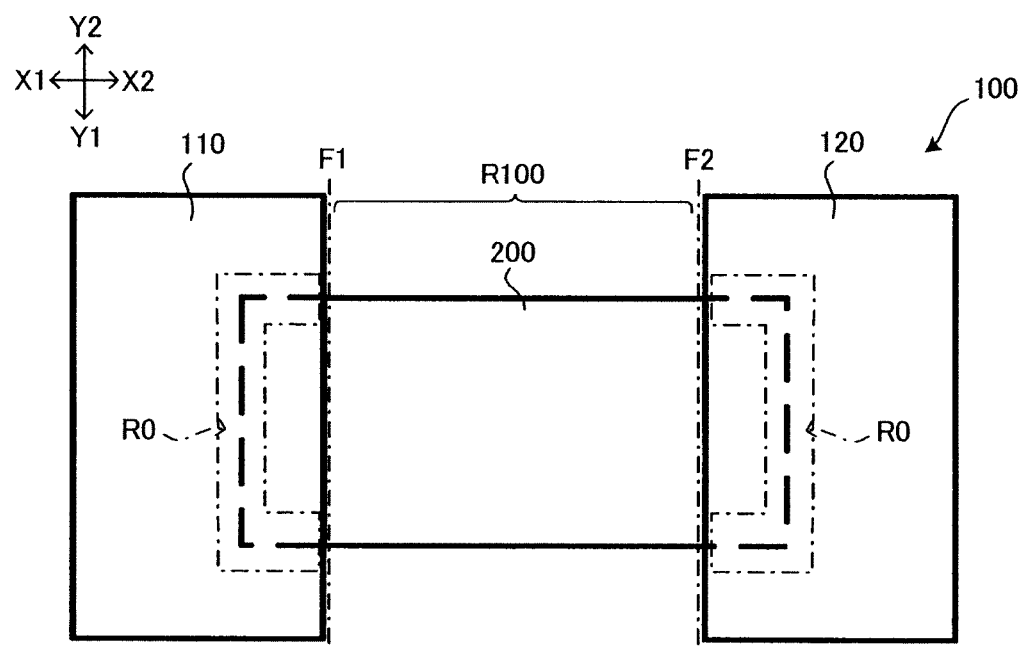
FIG. 2 is a plan view of the flex-rigid wiring board according to the embodiment of the present invention.

In FIGS. 1 and 2, F-R boundary surface (F1) is a surface that corresponds to the boundary between rigid section 110 and flexible section (R100), and F-R boundary surface (F2) is a surface that corresponds to the boundary between rigid section 120 and flexible section (R100). Also, flexible section (R100) is a flexible section sandwiched between rigid section 110 and rigid section 120, namely part of flexible connected body 200 exposed between F-R boundary surface (F1) and F-R boundary surface (F2).

Rigid sections (110, 120) have substrate 10, insulation layers (20a, 30a, 40a, 50a), wiring layers (21, 31, 41, 51), connection conductors (13, 22, 32, 42, 52), and solder-resist layers (43, 53). Substrate 10 is positioned beside flexible connected body 200 (in direction X). Space may or may not exist between substrate 10 and flexible connected body 200. Substrate 10 and insulation layers (20a, 30a) on both of its sides correspond to the core section. Insulation layers and others positioned as upper layers to the core section correspond to built-up sections.

Substrate 10 (the core substrate of flex-rigid wiring board 100) has insulation layer (10*a*) and wiring layers (11, 12).

Insulation layer (10*a*) is an insulative substrate. Such an insulative substrate is insulative material to be used when manufacturing a printed wiring board. Insulation layer (10*a*) may be formed by impregnating glass cloth, paper or the like with insulative phenol resin, epoxy resin, polyimide, BT resin or the like. Alternatively, insulation layer (10*a*) may be formed by combining inorganic filler with phenol resin, epoxy resin, polyimide, BT resin or the like. In the present embodiment, insulation layer (10*a*) is made of epoxy resin. Epoxy resin is preferred to contain reinforcing material made of inorganic material such as glass fiber (glass cloth or glass non-woven fabric, for example) or aramid fiber (aramid non-woven fabric, for example) impregnated with resin. Reinforcing material is a material having a smaller thermal expansion coefficient than the primary material (epoxy resin in the present embodiment).

In the present embodiment, since an insulative substrate is positioned beside flexible connected body 200, its position is suppressed from being shifted when thermal stress is exerted. As a result, it is thought that the positioning stability of an F-R connection section will be enhanced, leading to improved connection reliability.

Figure 3:
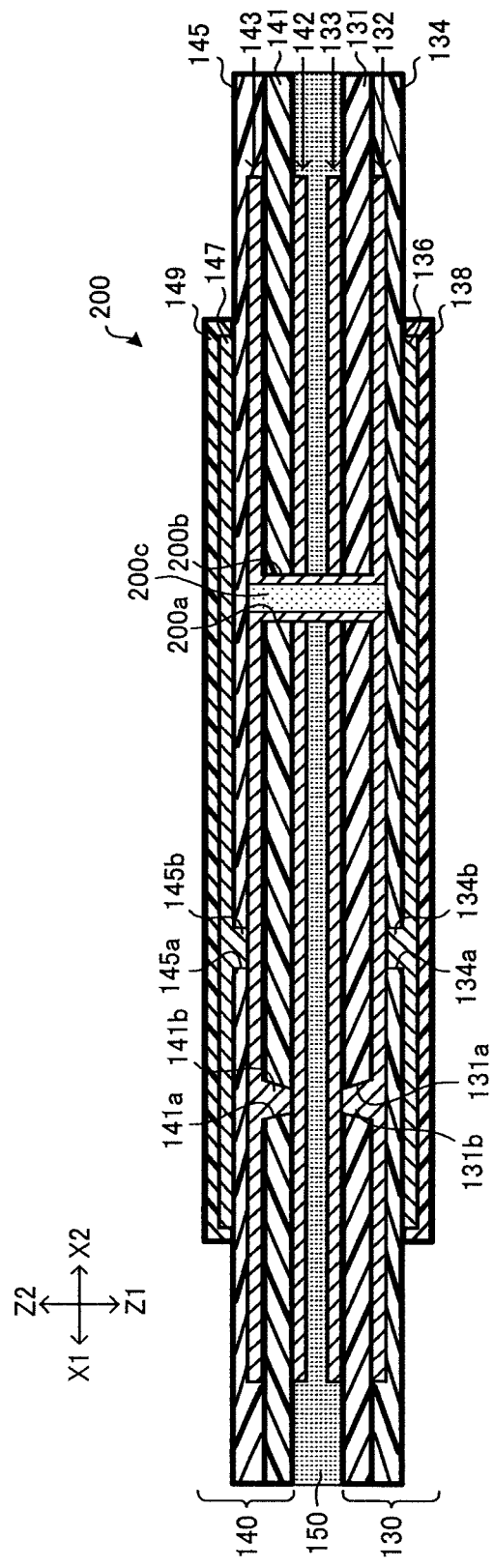
FIG. 3 is a cross-sectional view of a flexible connected body.

As shown in FIG. 3, for example, flexible connected body 200 has flexible wiring board 130 and flexible wiring board 140. In the present embodiment, flexible wiring board 130 and flexible wiring board 140 have substantially the same structure as each other. However, they are not limited to such and may have a different structure from each other (see later-described FIGS. 35, 36).

Flexible wiring boards (130, 140) are each a double-sided flexible wiring board. Namely, flexible wiring boards (130, 140) have conductive layers on both of their surfaces. A diverting route by wiring layers (132, 133) is formed on the first-surface side of flexible connected body 200, and a diverting route by wiring layers (142, 143) is formed on the second-surface side of flexible connected body 200. Also, a hole (through hole 200*a*) is formed to penetrate through flexible wiring boards (130, 140), and conductor (200*b*) is formed in through hole (200*a*). Accordingly, the above diverting routes are electrically connected to each other by conductor (200*b*) (through-hole conductor). If such a structure is employed, when high current flows between rigid section 110 and rigid section 120, such current will be divided into diverting routes. Thus, it is thought that delayed signals, generated heat and the like may be suppressed from occurring in flexible section (R100). However, the present invention is not limited to such, and either flexible wiring board 130 or 140 may be set as a single-sided flexible wiring board (see later-described FIG. 36).

Bonding sheet 150 (adhesive member) is positioned between flexible wiring board 130 and flexible wiring board 140. The second-surface side of flexible wiring board 130 and the first-surface side of flexible wiring board 140 are physically connected by bonding sheet 150.

Flexible wiring board 130 has flexible substrate 131 (core substrate of flexible wiring board 130), wiring layers (132, 133), inner coverlay 134, shield layer 136, and outer coverlay 138. Wiring layer 132 is formed on the first surface of flexible substrate 131, and wiring layer 133 is formed on the second surface of flexible substrate 131. Inner coverlay 134 is formed over flexible substrate 131. Inner coverlay 134 coats wiring layer 132 and insulates it from the outside. Shield layer 136 is formed on inner coverlay 134.

Flexible substrate 131 has connection conductor (131*b*). In particular, hole (131*a*) is formed in flexible substrate 131. For example, connection conductor (131*b*) is formed by filling copper plating, for example, in hole (131*a*). Wiring layer 132 and wiring layer 133 are electrically connected by connection conductor (131*b*).

In addition, inner coverlay 134 has connection conductor (134*b*). In particular, hole (134*a*) is formed in inner coverlay 134. Connection conductor (134*b*) is formed by filling silver conductive paste, for example, in hole (134*a*). Shield layer 136 and wiring layer 132 are electrically connected by connection conductor (134*b*).

Outer coverlay 138 is formed over inner coverlay 134. Then, outer coverlay 138 coats shield layer 136.

Flexible wiring board 140 has flexible substrate 141 (core substrate of flexible wiring board 140), wiring layers (142, 143), inner coverlay 145, shield layer 147, and outer coverlay 149. Wiring layer 142 is formed on the first surface of flexible substrate 141, and wiring layer 143 is formed on the second surface of flexible substrate 141. Inner coverlay 145 is formed over flexible substrate 141. Inner coverlay 145 coats wiring layer 143 and insulates it from the outside. Shield layer 147 is formed on inner coverlay 145.

Flexible substrate 141 has connection conductor (141*b*). In particular, hole (141*a*) is formed in flexible substrate 141. For example, connection conductor (141*b*) may be formed by filling copper plating, for example, in hole (141*a*). Wiring layer 142 and wiring layer 143 are electrically connected by connection conductor (141*b*).

In addition, inner coverlay 145 has connection conductor (145*b*). In particular, hole (145*a*) is formed in inner coverlay 145. Connection conductor (145*b*) is formed by filling silver conductive paste, for example, in hole (145*a*). Shield layer 147 and wiring layer 143 are electrically connected by connection conductor (145*b*).

Flexible substrates (131, 141) are made of insulative polyimide or liquid crystal polymer, for example. The thickness of flexible substrates (131, 141) is 20-50 μm, for example, preferably approximately 25 μm.

Figure 4A:
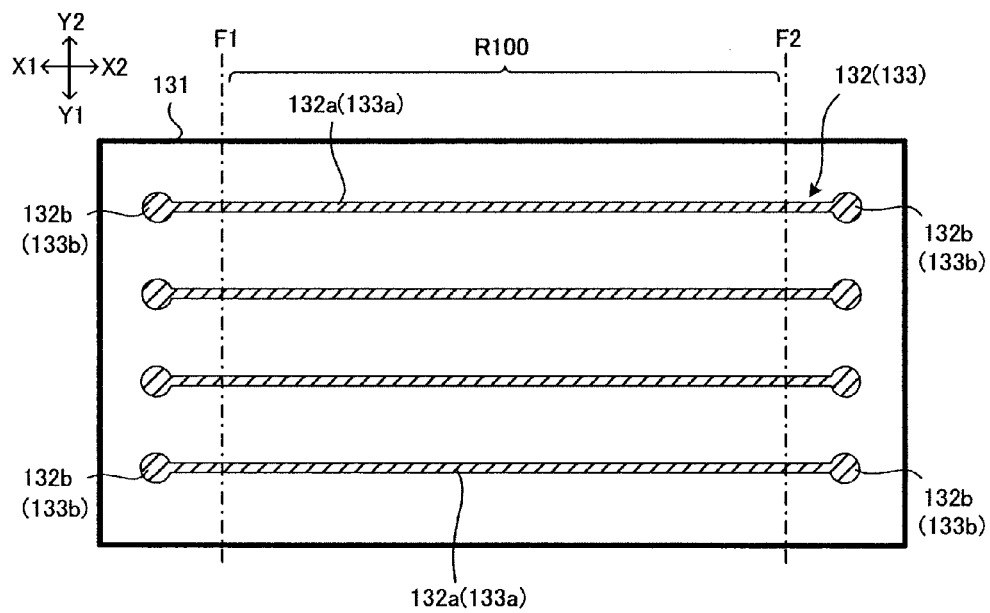
FIG. 4A is a view showing wiring on the upper and lower surfaces of a first flexible substrate.
Figure 4B:
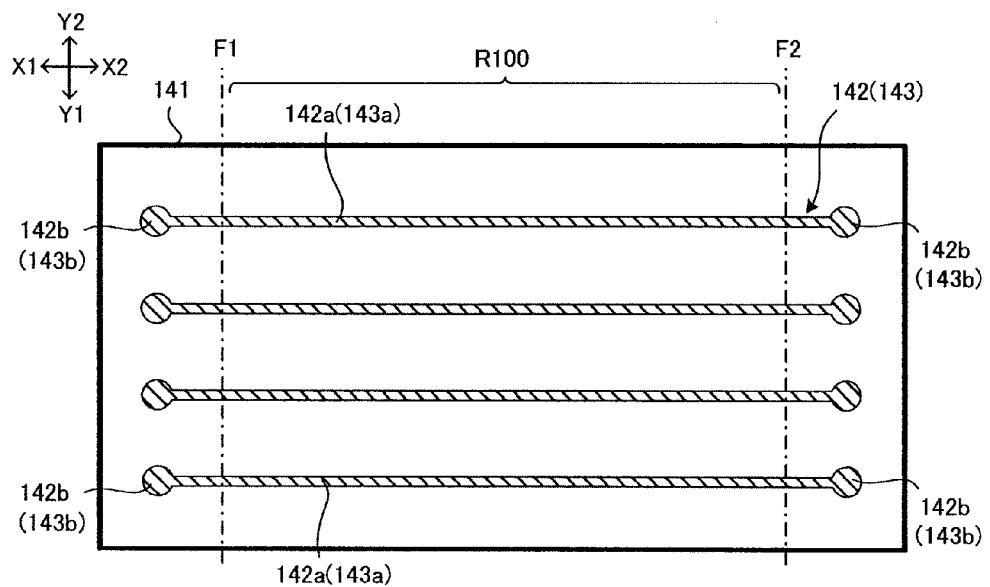
FIG. 4B is a view showing wiring on the upper and lower surfaces of a second flexible substrate.

As shown in FIG. 4A, wiring layers (132, 133) on flexible substrate 131 have striped wirings (132*a*, 133*a*) and terminals (lands) (132*b*, 133*b*). Also, wiring layers (142, 143) on flexible substrate 141 have striped wirings (142*a*, 143*a*) and terminals (lands) (142*b*, 143*b*) as shown in FIG. 4B. Directly under wiring (132*a*) on the first-surface side of flexible substrate 131 (in direction Z), wiring (133*a*) on the second-surface side is positioned. Also, directly under wiring (133*a*) (in direction Z), wiring (142*a*) on the first-surface side of flexible substrate 141 is positioned. Moreover, directly under wiring (142*a*) (in direction Z), wiring (143*a*) on the second-surface side is positioned. Namely, in such an example, wiring (132*a*) on one side of flexible wiring board 131 is positioned on an orthogonal projection region of wiring (133*a*) on the other side, and wiring (142*a*) on one side of flexible wiring board 141 is positioned on an orthogonal projection region of wiring (143*a*) on the other side.

In the present embodiment, wirings (132*a*, 133*a*, 142*a*, 143*a*) are formed on substantially a straight line. Then, a conductive pattern (such as a circuit) in rigid section 110 and a conductive pattern (such as a circuit) in rigid section 120 are connected to each other by wirings (132*a*, 133*a*, 142*a*, 143*a*). Wiring layers (132, 133, 142, 143) are made of copper, for example.

Figure 5A:
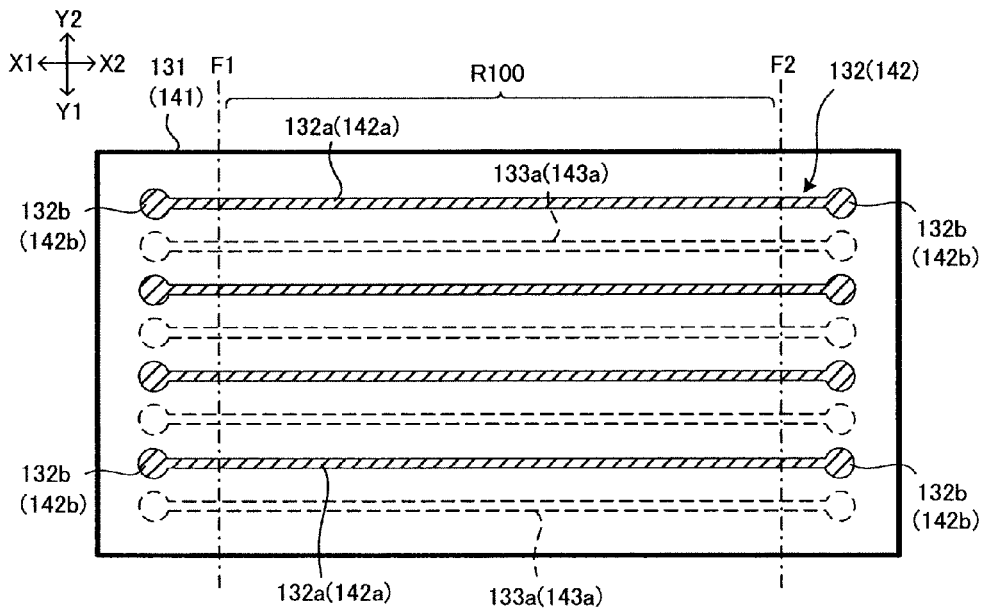
FIG. 5A is a view showing wiring on the first surface of the first flexible substrate and of the second flexible substrate.
Figure 5B:
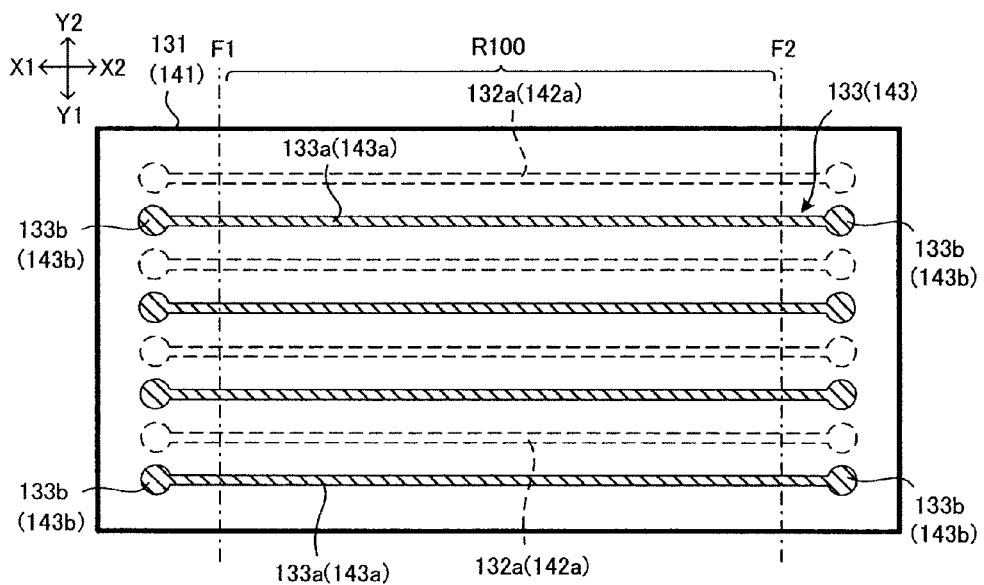
FIG. 5B is a view showing wiring on the second surface of the first flexible substrate and of the second flexible substrate.

Wirings on the upper and lower surfaces of flexible substrate 131 (wirings 132*a*, 133*a*) and wirings on the upper and lower surfaces of flexible substrate 141 (wirings 142*a*, 143*a*) may be positioned to overlap along axis Z, as shown in FIGS. 4A and 4B respectively. However, to enhance the bendability of flexible section (R100), it is preferred that wirings on the upper and lower surfaces of flexible substrate 131 (wirings 132a, 133a) and wirings on the upper and lower surfaces of flexible substrate 141 (wirings 142a, 143a) be alternately positioned as shown in FIGS. 5A and 5B respectively. In an example shown in FIGS. 5A and 5B, wiring (132a) and wiring (133a) are positioned to alternate in direction Y, and wiring (142a) and wiring (143a) are positioned to alternate in direction Y. Specifically, wiring (133a) on the second-surface side is positioned while avoiding being directly under wiring (132a) on the first-surface side of flexible wiring board 131 (in direction Z). Also, wiring (143a) on the second-surface side is positioned while avoiding being directly under wiring (142a) on the first-surface side of flexible substrate 141 (in direction Z). Namely, in such an example, wiring (132a) on one side of flexible wiring board 131 is positioned on a region that excludes an orthogonal projection region of wiring (133a) on the other side, and wiring (142a) on one side of flexible wiring board 141 is positioned on a region that excludes an orthogonal projection region of wiring (143a) on the other side.

When arranging wirings in flexible section (R100), if rigid wirings are concentrated in a portion, it is thought that rigidity will increase in that portion. Thus, by alternately positioning wirings as above to mitigate concentration of wirings in flexible section (R100), it is thought that bendability will be enhanced in flexible section (R100). It is thought that such a structure will be especially effective when wiring density is high in flexible section (R100).

Figure 6:
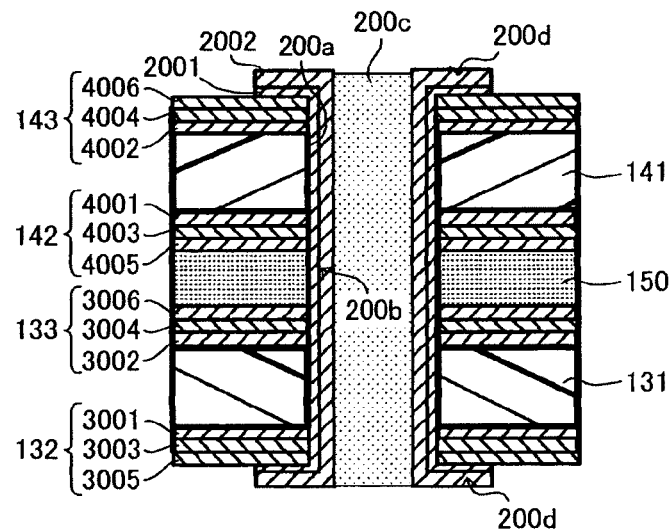
FIG. 6 is a view showing the structure near a through hole formed in a flexible connected body.

More specifically, as shown in FIG. 6, wiring layer 132 is a triple-layer conductive layer having metal foil 3001, electroless plating 3003 and electrolytic plating 3005 arranged from a lower layer toward an upper layer; and wiring layer 133 is a triple-layer conductive layer having metal foil 3002, electroless plating 3004 and electrolytic plating 3006 arranged from a lower layer toward an upper layer. Also, wiring layer 142 is a triple-layer conductive layer having metal foil 4001, electroless plating 4003 and electrolytic plating 4005 arranged from a lower layer toward an upper layer; and wiring layer 143 is a triple-layer conductive layer having metal foil 4002, electroless plating 4004 and electrolytic plating 4006 arranged from a lower layer toward an upper layer. When such a triple-layer structure is employed, metal foil (such as copper foil) and flexible substrate 131 or 141 are adhered, and then plating will be laminated on the metal foil. Accordingly, connection between flexible substrate 131 and wiring layers (132, 133) on both of its surfaces, as well as connection between flexible substrate 141 and wiring layers (142, 143) on both of its surfaces are each thought to become firm. However, the structure of wiring layers (132, 133, 142, 143) is not limited to the above, and any other type may be employed. For example, unless necessary, metal foil and electroless plating may be omitted.

Inner coverlays (134, 145) (FIG. 3) are made of polyimide, for example. The thickness of inner coverlays (134, 145) is approximately 5-30 μm, for example.

Shield layers (136, 147) (FIG. 3) shield electromagnetic noise from the outside to wiring layers (132, 143), as well as shield electromagnetic noise from wiring layers (132, 143) to the outside. Shield layers (136, 147) are made of conductive paste, for example. The thickness of shield layers (136, 147) is approximately 10-30 μm, for example.

The conductive paste forming shield layers (136, 147) contains fine silver particles, for example. Conductive paste is preferred to contain at least one kind from among silver, gold, copper and carbon. Since silver has especially high electrical conductivity, it is effective to reduce noise. However, the material for shield layers (136, 147) is not limited to such, and any other type may also be used.

Outer coverlays (138, 149) (FIG. 3) insulate as well as protect the entire flexible connected body 200 from the outside. Outer coverlays (138, 149) are made of polyimide, for example. The thickness of outer coverlays (138 149) is approximately 5-30 μm, for example.

As for material for bonding sheet 150, it is preferred to use material having a smaller CTE (coefficient of thermal expansion) (hard material) than the material (soft material) for flexible substrates (131, 141). If such a material is used, the CTE of the inner material (bonding sheet 150) of flexible connected body 200 becomes smaller than the CTE of the outer material (flexible substrates 131, 141). Moreover, in the present embodiment, since bonding sheet 150 exists not only in flexible section (R100) but also in the sections (F-R connection sections) where flexible connected body 200 is inserted in rigid section 110 or 120, even when thermal stress is exerted on flexible connected body 200, flexible connected body 200 will be suppressed from being entirely deformed. As a result, it is thought that positions of connection conductors (22, 32) will be secured more firmly and electrical connection reliability will be enhanced in the F-R connection sections. Also, as a result, positioning stability of the F-R connection sections will increase, leading to enhanced connection reliability. Such a structure is thought to be especially effective in a wiring board with many wiring layers (multilayer wiring board). As material for bonding sheet 150, epoxy resin is preferred, for example. However, the material for bonding sheet 150 is not limited to such, and any other resin (such as thermosetting resin or thermoplastic resin) may also be used. Also, not only part of bonding sheet 150, but entire bonding sheet 150 may exist in rigid sections (110, 120) of flex-rigid wiring board 100 (see later-described FIG. 34A).

As shown in FIG. 6, in flexible substrates (131, 141), wiring layers (132, 133, 142, 143) and bonding sheet 150, through hole (200a) which penetrates through them is formed. Wiring layer 132 formed on the first-surface side of flexible substrate 131 and wiring layer 143 formed on the second-surface side of flexible substrate 141 are connected by conductor (200b) in through hole (200a). Moreover, in the present embodiment, wiring layers (133, 142) are electrically connected to each other by conductor (200b).

Electroless plating 2001 and electrolytic plating 2002 are formed to be contiguous from the wall surface of through hole (200a) to wiring layers (132, 143). Accordingly, conductor (200b) is formed on the wall surface of through hole (200a), and lands (200d) are formed around opening portions of through hole (200a). In addition, insulative body (200c) (such as resin) is filled inside conductor (200b). In flexible connected body 200, conductor (200b) becomes a column that connects wiring layer 132 and wiring layer 143. When flexible substrates (131, 141) are bent, or are affected by thermal history, flexible substrates (131, 141) are deformed. However, since wiring layers (132, 143) are secured by the pinning effect of such a column, it is thought that positions of wiring layers (132, 143) formed on flexible substrates (131, 141) will be secured, leading to enhanced electrical connection stability. As a result, positions of connection conductors (22, 32) are secured, and electrical connection reliability will be enhanced in the F-R connection sections.

Also, as shown in FIG. 3, connection conductor (131b) and connection conductor (141b) are both tapered cylinders, narrowing toward the core (bonding sheet 150), and face each other by sandwiching the core so as to be positioned symmetrically in vertical directions. In such a structure, since the horizontal cross-sectional area of connection conductors (131b, 141b) decreases as they come closer to the core, pressure (=force/area) with which connection conductors (131b, 141b) press against the core increases. Accordingly, it is thought that positions of wiring layers (132, 143) formed on flexible substrates (131, 141) will be secured, leading to enhanced electrical connection stability. As a result, positions of connection conductors (22, 32) are secured, and electrical connection reliability will be enhanced in the F-R connection sections.

By combining a structure where plating is filled in the above-mentioned holes (131a, 141a), a structure where conductor (200b) is formed on the wall surface of above through hole (200a), and a structure where above connection conductors (131b, 141b) face each other by being positioned symmetrically in vertical directions, it is expected that multiplied effects, which cannot be achieved from an individual structure alone, will be achieved.

Insulative body (200c) is filled by material for inner coverlay 134 or 145 which has flowed into through hole (200a), for example. However, filling through hole (200a) is not limited to such, and any other material may be filled separately in through hole (200a). Also, conductor (200b) is not limited to being a conformal conductor, and may also be a filled conductor, for example. The number of through holes (200a) and conductors (200b) is not limited specifically (see later-described FIG. 41).

In the present embodiment, conductor (200b) is formed with electroless plating 2001 and electrolytic plating 2002. However, conductor (200b) is not limited to such, and electroless plating 2001 may be omitted as long as adhesiveness is achieved between electrolytic plating 2002 and the wall surface of through hole (200a), for example. To enhance their adhesiveness, it is preferred to conduct a surface treatment such as black oxide/reduction, for example, on the wall surface of through hole (200a).

Figure 7A:
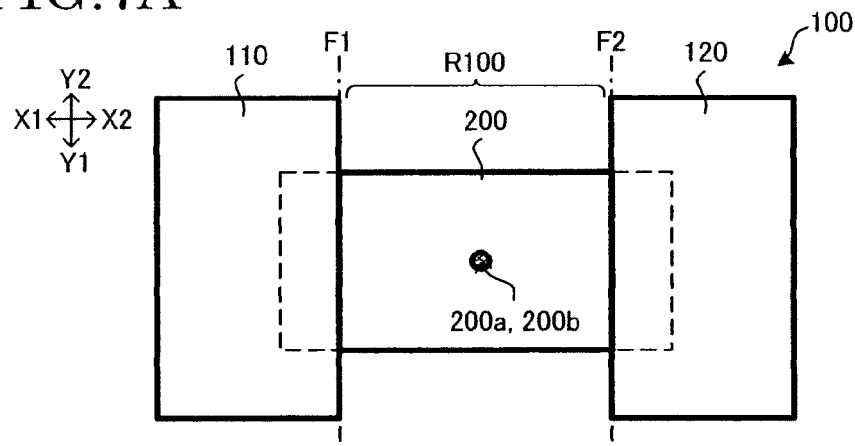
FIG. 7A is a view showing a first example of the position of a through hole formed in a flexible connected body.
Figure 7B:
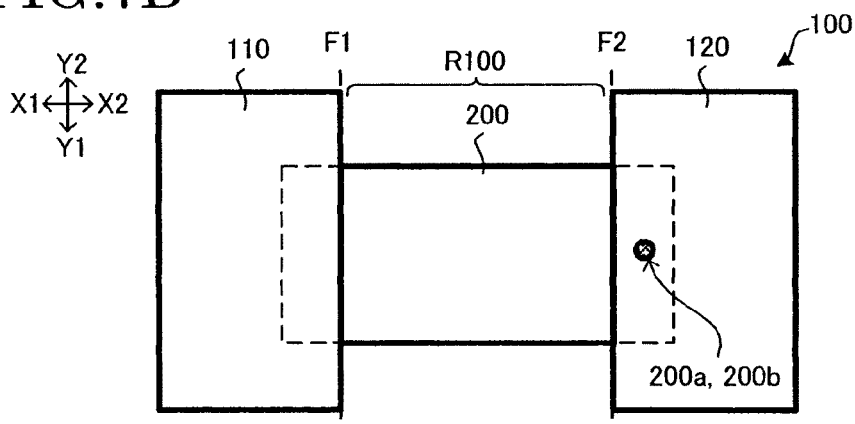
FIG. 7B is a view showing a second example of the position of a through hole formed in a flexible connected body.
Figure 8:
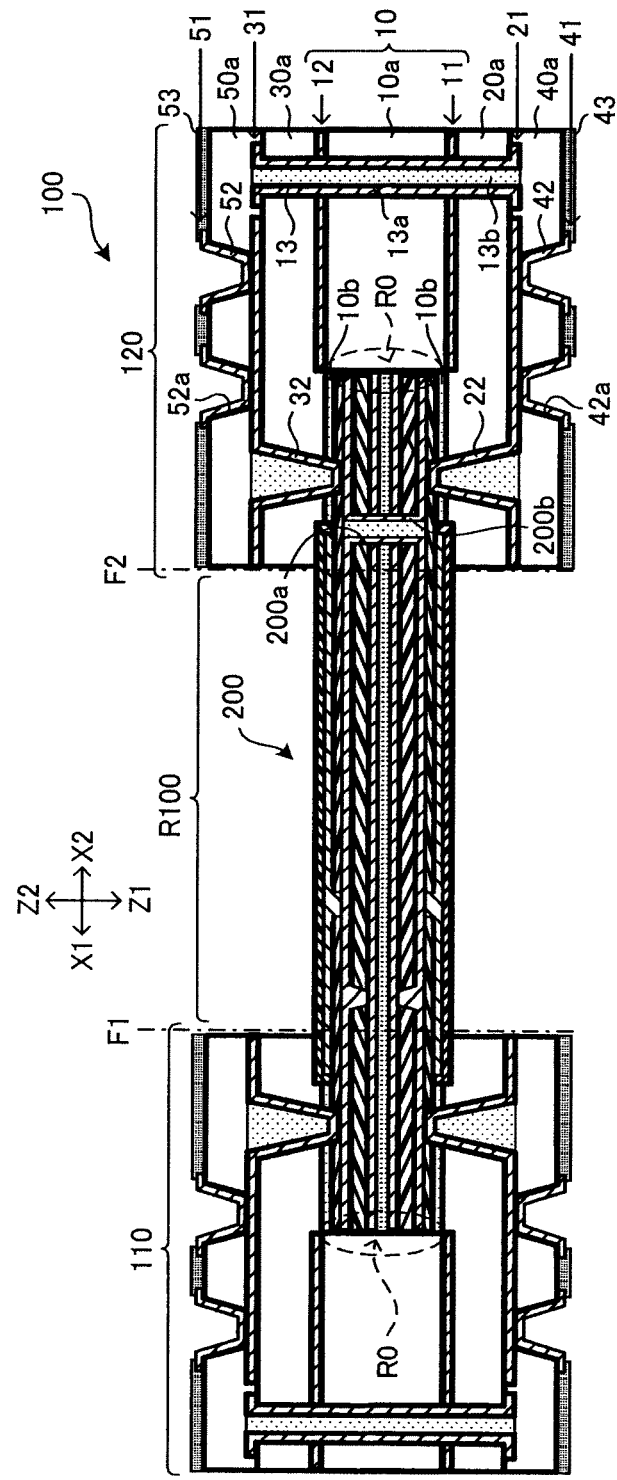
FIG. 8 is a cross-sectional view showing the flex-rigid wiring board in FIG. 7B.

Through hole (200a) and conductor (200b) may be positioned in the middle between rigid section 110 and rigid section 120 (for example, in the middle of flexible section R100) as shown in FIG. 7A, for example. However, the position is not limited to such and they may be positioned closer to either rigid section 110 or 120. In addition, the position of through hole (200a) and conductor (200b) is not limited to flexible section (R100); for example, as shown in FIG. 7B and FIG. 8 (cross-sectional view of flex-rigid wiring board 100 shown in FIG. 7B), through hole (200a) and conductor (200b) may be positioned in the portion where flexible connected body 200 is inserted into rigid section 110 or 120, namely, in rigid section 110 beside F-R boundary surface (F1) or in rigid section 120 beside F-R boundary surface (F2). By positioning through hole (200a) in rigid section 110 beside F-R boundary surface (F1) or in rigid section 120 beside F-R boundary surface (F2), distance is reduced between connection conductors (22, 32) and through hole (200a). Thus, it is thought that the positions of connection conductors (22, 32) will seldom be shifted, and that electrical connection reliability will be enhanced in the F-R connection sections. In addition, since through hole (200a) does not exist in flexible section (R100) which is to be bent, it is thought that bending flexible section (R100) will become easier.

As shown in FIGS. 1 and 2, insulation layers (20a, 30a) are each positioned on boundary portion (R0) between insulation layer (10a) and flexible connected body 200, and expose flexible section (R100). Among them, insulation layer (20a) is laminated on the first-surface side of an end portion in flexible connected body 200 and of insulation layer (10a). Specifically, insulation layer (20a) of rigid section 110 is laminated on the first-surface side of the X1-side end portion of flexible connected body 200, and insulation layer (20a) of rigid section 120 is laminated on the first-surface side of the X2-side end portion of flexible connected body 200. Meanwhile, insulation layer (30a) is laminated on the second-surface side of an end portion in flexible connected body 200 and of insulation layer (10a). Specifically, insulation layer (30a) of rigid section 110 is laminated on the second-surface side of the X1-side end portion of flexible connected body 200, and insulation layer (30a) of rigid section 120 is laminated on the second-surface side of the X2-side end portion of flexible connected body 200.

Hole (22a) is formed in insulation layer (20a), and hole (32a) is formed in insulation layer (30a). Connection conductors (22, 32) made of copper plating, for example, are formed on the wall surfaces of holes (22a, 32a) respectively, and insulative bodies (22b, 32b) are filled inside. Connection conductors (22, 32) are conformal conductors. However, connection conductors (22, 32) are not limited to such, and they may be filled conductors, for example (see later-described FIG. 46).

Through hole (13a) is formed in insulation layers (10a, 20a, 30a). Connection conductor 13 made of copper plating, for example, is formed on the wall surface of through hole (13a), and insulative body (13b) is filled inside. Connection conductor 13 is a conformal conductor. However, connection conductor 13 is not limited to being such, and it may be a filled conductor, for example. Wiring layer 21 and wiring layer 31 are electrically connected to each other by connection conductor 13.

Figure 9:
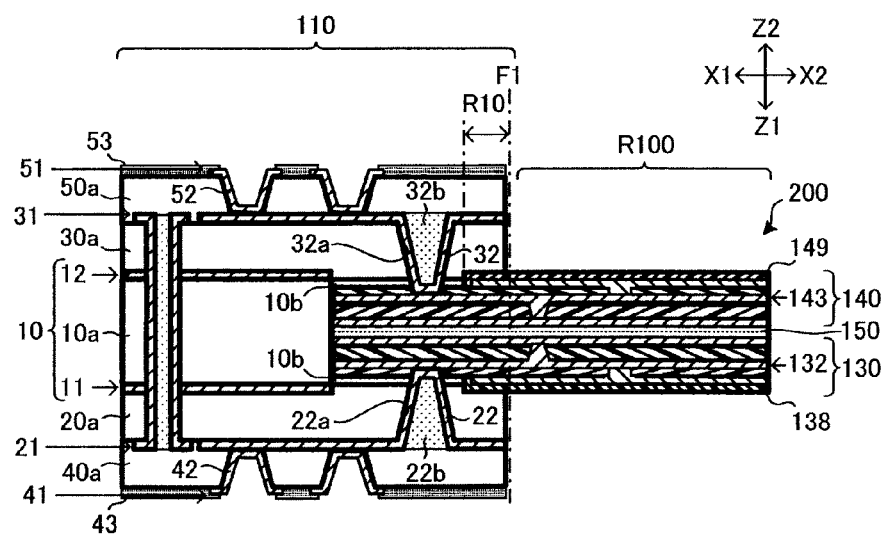
FIG. 9 is a magnified cross-sectional view showing part of a region shown in FIG. 1.

FIG. 9 is a magnified view of region "R" in FIG. 1 (connection section between rigid section 110 and flexible connected body 200). The structure of the connection section between rigid section 120 and flexible connected body 200 is the same as the structure of the connection section between rigid section 110 and flexible connected body 200.

As shown in FIG. 9, flexible connected body 200 is positioned beside insulation layer (10a) (in direction X). The thickness of insulation layer (10a) and the thickness of flexible connected body 200 are set to be substantially the same. In the space partitioned by flexible connected body 200 and insulation layers (10a, 20a, 30a) (the clearance among such members), resin (10b) is filled. Resin (10b) is flowed from the surrounding insulation layers (such as insulation layers 20a, 30a) by pressing, for example, and will be cured to be integrated with the surrounding insulation layers. Insulation layers (20a, 30a) sandwich the end portion of flexible connected body 200 and are laminated and connected to outer coverlays (138, 149) in region (R10).

As described previously, connection conductor 22 is formed in insulation layer (20a), and connection conductor 32 is formed in insulation layer (30a). Connection conductor 22 is connected to both wiring layer 132 and wiring layer 21, and connection conductor 32 is connected to both wiring layer 143 and wiring layer 31. Accordingly, wiring layer 21 is electrically connected to wiring layer 132 contained in flexible wiring board 130 by connection conductor 22 in insulation layer (20a). Also, wiring layer 31 is electrically connected to wiring layer 143 contained in flexible wiring board 140 by connection conductor 32 in insulation layer (30a).

In flex-rigid wiring board 100 of the present embodiment, rigid sections (110, 120) and flexible connected body 200 are electrically connected without using connectors. Thus, even if the impact of being dropped or the like is received, it is thought that connection failure due to detached connectors will not occur.

By the end portions of flexible connected body 200 are inserted (embedded) into rigid sections (110, 120) respectively, rigid section 110 and rigid section 120 are electrically connected to each other at the inserted portions (embedded portions). Accordingly, it is thought that their connections will be strong.

Figure 10A:
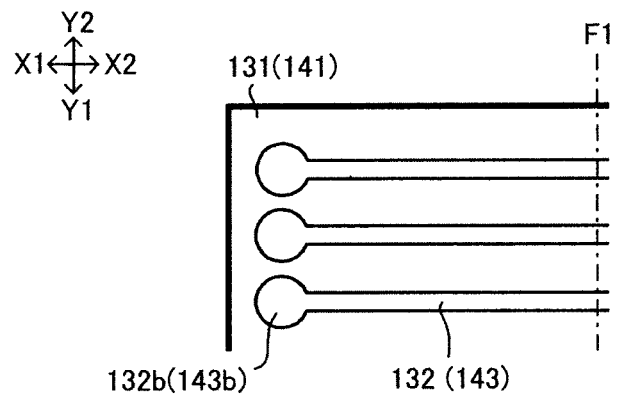
FIG. 10A is a view showing an example where wiring layers near an F-R connection section are configured straight.
Figure 10B:
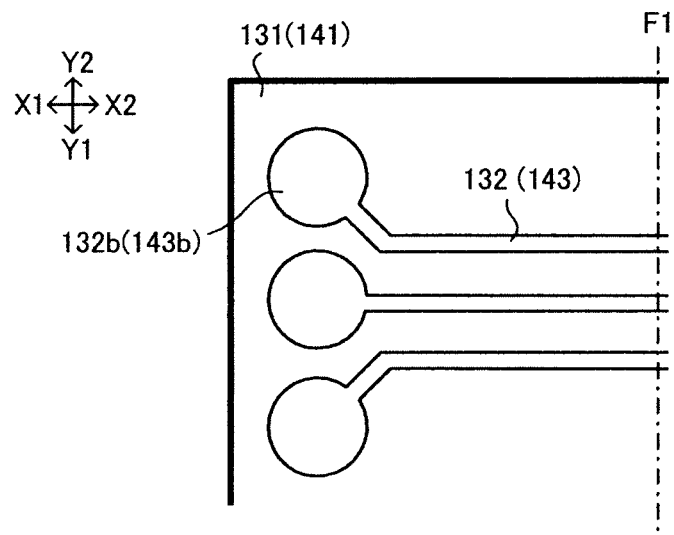
FIG. 10B is a view showing an example where wiring layers are set to fan out near an F-R connection section.

As shown in FIGS. 9, 10A and 10B, connection conductor 22 (or hole 22a) is configured to be a tapered cylinder, widening from the second-surface side toward the first-surface side. Connection conductor 32 (or hole 32a) is configured to be a tapered cylinder, widening from the first-surface side toward the second-surface side. However, connection conductor 22 and the like are not limited to such, and they may be configured freely (see later-described FIGS. 51A-52B).

In flex-rigid wiring board 100 of the present embodiment, the position of connection conductor 22 and the position of connection conductor 32 overlap each other when they are seen on the X-Y plane. Therefore, connection conductor 22 and connection conductor 32 face each other. Accordingly, it is thought that both end portions of flexible connected body 200 will be sandwiched and held more firmly. Even if the position of connection conductor 22 and the position of connection conductor 32 do not overlap completely, if only either connection conductor 22 or 32 faces at least part of the other, it is thought that substantially the same effect will be achieved (see later-described FIG. 49).

Also, wiring layer 21 and connection conductor 22 are set to be contiguous conductors. Accordingly, compared with situations in which wiring layer 21 and connection conductor 22 are formed intermittently (see later-described FIG. 47), it is thought that both end portions of flexible connected body 200 will be sandwiched and held more firmly. The same applies to wiring layer 31 and connection conductor 32.

Moreover, connection conductors (22, 32) are made of plating. Accordingly, it is thought that both end portions of flexible connected body 200 will be sandwiched and held more firmly than in situations in which connection conductors (22, 32) are made of conductive paste (see later-described FIG. 47).

Connection conductors (22, 32) are conductors in holes (22a, 32a), which penetrate only through their respective insulation layers (20a, 30a), so-called via holes. Such a structure is advantageous to enhance connection reliability, since conductive patterns on flexible connected body 200 and conductive patterns on rigid section 110 or 120 are connected by plated metal. However, the present invention is not limited to such, and a conductor of flexible connected body 200 and conductive patterns on insulation layers (20a, 30a) may be electrically connected by a conductor in a hole that penetrates through multiple layers (see later-described FIGS. 48A, 48B).

Basically, conductive patterns (wiring layers 132, 143) of flexible connected body 200 may be configured freely. Therefore, wiring layers (132, 133) near F-R connection sections (terminals 132b, 143b) may be configured straight as shown in FIG. 10A, for example. However, to enhance connection reliability at F-R connection sections, as shown in FIG. 10B, for example, it is preferred that wiring layers (132, 143) be configured to fan out near F-R connection sections (terminals 132b, 143b), namely, that terminal pitches be configured to fan out. By setting so, the distance between adjacent wiring lines is ensured and interference between wiring lines will be suppressed. Accordingly, the width of connection conductors (22, 32) may be enlarged. If the width of connection conductors (22, 32) is enlarged, the connection area between flexible connected body 200 and rigid section 110 or 120 will increase. As a result, it is thought that connection reliability will be enhanced at the F-R connection sections.

As shown in FIG. 1, insulation layer (40a) is laminated on the first-surface side of insulation layer (20a), and insulation layer (50a) is laminated on the second-surface side of insulation layer (30a). Wiring layer 41 is formed on the first surface of insulation layer (40a) and wiring layer 51 is formed on the second surface of insulation layer (50a). In addition, solder-resist layer 43 is formed on the first surface of insulation layer (40a), and solder-resist layer 53 is formed on the second surface of insulation layer (50a).

Insulation layers (40a, 50a) correspond to interlayer insulation layers. Hole (42a) is formed in insulation layer (40a), and hole (52a) is formed in insulation layer (50a). On the wall surfaces of holes (42a, 52a), connection conductors (42, 52) made of copper plating, for example, are formed respectively. Connection conductors (42, 52) are conformal conductors. However, connection conductors (42, 52) are not limited to such, and they may also be filled conductors, for example.

Wiring layers (11, 12, 21, 31, 41, 51) are made of copper foil and copper plating, for example. However, their material is not limited to such, and conductors other than copper, for example, may also be used.

In the present embodiment, insulation layers (20a, 30a, 40a, 50a) are made of substantially the same material as that of insulation layer (10a). By using such a material, it is thought that the F-R connection sections will become firmer. Also, even if those materials are not substantially the same, it is thought that substantially the same effect may be achieved if insulation layer (10a) contains at least one material that forms insulation layer (20a) or (30a). Here, insulation layers (20a, 30a) which structure the core section are preferred to contain inorganic material. If insulation layers (20a, 30a) contain inorganic material, it is thought that expansion/contraction of flexible connected body 200 will be suppressed during a thermal cycle or the like. As a result, it is thought that the strength to secure flexible connected body 200, the durability of such securing and the like will increase. However, the material for insulation layers (20a, 30a, 40a, 50a) is not limited specifically, and they may be formed using a different material from that of insulation layer (10a). As the material for insulation layers (20a, 30a, 40a, 50a), the following may be used: those impregnating inorganic material such as glass fiber and aramid fiber with resins such as epoxy resin, polyester resin, bismaleimide triazine resin (BT resin), imide resin (polyimide), phenol resin, allyl polyphenylene ether resin (A-PPE resin) or the like.

Connection conductors (13, 42, 52) are made of copper plating, for example. Shapes of holes (42a, 52a) in which connection conductors (42, 52) are formed are tapered cylinders, for example. The shape of through hole (13a) in which connection conductor 13 is formed is a cylinder, for example.

Figure 11:
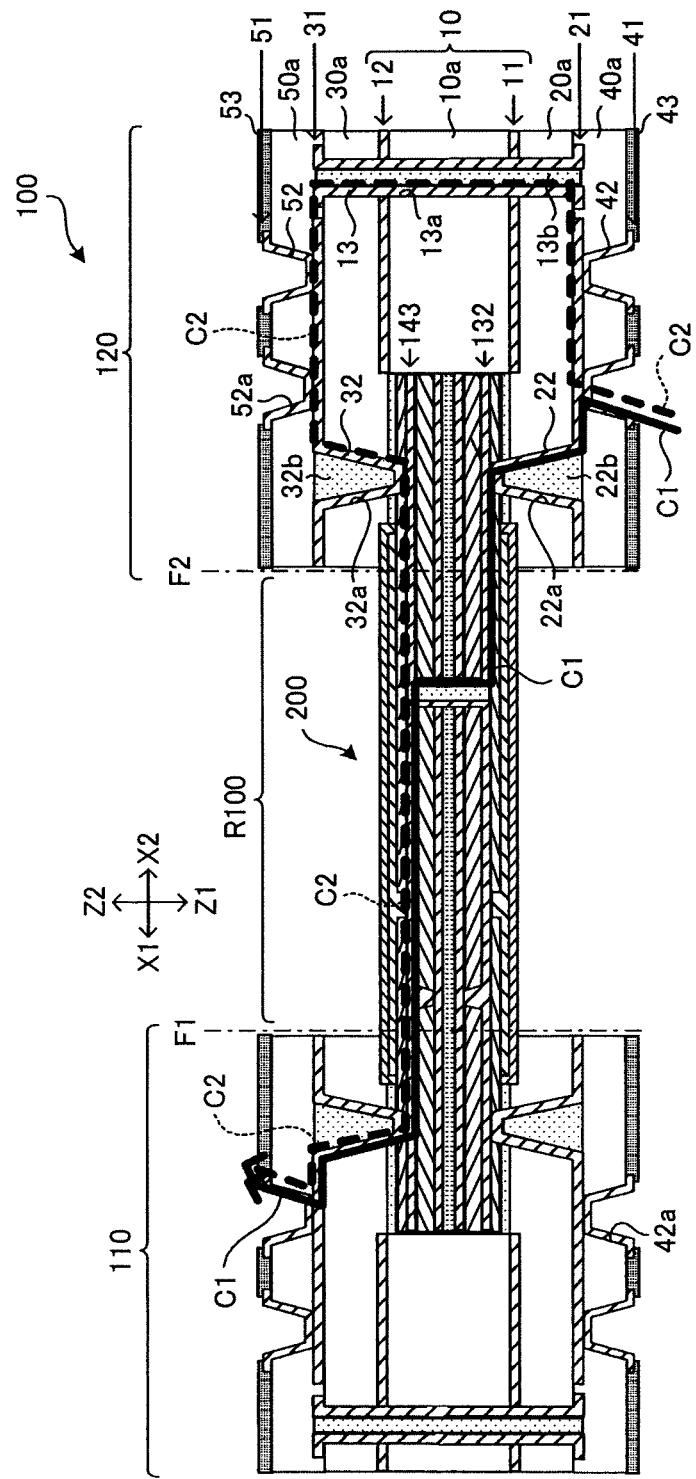
FIG. 11 is a view to illustrate the operation of a flex-rigid wiring board according to an embodiment of the present invention.

In the present embodiment, a conductor (wiring layer 132) on one side of flexible connected body 200 and a conductor (wiring layer 143) on the other side are electrically connected to each other by conductor (200b) which penetrates through one side to the other side of multiple flexible wiring boards (130, 140). Accordingly, when electric current flows from the first surface of flex-rigid wiring board 100 toward the second surface, electric current may flow through route (C1) as shown in FIG. 11, for example. Such route (C1) is shorter than route (C2) in a case without conductor (200b). Route (C2) becomes longer than route (C1) by the distance of the detour. Accordingly, using flex-rigid wiring board 100 of the present embodiment, it is thought that a reduction in a transmission route for electrical signals may be achieved. It is thought that such a structure will be especially effective when electronic components are mounted on the upper and lower surfaces of flex-rigid wiring board 100 (see later-described FIG. 61).

Figure 12:
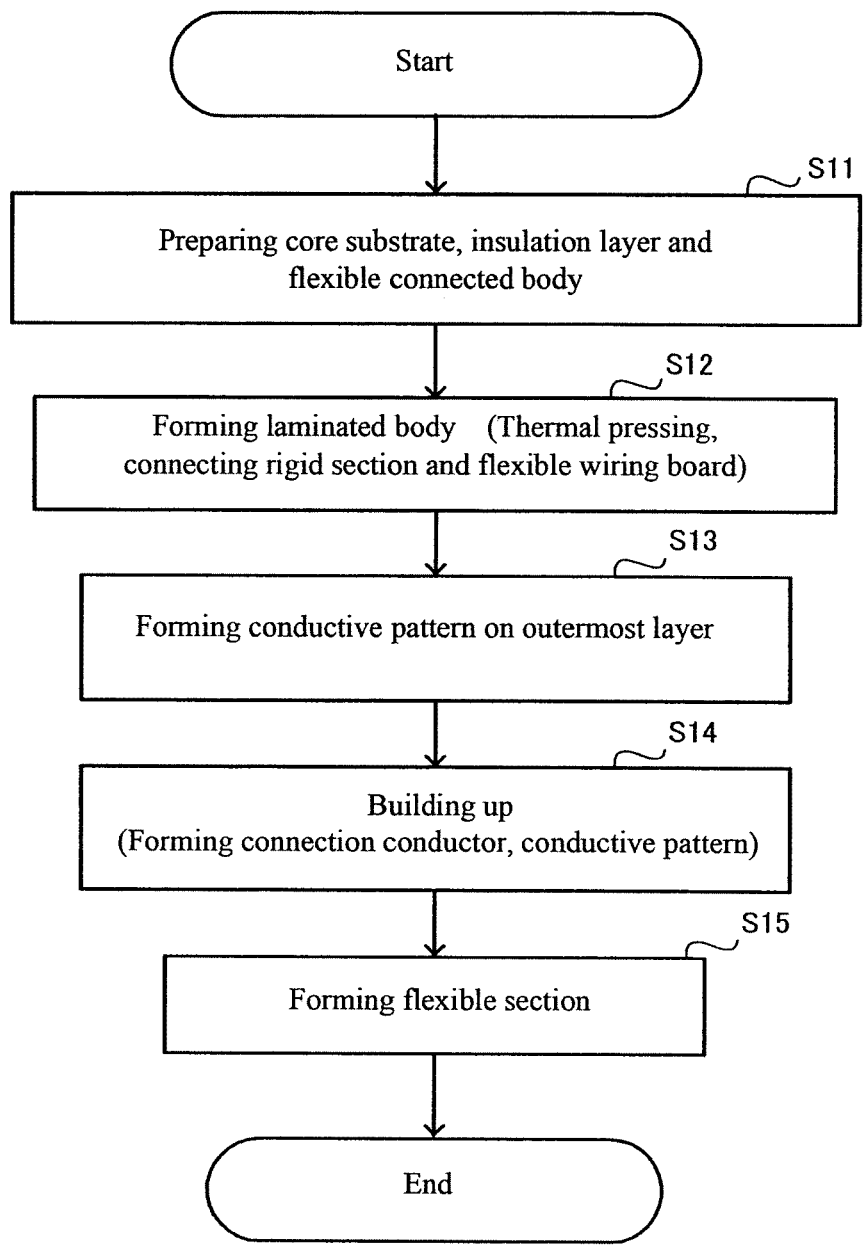
FIG. 12 is a flowchart showing a method for manufacturing a flex-rigid wiring board according to an embodiment of the present invention.

The above flex-rigid wiring board 100 may be manufactured by the procedure shown in FIG. 12, for example.

In step (S11), substrate 10 (core substrate), insulation layers (20a, 30a) and flexible connected body 200 are prepared.

A method for manufacturing substrate 10 is shown in FIGS. 13A-13D.

Figure 13A:
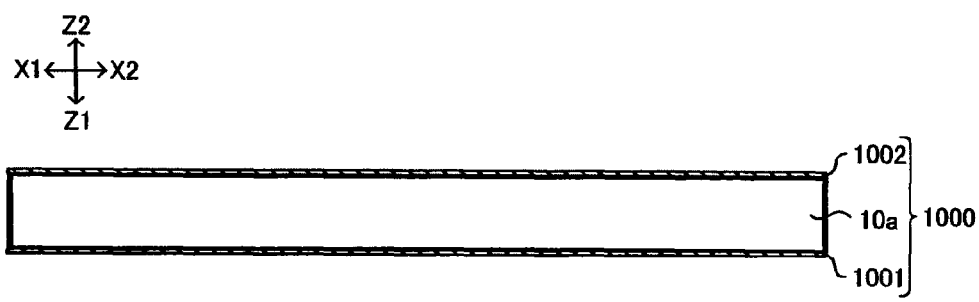
FIG. 13A is a view to illustrate a first step of a method for manufacturing a core substrate.

First, as shown in FIG. 13A, double-sided copper-clad laminate 1000 (starting material) is prepared. Double-sided copper-clad laminate 1000 has insulation layer (10a) and metal foils (1001, 1002). Metal foil 1001 is formed on the first surface of insulation layer (10a) and metal foil 1002 is formed on the second surface of insulation layer (10a). As described previously, the material for insulation layer (10a) is epoxy resin containing reinforcing material, for example.

Figure 13B:
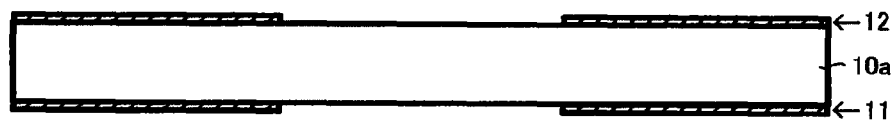
FIG. 13B is a view to illustrate a second step subsequent to the step shown in FIG. 13A.

Next, as shown in FIG. 13B, wiring layers (11, 12) are formed. In particular, after copper panel plating (full plain plating) is performed, conductive layers on both surfaces of insulation layer (10a) are patterned by a lithographic technique. Accordingly, wiring layer 11 is formed on the first surface of insulation layer (10a) and wiring layer 12 is formed on the second surface of insulation layer (10a).

Figure 13C:
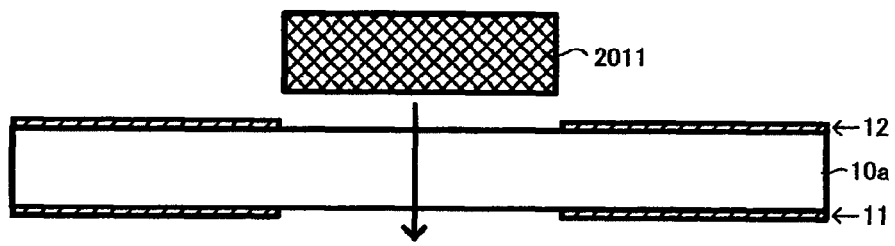
FIG. 13C is a view to illustrate a third step subsequent to the step shown in FIG. 13B.
Figure 13D:
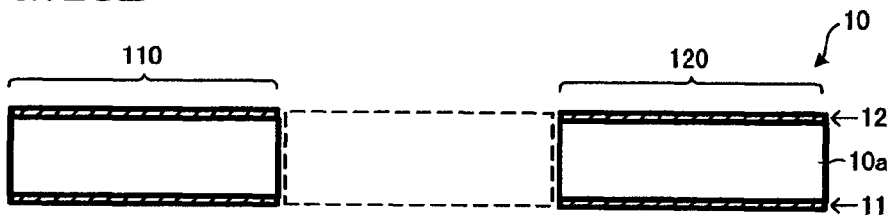
FIG. 13D is a view to illustrate a fourth step subsequent to the step shown in FIG. 13C.

Next, as shown in FIG. 13C, blanking is performed on insulation layer (10a) using die 2011. Accordingly, as shown in FIG. 13D, insulation layer (10a) is separated into rigid section 110 and rigid section 120. As a result, substrate 10 is completed.

Figure 14:
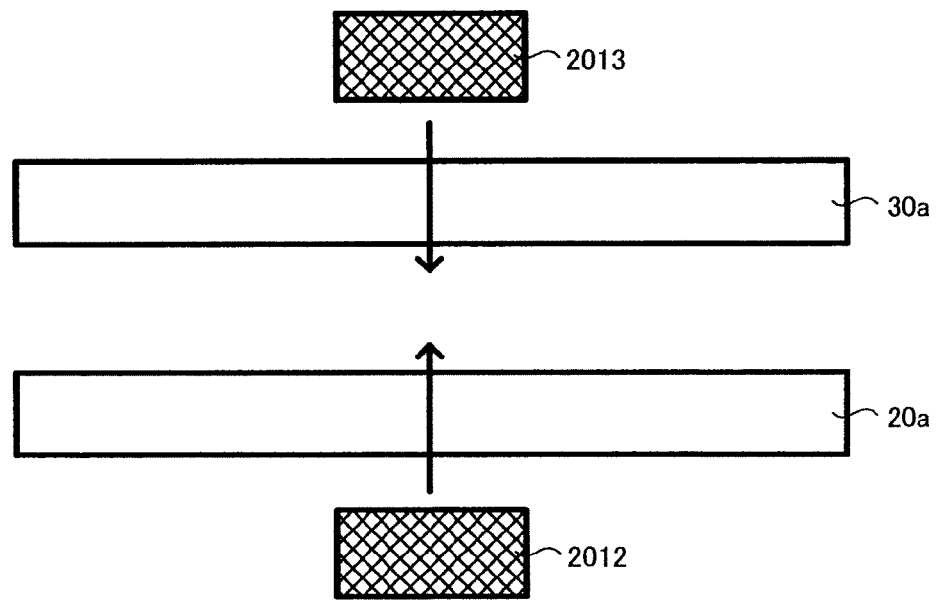
FIG. 14 is a view to illustrate a first step for processing insulation layers.
Figure 15:
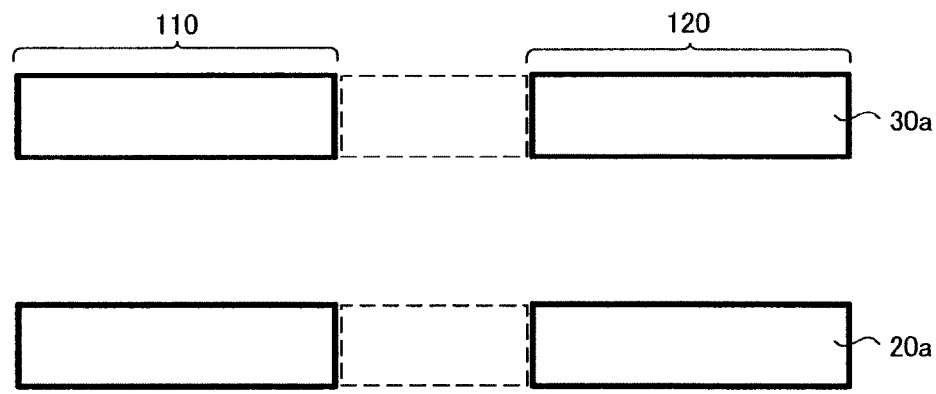
FIG. 15 is a view to illustrate a second step subsequent to the step shown in FIG. 14.

A method for processing insulation layers (20a, 30a) is shown in FIGS. 14 and 15.

First, as shown in FIG. 14, insulation layers (20a, 30a) prior to processing are prepared. As described previously, the materials for insulation layers (20a, 30a) are the following: those made by impregnating inorganic material such as glass fiber or aramid fiber with resins such as epoxy resin, polyester resin, bismaleimide triazine resin (BT resin), imide resin (polyimide), phenol resin, or allyl polyphenylene ether resin (A-PPE resin). At this stage, insulation layers (20a, 30a) are prepregs (semi-cured adhesive sheets). However, instead of prepreg, RCF (resin-coated copper foil) or the like may also be used.

Next, blanking is performed on insulation layer (20a) using die 2012, and blanking is performed on insulation layer (30a) using die 2013. Accordingly, as shown in FIG. 15, insulation layers (20a, 30a) are each separated into rigid section 110 and rigid section 120.

A method for manufacturing flexible connected body 200 is shown in FIGS. 16A-19. In the present embodiment, multiple flexible connected bodies 200 are simultaneously manufactured in a single manufacturing panel, and one of them is separated in a step shown in FIG. 19. However, the present invention is not limited to such, and one flexible connected body 200 may be formed using a single manufacturing panel.

Figure 16A:
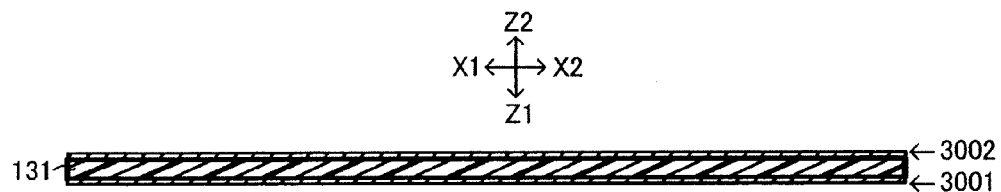
FIG. 16A is a view to illustrate a first step of a method for manufacturing a flexible wiring board.

First, as shown in FIG. 16A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 μm, for example.

Figure 16B:
FIG. 16B is a view to illustrate a second step subsequent to the step shown in FIG. 16A.

Next, as shown in FIG. 16B, wiring layers (132, 133) and connection conductor (131b) are formed.

Specifically, to begin with, hole (131a) is formed in flexible substrate 131 using a laser, for example. Hole (131a) penetrates through flexible substrate 131 and reaches copper foil 3001. Then, desmearing and soft etching are conducted if required.

Next, by performing copper panel plating (plating in hole (131a) and on the entire surface), copper plating, for example, is filled in hole (131a). Electroless plating (3003, 3004) and electrolytic plating (3005, 3006) (FIG. 6), for example, are formed in that order. Accordingly, connection conductor (131b) is formed. Also, a conductive layer made with metal foil 3001, electroless plating 3003 and electrolytic plating 3005 (FIG. 6) is formed on the first surface of flexible substrate 131, and a conductive layer made with metal foil 3002, electroless plating 3004 and electrolytic plating 3006 (FIG. 6) is formed on the second surface of flexible substrate 131. Those conductive layers are full plain patterns (such as full plain copper patterns) at this stage.

Next, conductive layers on both surfaces of flexible substrate 131 are patterned using a lithographic technique. Accordingly, wiring layer 132 (FIG. 4A) is formed on the first surface of flexible substrate 131, and wiring layer 133 (FIG. 4B) is formed on the second surface of flexible substrate 131. After that, a horizontal roughening process is further carried out if required. Accordingly, flexible wiring board 130 is prepared.

In addition, flexible substrate 141 (FIG. 6) having wiring layers (142, 143) on both of its surfaces is prepared in the same manner. Such flexible substrate 141 and the like may be formed by steps that correspond to those shown in FIGS. 16A and 16B, for example.

Figure 16C:
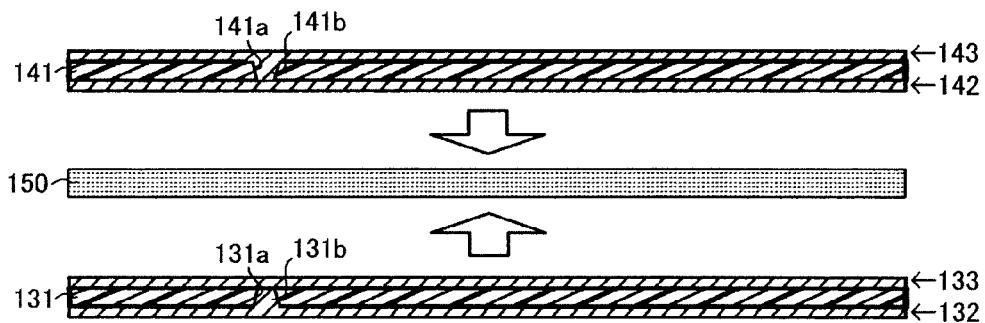
FIG. 16C is a view to illustrate a third step subsequent to the step shown in FIG. 16B.

Next, as shown in FIG. 16C, flexible substrate 131 and flexible substrate 141 are laminated using bonding sheet 150. Accordingly, flexible substrate 131 and flexible substrate 141 are connected by bonding sheet 150. As a result, connected body 201 of flexible substrate 131 and flexible substrate 141 is formed.

Figure 17A:
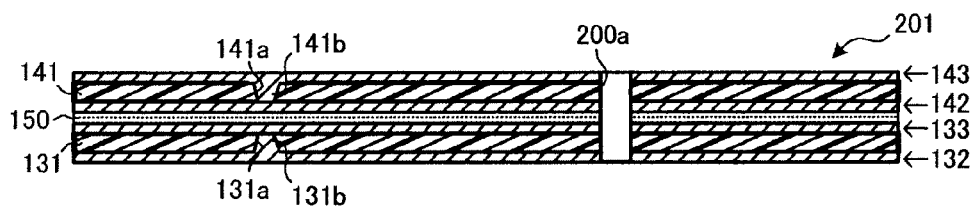
FIG. 17A is a view to illustrate a fourth step subsequent to the step shown in FIG. 16C.

Next, as shown in FIG. 17A, through hole (200a) is formed in connected body 201 using a laser, for example. Through hole (200a) penetrates through connected body 201. After that, desmearing and soft etching are conducted if required.

Figure 17B:
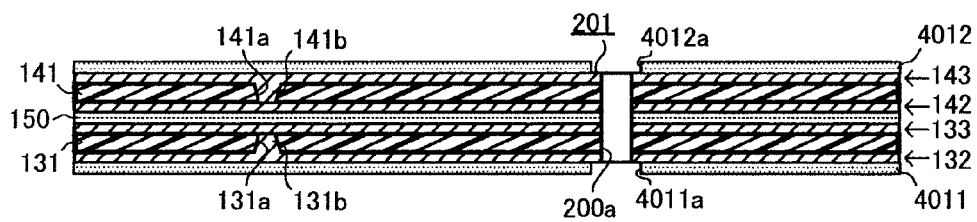
FIG. 17B is a view to illustrate a fifth step subsequent to the step shown in FIG. 17A.

Next, as shown in FIG. 17B, plating resist 4011 is formed on the first surface of connected body 201, and plating resist 4012 is formed on the second surface of connected body 201. Plating resist 4011 has opening portion (4011a) and plating resist 4012 has opening portion (4012a).

Next, while plating resists (4011, 4012) are formed, copper panel plating (plating in through hole (200a) and on the entire surface) is performed. For example, electroless plating 2001 and electrolytic plating 2002 (FIG. 6) are formed in that order from the wall surface of through hole (200a) to be contiguous to wiring layers (132, 143). Accordingly, conductor (200b) and lands (200d) (FIG. 6) are formed.

Figure 17C:
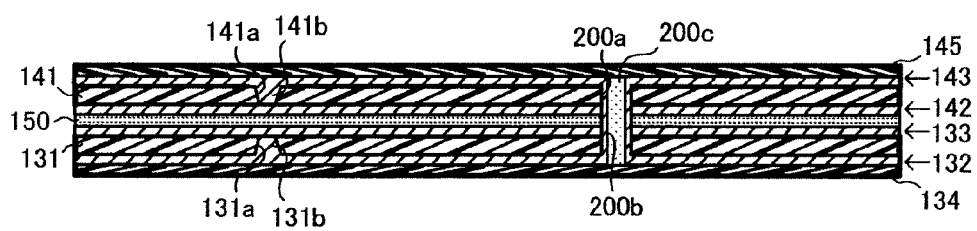
FIG. 17C is a view to illustrate a sixth step subsequent to the step shown in FIG. 17B.

Next, as shown in FIG. 17C, by pressing, for example, inner coverlay 134 is attached to the first-surface side of flexible substrate 131, and inner coverlay 145 is attached to the second-surface side of flexible substrate 141. Accordingly, wiring layer 132 is coated with inner coverlay 134 and wiring layer 143 is coated with inner coverlay 145. Also, resin flowed from inner coverlays (134, 145) is filled in through hole (200a), and becomes insulative body (200c). Insulative body (200c) may be filled in advance prior to pressing.

Figure 17D:
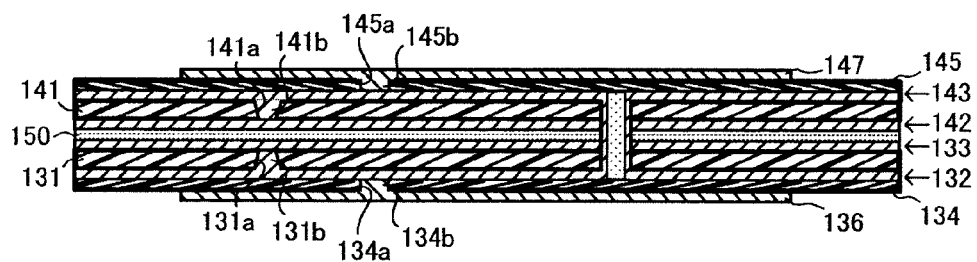
FIG. 17D is a view to illustrate a seventh step subsequent to the step shown in FIG. 17C.

Next, as shown in FIG. 17D, shield layers (136, 147) are formed. In particular, using a laser, for example, hole (134a) is formed in inner coverlay 134, and hole (145a) is formed in inner coverlay 145. Then, conductive paste (such as silver paste) is printed on the surfaces of inner coverlays (134, 145). Accordingly, shield layer 136 is formed on inner coverlay 134 and shield layer 147 is formed on inner coverlay 145. In addition, connection conductor (134b) is formed in inner coverlay 134, and connection conductor (145b) is formed in inner coverlay 145.

Figure 18:
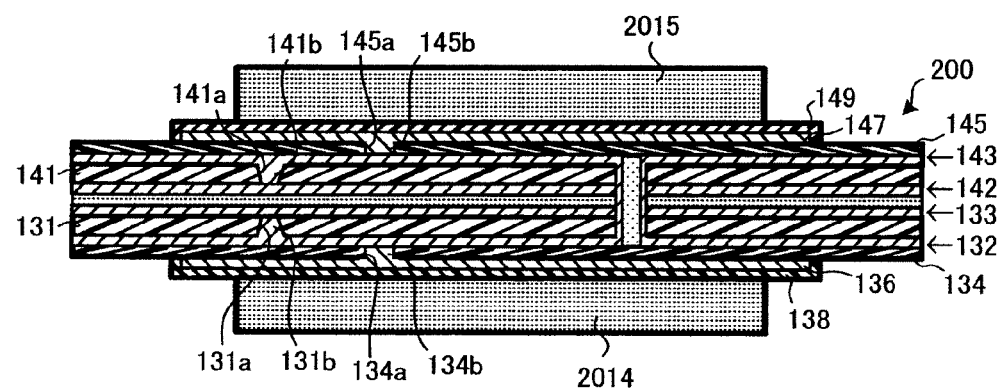
FIG. 18 is a view to illustrate an eighth step subsequent to the step shown in FIG. 17D.

Next, as shown in FIG. 18, by pressing, for example, outer coverlay 138 is attached to the first-surface side of inner coverlay 134, and outer coverlay 149 is attached to the second-surface side of inner coverlay 145. Accordingly, shield layers (136, 147) are coated with outer coverlays (138, 149) respectively. As a result, multiple flexible connected bodies 200 are manufactured. After that, jig holes and electrolytic gold plating are formed if required.

Next, as shown in FIG. 18, by printing, for example, strip mask 2014 is formed on the first-surface side of outer coverlay 138, and strip mask 2015 is formed on the second-surface side of outer coverlay 149.

Figure 19:
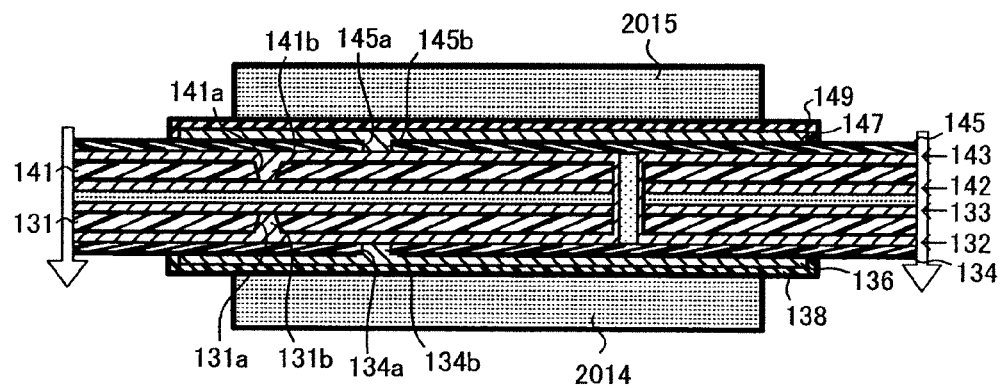
FIG. 19 is a view to illustrate a ninth step subsequent to the step shown in FIG. 18.

Next, as shown in FIG. 19, using a die, for example, one flexible connected body 200 is extracted. Accordingly, flexible connected body 200 is obtained as shown in FIG. 3 previously. A method for detaching flexible connected body 200 is not limited to using a die, and any other method such as using a laser or a drill, for example, may also be employed to detach it.

Next, in step (S12) of FIG. 12, a laminated body is formed with substrate 10 (core substrate), insulation layers (20a, 30a) and flexible connected body 200.

Figure 20:
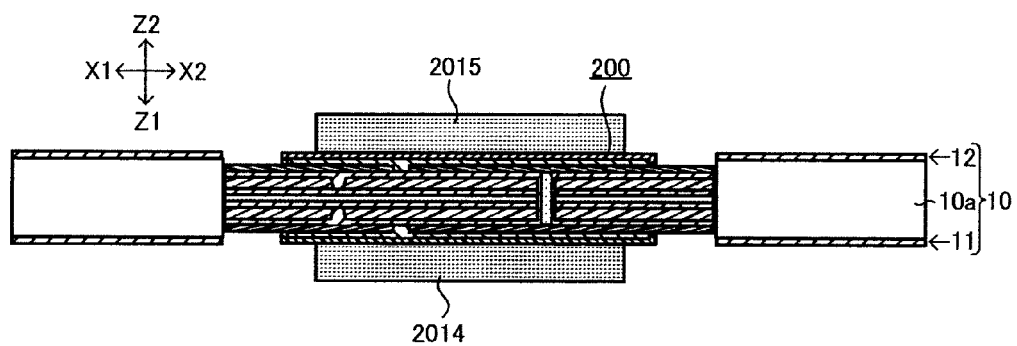
FIG. 20 is a view to illustrate a first step for forming a laminated body.
Figure 21:
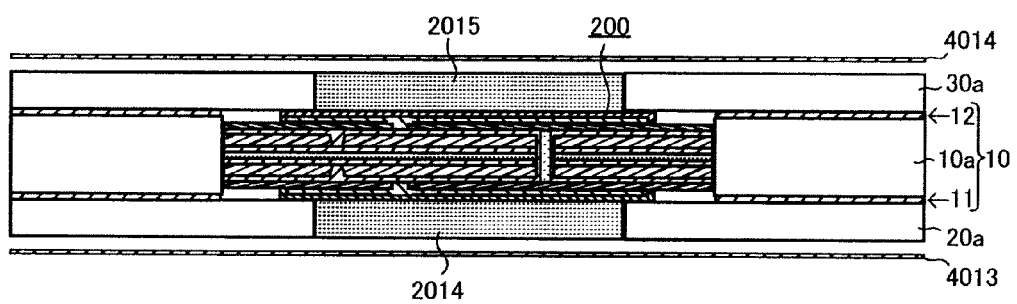
FIG. 21 is a view to illustrate a second step subsequent to the step shown in FIG. 20.

Specifically, first, substrate 10 (insulation layer 10a) is positioned beside flexible connected body 200 (in direction X) as shown in FIG. 20. Then, substrate 10 (FIG. 13D), insulation layers (20a, 30a) (FIG. 15) and flexible connected body 200 (FIG. 19) are aligned and positioned as shown in FIG. 21, for example. Then, insulation layers (20a, 30a) are melted and preliminarily adhered to substrate 10. Moreover, metal foils (such as copper foils) (4013, 4014) are positioned outside such preliminarily adhered members (on the first-surface side and the second-surface side).

Insulation layer (20a) is positioned beside strip mask 2014 (in direction X), and insulation layer (30a) is positioned beside strip mask 2015 (in direction X). Both end portions of flexible connected body 200 are sandwiched by insulation layers (20a, 30a). Also, metal foils (4013, 4014) are positioned at the outermost sides. During that time, because of strip masks (2014, 2015) (spacers), the difference in levels on the first surface and the second surface will be reduced. However, such a difference in levels is hard to remove completely.

Figure 22:
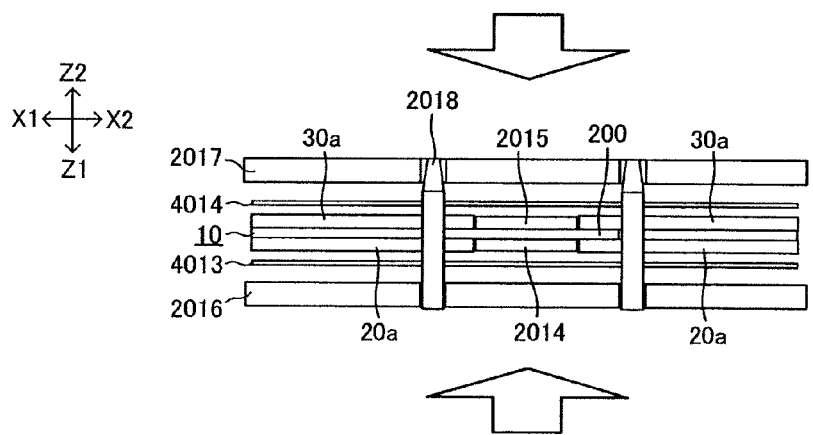
FIG. 22 is a view to illustrate a third step subsequent to the step shown in FIG. 21.

Next, as shown in FIG. 22, such members are sandwiched by pressing jigs (2016, 2017) and thermal pressed all at once. Namely, pressing and heating are simultaneously conducted. During that time, jigs (2016, 2017) are aligned using pins 2018. Accordingly, pressure will be exerted substantially perpendicular to main surfaces.

Figure 23:
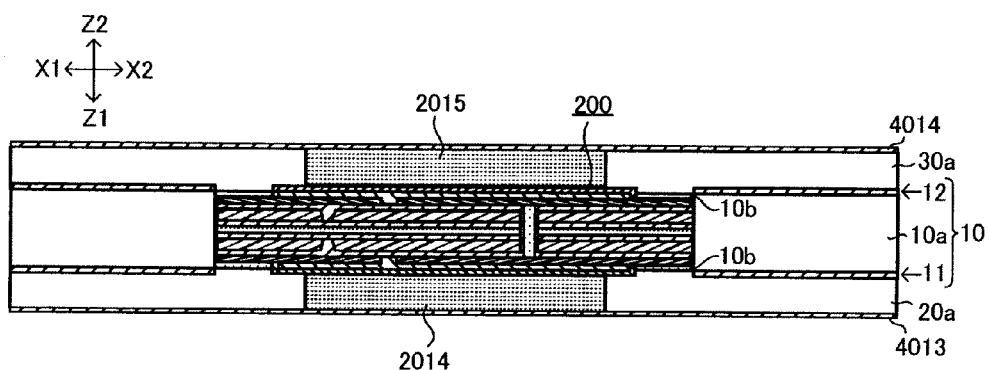
FIG. 23 is a view to illustrate a fourth step subsequent to the step shown in FIG. 22.

As shown in FIG. 23, through the above pressing, resin (10b) containing inorganic material is squeezed out from the surrounding insulation layers (insulation layers 10a, 20a, 30a), and resin (10b) is filled in the clearance between insulation layer (10a) and flexible connection body 200.

Moreover, by the above heating, prepregs (insulation layers 20a, 30a) are cured, and insulation layer (10a) and insulation layers (20a, 30a) are adhered. Insulation layers (20a, 30a) are also bonded with flexible connected body 200.

The above pressing and heating may be divided into multiple procedures. Also, heating and pressing may be conducted separately, but it is more efficient if they are conducted simultaneously. After the thermal pressing, further heating for integration may be conducted separately.

Figure 24:
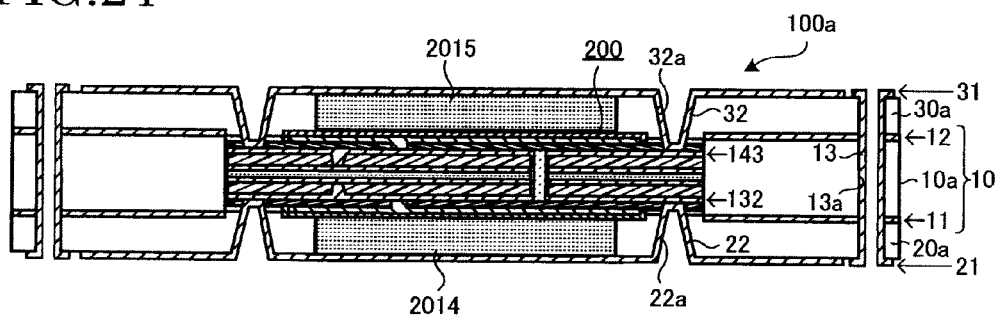
FIG. 24 is a view to illustrate a fifth step subsequent to the step shown in FIG. 23.

Next, as shown in FIG. 24, wiring layers (21, 31) and connection conductors (13, 22, 32) are formed.

In particular, using a laser, for example, hole (22a) is formed in insulation layer (20a), hole (32a) is formed in insulation layer (30a) and through hole (13a) is formed in insulation layers (10a, 20a, 30a). Hole (22a) reaches wiring layer 132 of flexible connected body 200, and hole (32a) reaches wiring layer 143 of flexible connected body 200. Through hole (13a) penetrates through insulation layers (10a, 20a, 30a) entirely. After that, desmearing and soft etching are conducted if required.

Next, for example, by copper panel plating (plating in holes (22a, 32a) as well as in through hole (13a) and on the entire surface), copper plating, for example, is formed on the wall surfaces of holes (22a, 32a), and copper plating, for example, is formed on the wall surface of through hole (13a). Such plating is made of electroless plating and electrolytic plating, for example. However, the present invention is not limited to such, and plating may only be made of either electroless plating or electrolytic plating. Moreover, dry plating such as PVD (Physical Vapor Deposition) and CVD (Chemical Vapor Deposition) may also be performed. In the present embodiment, flexible connected body 200 is covered with metal foils (4013, 4014) during plating. Thus, flexible connected body 200 is thought to be tolerant to damage from the plating solution.

Accordingly, connection conductors (13, 22, 32) are formed. Connection conductor 22 is bonded with wiring layer 132, and connection conductor 32 is bonded with wiring layer 133. Connection conductor 13 electrically connects conductive layers on both surfaces (wiring layers 21, 31 prior to being patterned) with each other.

Through the above steps, laminated body (100a) is formed with substrate 10, insulation layers (20a, 30a) and flexible connected body 200. Insulation layer (10a) is sandwiched between insulation layer (20a) and insulation layer (30a).

Next, in step (S13) of FIG. 12, conductive layers on both surfaces (outermost layers) are patterned by a lithographic technique, for example. Accordingly, wiring layer 21 is formed on insulation layer (20a), and wiring layer 31 is formed on insulation layer (30a). By the above panel plating, wiring layer 21 and connection conductor 22 as well as wiring layer 31 and connection conductor 32 are each formed to be contiguous.

Next, in step (S14) of FIG. 12, building up is conducted on laminated body (100a).

Figure 25:
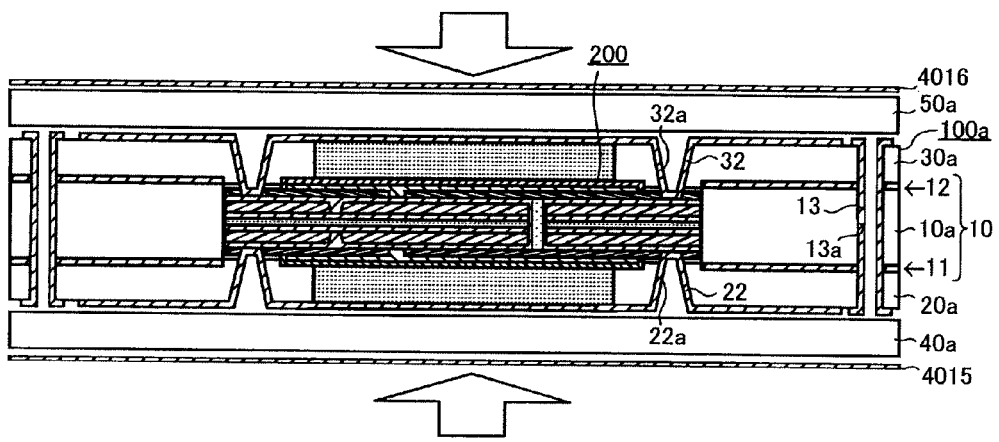
FIG. 25 is a view to illustrate a first step for building up on a laminated body (core section)

Specifically, first, copper foil 4015, insulation layer (40a), laminated body (100a), insulation layer (50a) and copper foil 4016 are positioned to be laminated in that order as shown in FIG. 25. Accordingly, laminated body (100a) is sandwiched by insulation layer (40a) and insulation layer (50a). At this stage, insulation layers (40a, 50a) are prepregs (semi-cured adhesive sheets). However, instead of prepreg, RCF (resin-coated copper foil) or the like may also be used.

Figure 26:
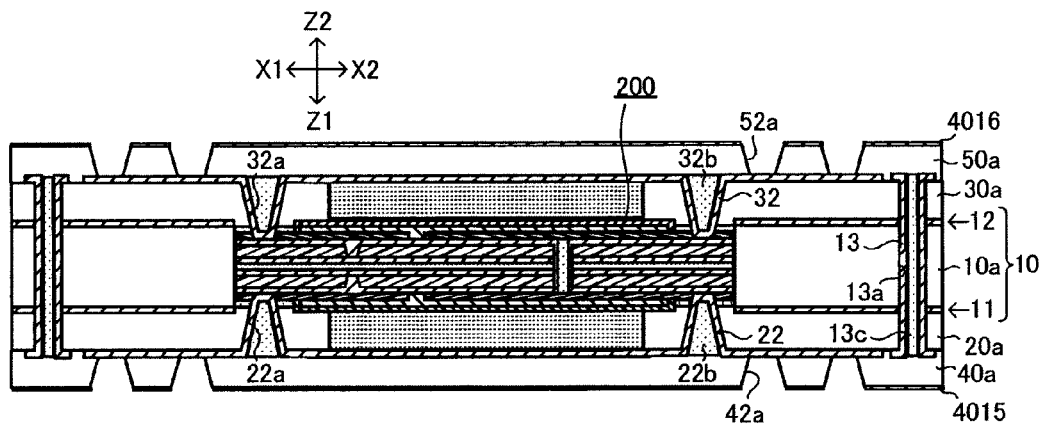
FIG. 26 is a view to illustrate a second step subsequent to the step shown in FIG. 25.

Next, thermal pressing is performed. Accordingly, prepregs (insulation layers 40a, 50a) are cured, and copper foil 4015, insulation layer (40a), laminated body (100a), insulation layer (50a) and copper foil 4016 become integrated. Also, as shown in FIG. 26, resin flowed from insulation layers (40a, 50a) is filled in through hole (13a) and holes (22a, 32a), and becomes insulative bodies (13b, 22b, 32b). Insulative bodies (13b, 22b, 32b) may be filled in advance prior to pressing.

Next, by using a laser, for example, hole (42a) is formed in insulation layer (40a), and hole (52a) is formed in insulation layer (50a) as shown in FIG. 26. After that, desmearing and soft etching are conducted if required.

Figure 27:
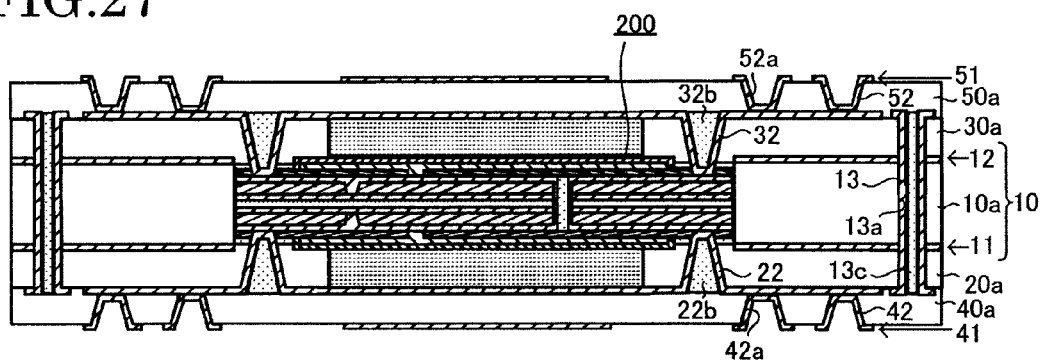
FIG. 27 is a view to illustrate a third step subsequent to the step shown in FIG. 26.

Next, for example, by copper panel plating (such as electroless plating or electrolytic plating or both), copper plating, for example, is formed in hole (42*a*), and copper plating, for example, is formed in hole (52*a*) as shown in FIG. 27. Accordingly, connection conductors (42, 52) are formed.

Furthermore, conductive layers on both surfaces are patterned by a lithographic technique, for example. Accordingly, wiring layer 41 is formed on insulation layer (40*a*), and wiring layer 51 is formed on insulation layer (50*a*). Conductive patterns of wiring layers (41, 51) remain on strip masks (2014, 2015) respectively.

Figure 28:
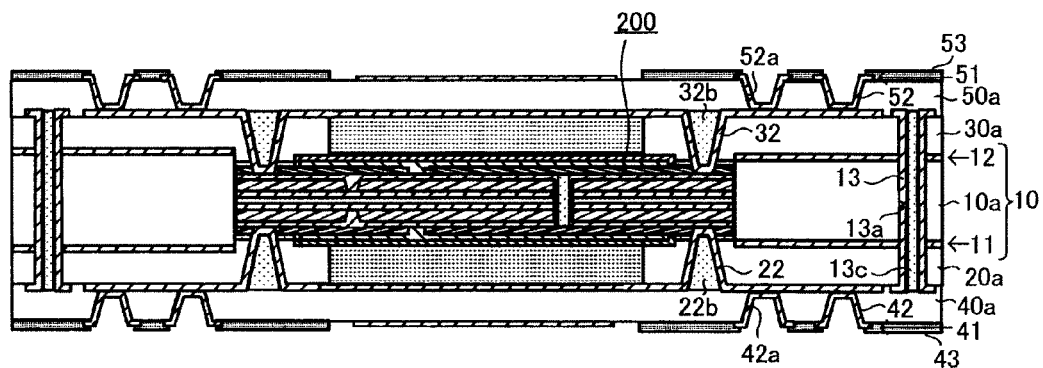
FIG. 28 is a view to illustrate a fourth step subsequent to the step shown in FIG. 27.

Next, as shown in FIG. 28, solder-resist layers (43, 53) are formed on both surfaces by screen printing or lamination, for example. Then, solder-resist layers (43, 53) are cured by heating, for example. Patterning, drilling and external processing are conducted if required.

Figure 29:
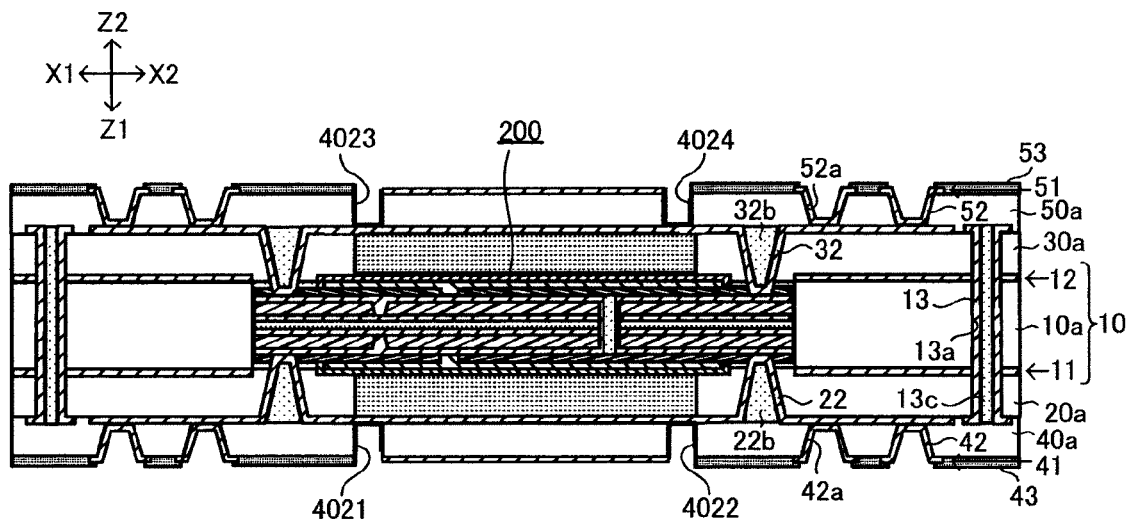
FIG. 29 is a view to illustrate a fifth step subsequent to the step shown in FIG. 28.

Next, by etching while coating the first surface and second surface with a mask having predetermined openings, for example, or by beaming a laser at portions, cut lines (4021-4024) are formed as shown in FIG. 29. Cut lines (4021, 4022) are formed in insulation layer (40*a*), and cut lines (4023, 4024) are formed in insulation layer (50*a*). Cut lines (4021-4024) each reach a conductive pattern (wiring layer 41 or 51) on strip mask 2014 or 2015. Then, desmearing and soft etching are conducted if required.

Next, in step (S15) of FIG. 12, space is formed on both sides (first-surface side and second-surface side) of the central portion in flexible connected body 200. Accordingly, flexible section (R100) (FIG. 1) is formed.

Figure 30:
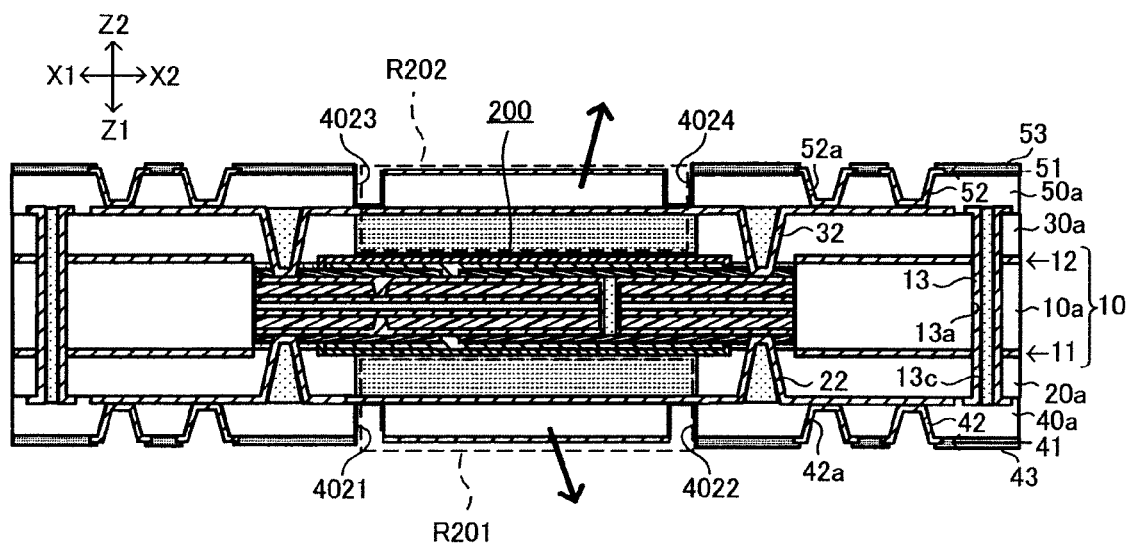
FIG. 30 is a view to illustrate a step for forming a flexible section.

Specifically, as shown in FIG. 30, portions corresponding to regions (R201, R202) partitioned by cut lines (4021-4024) are removed by peeling them from both surfaces of flexible connected body 200. During that time, detaching is easy since strip masks (2014, 2015) are arranged. Accordingly, the central section of flexible connected body 200 is exposed and space that allows flexible connected body 200 to curve (bend) is formed on the upper and lower surfaces of flexible connected body 200 (in lamination directions of insulation layers). As a result, flex-rigid wiring board 100 (FIG. 1) is completed.

Then, if required, remaining conductors are removed by mask etching, for example. Also, external connection terminals (solder bumps) are formed in opening portions in solder-resist layers (43, 53) by printing solder paste, reflowing and the like. Accordingly, connecting flex-rigid wiring board 100 to other wiring boards, mounting electronic components on flex-rigid wiring board 100 and so forth are made possible through such external connection terminals. Also, external processing, warping correction, conductivity inspection, exterior inspection, final inspection and the like are conducted according to requirements.

The manufacturing method according to the present embodiment is suitable for manufacturing the above flex-rigid wiring board 100. Using such a manufacturing method, excellent flex-rigid wiring boards 100 may be obtained at a lower cost.

So far, a flex-rigid wiring board and its manufacturing method according to an embodiment of the present invention are described. However, the present invention is not limited to the above embodiment.

Figure 31:
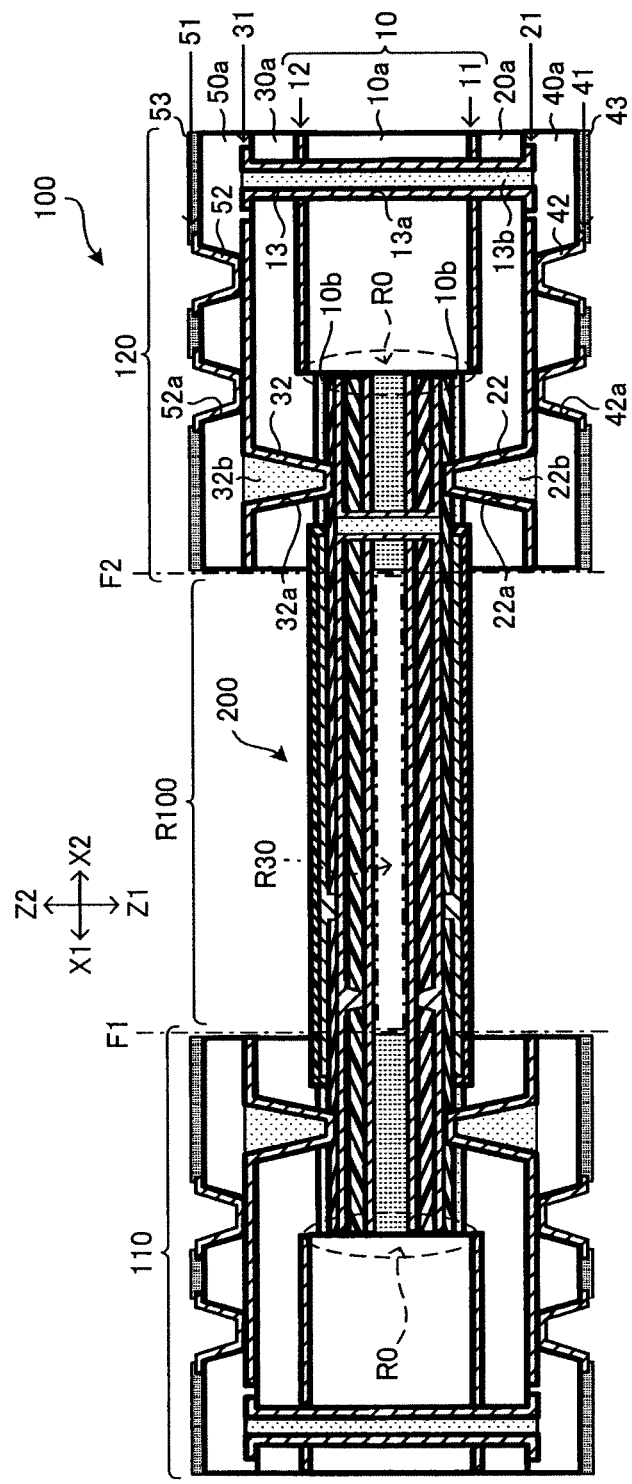
FIG. 31 is a view showing a flex-rigid wiring board having a flexible connected body where space is arranged between two flexible wiring boards.
Figure 32:
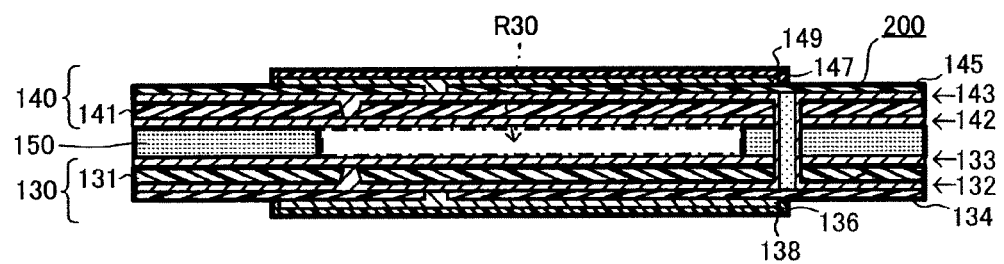
FIG. 32 is a view showing a flexible connected body contained in the flex-rigid wiring board in FIG. 31.
Figure 33:
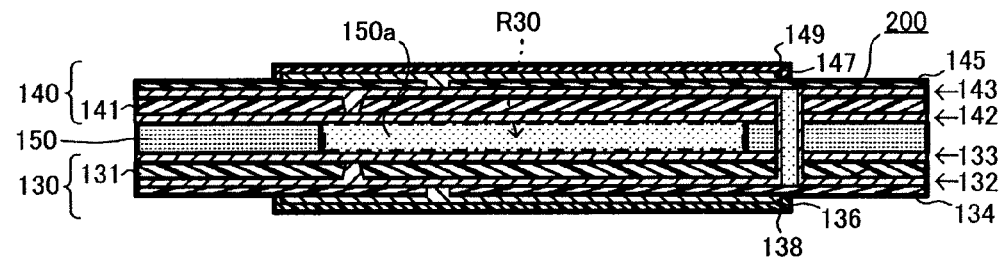
FIG. 33 is a view showing an example where filler is filled in the space arranged between two flexible wiring boards.

As shown in FIGS. 31 and 32, space (R30) may be formed between flexible wiring board 130 and flexible wiring board 140. Space (R30) may be sealed with bonding sheet 150. Alternatively, gas such as air may be encapsulated in space (R30). However, if a thermal cycle occurs during the manufacturing process, there is a concern that the quality of flex-rigid wiring board 100 may become lower due to repeated expansion/contraction of the gas in space (R30). Thus, it is preferred to eliminate the gas in space (R30) by decompression, for example. Alternatively, as shown in FIG. 33, by filling filler (150*a*) (such as gel) in space (R30), gas in space (R30) may be eliminated.

Figure 34A:
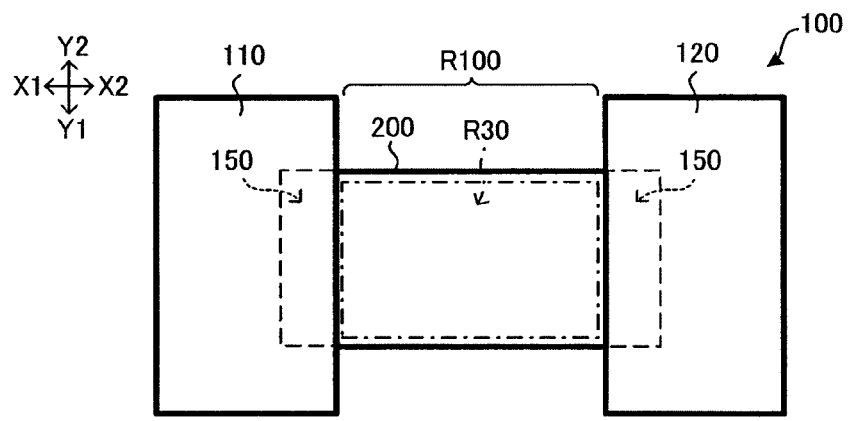
FIG. 34A is a view showing an example of positioning the space arranged between two flexible wiring boards.
Figure 34B:
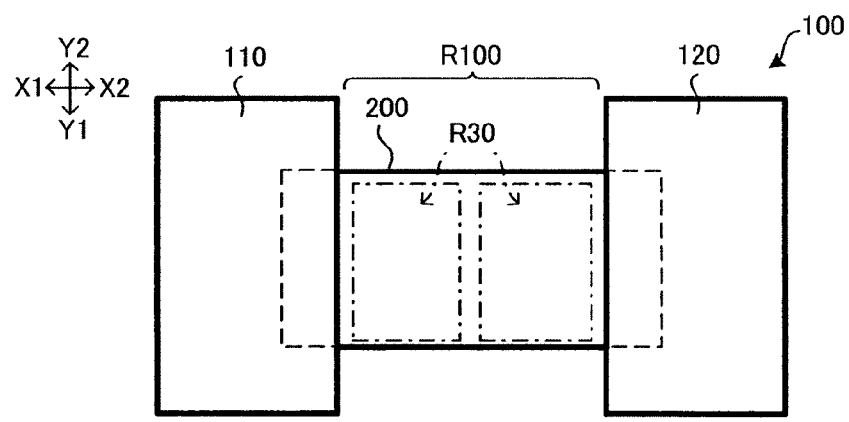
FIG. 34B is a view showing a first alternative example where the number of spaces arranged between two flexible wiring boards is modified.
Figure 34C:
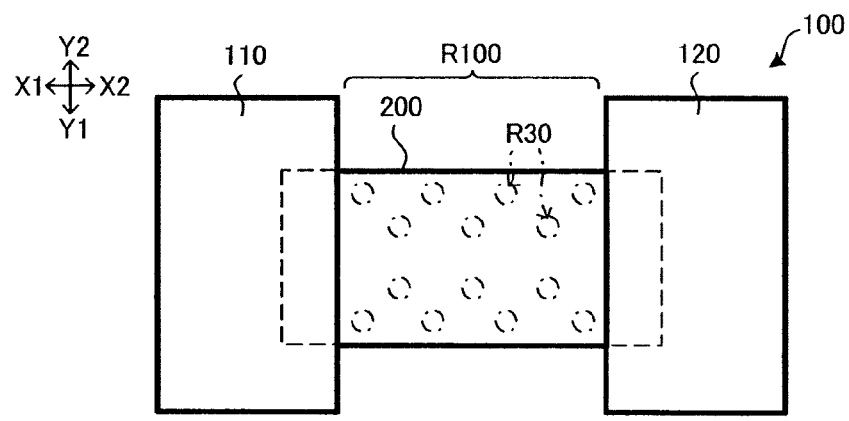
FIG. 34C is a view showing a second alternative example where the number of spaces arranged between two flexible wiring boards is modified.

It is preferred that space (R30) be positioned to extend entirely throughout flexible section (R100) as shown in FIG. 34A, for example. However, space (R30) is not limited to such, and may be positioned by being concentrated in required portions based on stress analysis or the like. The number of spaces (R30) is not limited to one, and multiple spaces may be formed. Namely, as shown in FIG. 34B, for example, two spaces (R30) may be formed, and as shown in FIG. 34C, for example, multiple spaces (R30) may also be formed. The shape of space (R30) is not limited to being a rectangular cuboid, and may be a cylinder or the like as shown in FIG. 34C, for example. Basically, any shape, number, position and so forth may be employed for spaces (R30).

Figure 35:
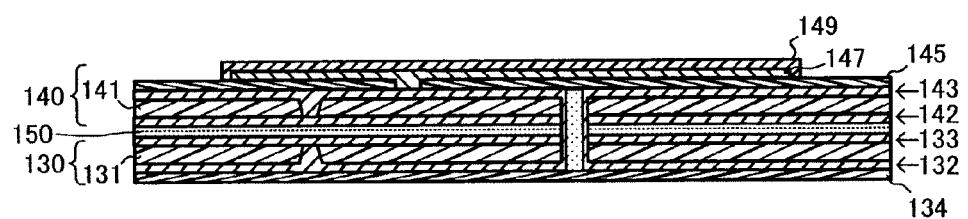
FIG. 35 is a view showing an example where a conductive pattern on one of the two flexible wiring boards is set to be a full plain conductive pattern.

A conductive pattern of either flexible wiring board 130 or 140, for example, wiring layer 132 of flexible wiring board 130, may be formed as a full plain conductive pattern (such as a full plain copper pattern) as shown in FIG. 35, and shield layer 136 and outer coverlay 138 may be omitted. In doing so, flexible section (R100) will become even thinner, and it is thought that the bendability of flexible section (R100) will be further improved.

When a wiring pattern is formed only on one surface of flexible connected body 200, conductive layers are formed on both surfaces and then the conductive layer on one surface is masked entirely using resist, and the conductive layer on the other surface is patterned using a lithographic technique, for example. Accordingly, a wiring pattern may be formed on one surface of flexible connected body 200, while a full plain conductive pattern is formed on the other surface.

Figure 36:
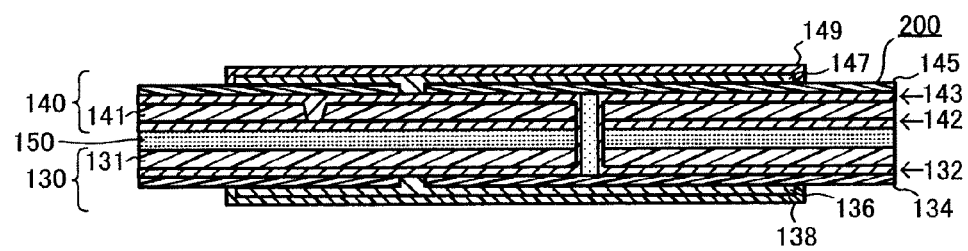
FIG. 36 is a view showing an example where one of two flexible wiring boards is a single-sided flexible wiring board.

As shown in FIG. 36, either flexible wiring board 130 or 140 may be a single-sided flexible wiring board. In an example in FIG. 36, wiring layer 133 is omitted and flexible wiring board 130 is formed to be a single-sided flexible wiring board.

Figure 37:
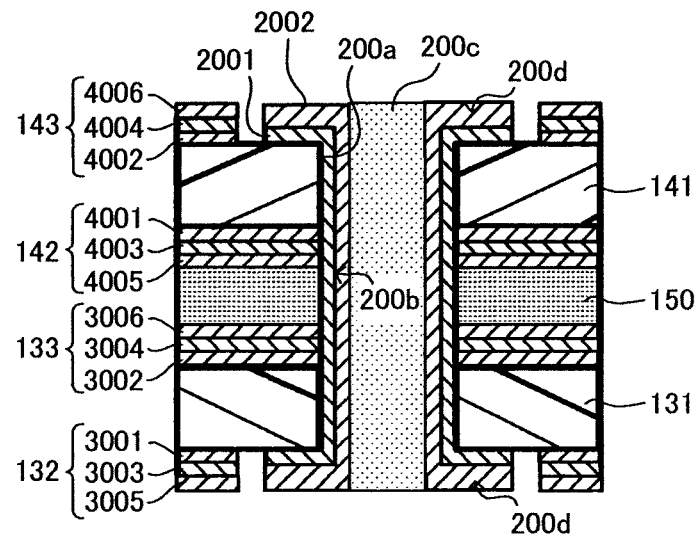
FIG. 37 is a view showing a first example where the height of the lands of a through-hole conductor and the height of the wiring layers are substantially the same.
Figure 38:
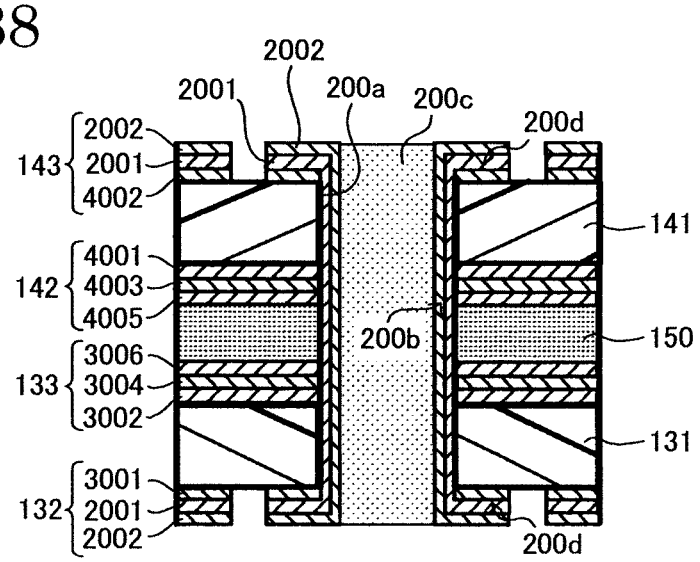
FIG. 38 is a view showing a second example where the height of the lands of a through-hole conductor and the height of the wiring layers are substantially the same.

As shown in FIGS. 37 and 38, the height of lands (200*d*) of conductor (200*b*) (such as a through-hole conductor) and the height of wiring layers (132, 143) may be set to be substantially the same.

In an example shown in FIG. 37, electroless plating 2001 and electrolytic plating 2002 are formed directly on flexible substrate 131 or 141. The structure shown in FIG. 37 may be formed by removing the conductor around through hole (200*a*) in the patterning step (FIG. 16B) for wiring layers (132, 143), for example.

In addition, in an example shown in FIG. 38, lands (200*d*) are also made triple-layered the same as wiring layers (132, 143). The structure shown in FIG. 38 is formed by the steps shown in FIGS. 39A-39C, for example.

Figure 39A:
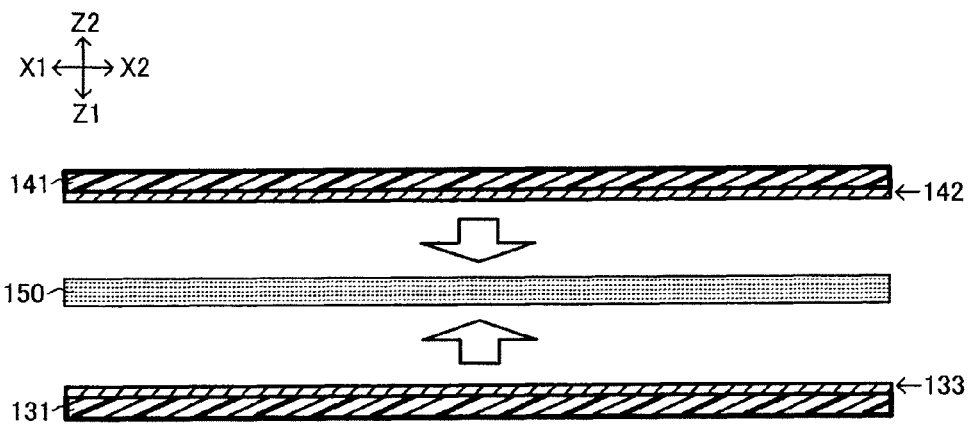
FIG. 39A is a view to illustrate a first step for forming the structure shown in FIG. 38.

In a step shown in FIG. 39A, flexible substrates (131, 141), having wiring layers (133, 142) only on their respective inner surfaces, are laminated using bonding sheet 150.

Figure 39B:
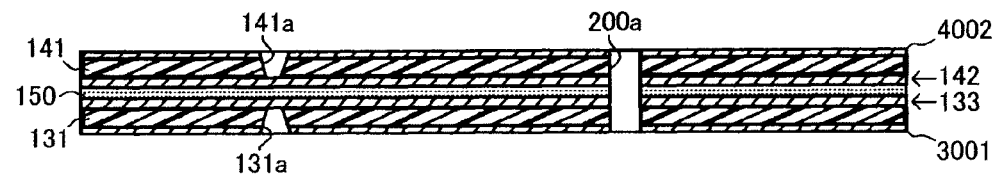
FIG. 39B is a view to illustrate a second step subsequent to the step shown in FIG. 39A.

Next, as shown in FIG. 39B, metal foil 3001 is laminated on the first surface of flexible substrate 131, and metal foil 4002 is laminated on the second surface of flexible substrate 141. Then, holes (131*a*, 141*a*) and through hole (200*a*) are formed using a laser, for example.

Figure 39C:
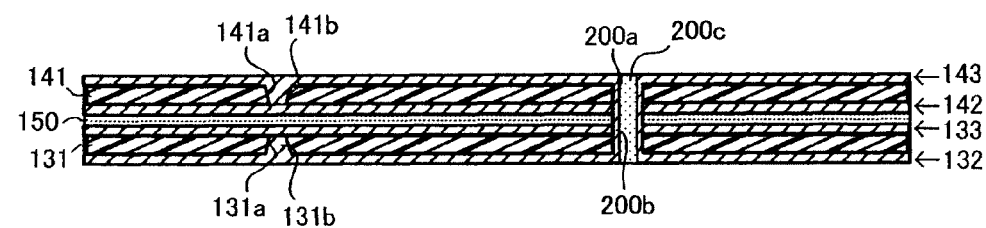
FIG. 39C is a view to illustrate a third step subsequent to the step shown in FIG. 39B.

Next, as shown in FIG. 39C, electroless plating 2001 and electrolytic plating 2002 (FIG. 38) are formed in holes (131*a*, 141*a*) and through hole (200*a*). Accordingly, connection conductors (131*b*, 141*b*) are formed. Then, conductive layers on both surfaces (outermost layers) are patterned. Accordingly, wiring layers (132, 143) are formed. As a result, the structure as shown previously in FIG. 38 is completed.

Figure 40:
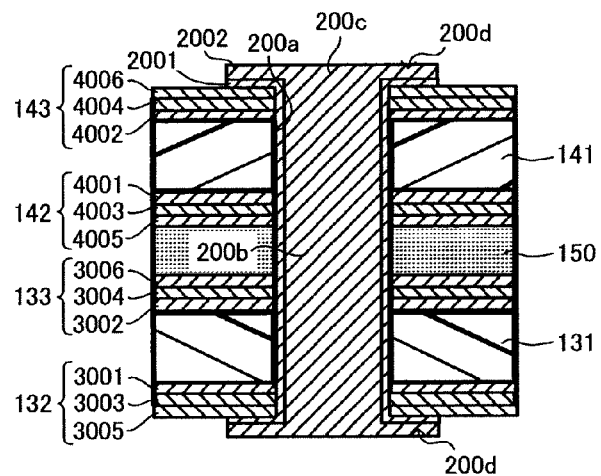
FIG. 40 is a view showing an example where a conductor in a through hole formed in a flexible connected body is a filled conductor.

Conductor (200*b*) is not limited to being a conformal conductor. For example, as shown in FIG. 40, it may be a filled conductor. In an example in FIG. 40, electroless plating 2001 and electrolytic plating 2002 are filled in through hole (200*a*). When conductor (200*b*) is made a filled conductor, it is thought that electrical characteristics and strength will be enhanced.

Figure 41:
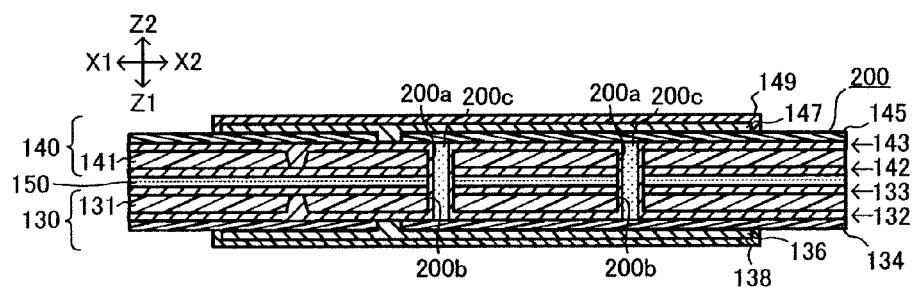
FIG. 41 is a view showing an example where the number of through holes formed in a flexible connected body is greater than one.

As shown in FIG. 41, flexible connected body 200 may contain multiple (two, for example) conductors (200*b*) (such as through-hole conductors). If such a structure is employed, it is thought that transmission routes for electrical signals may be easily ensured.

Figure 42:
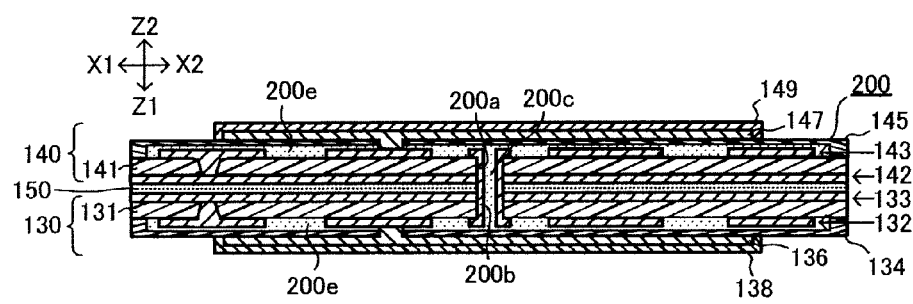
FIG. 42 is a view showing an example where an adhesive member for a coverlay is filled in a through hole formed in a flexible connected body.

As shown in FIG. 42, inner coverlays (134, 145) may be adhered to flexible substrates (131, 141) using adhesive member (200*e*). In such a case, when inner coverlays (134, 145) are adhered, insulative body (200*c*) is preferred to be formed by filling adhesive member (200*e*) in through hole (200*a*). By doing so, the additional step of filling resin or the like in through hole (200*a*) may be omitted, and it is thought that procedures may be simplified.

Figure 43:
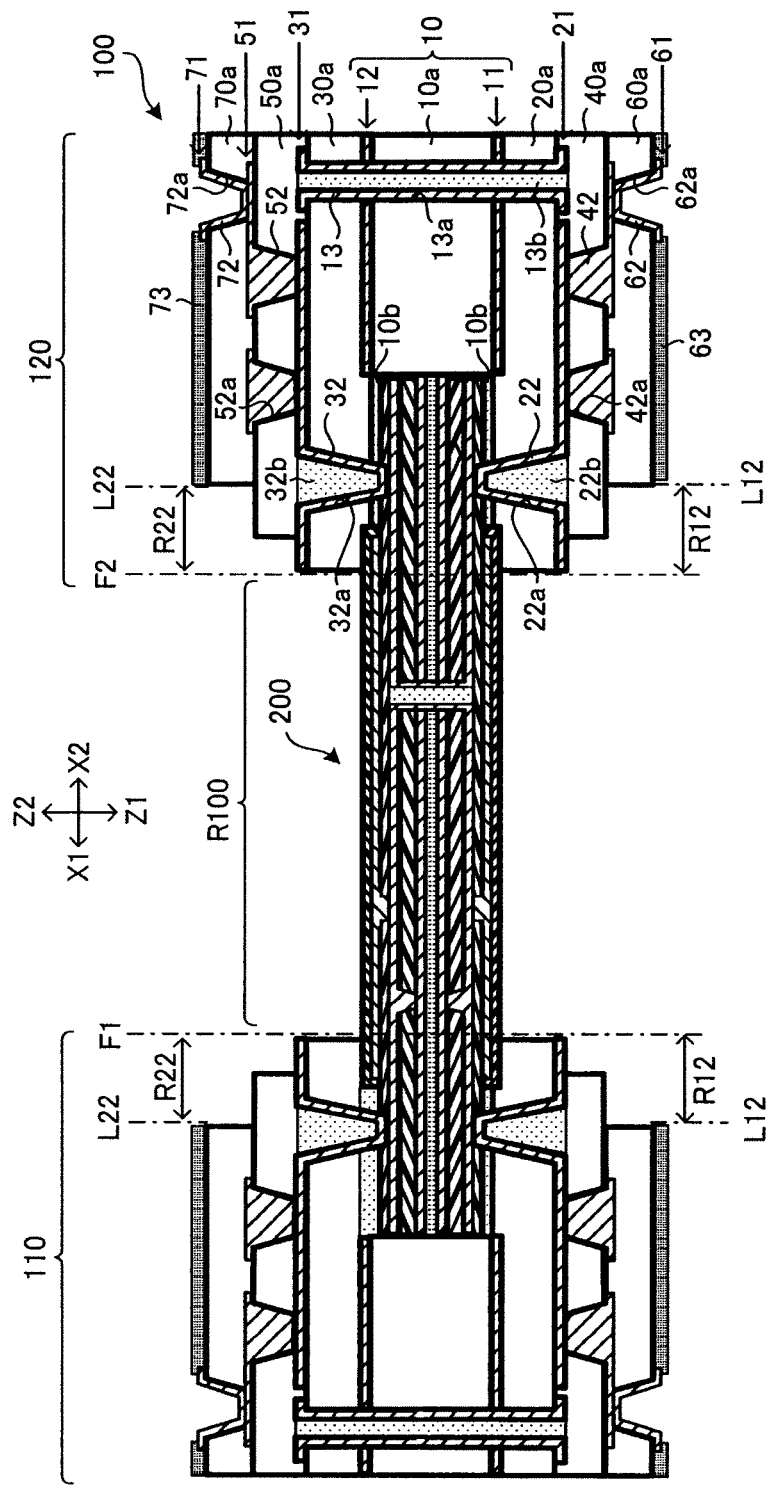
FIG. 43 is a view showing a structure where insulation layers become thinner in steps as they come closer to the flexible section.
Figure 44:
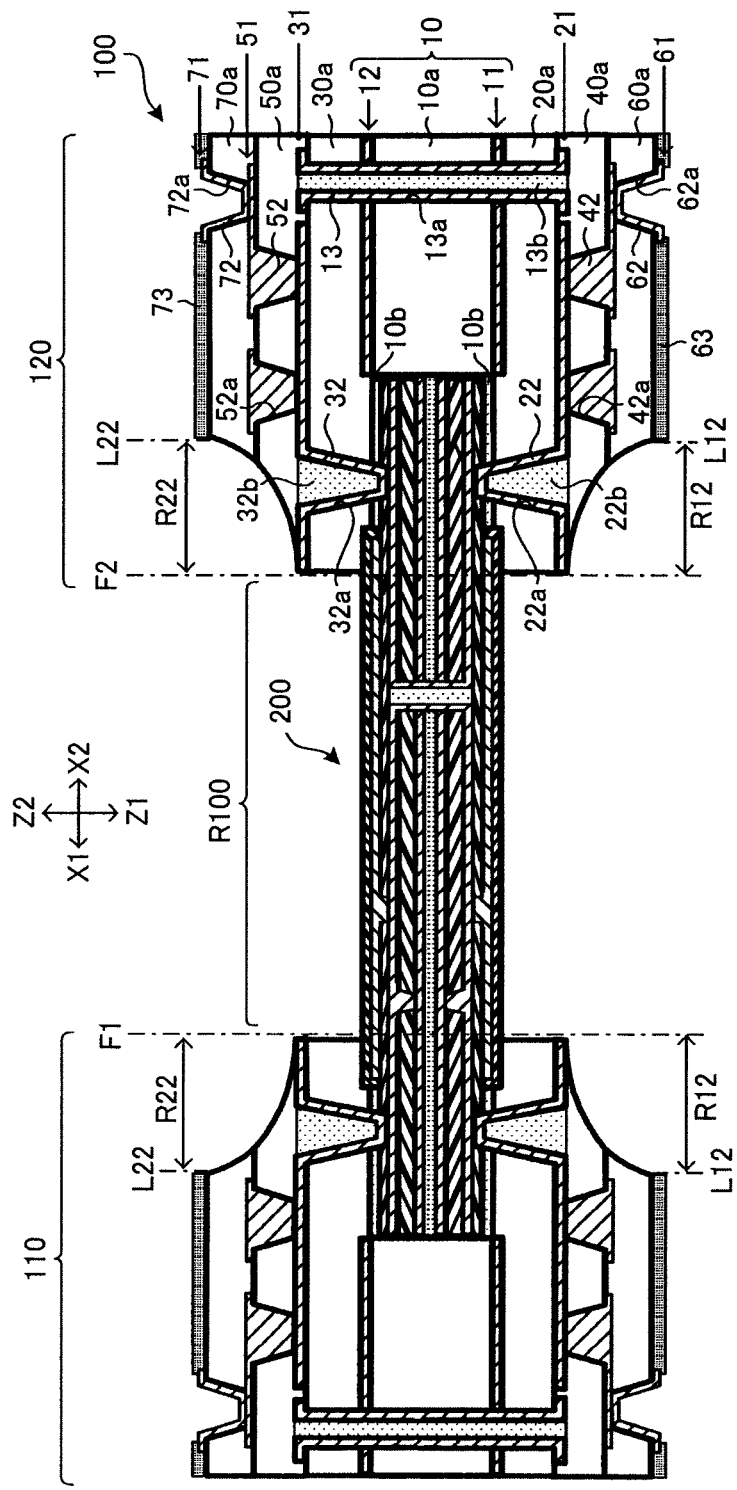
FIG. 44 is a view showing a first structure where insulation layers become continuously thinner as they come closer to the flexible section.
Figure 45:
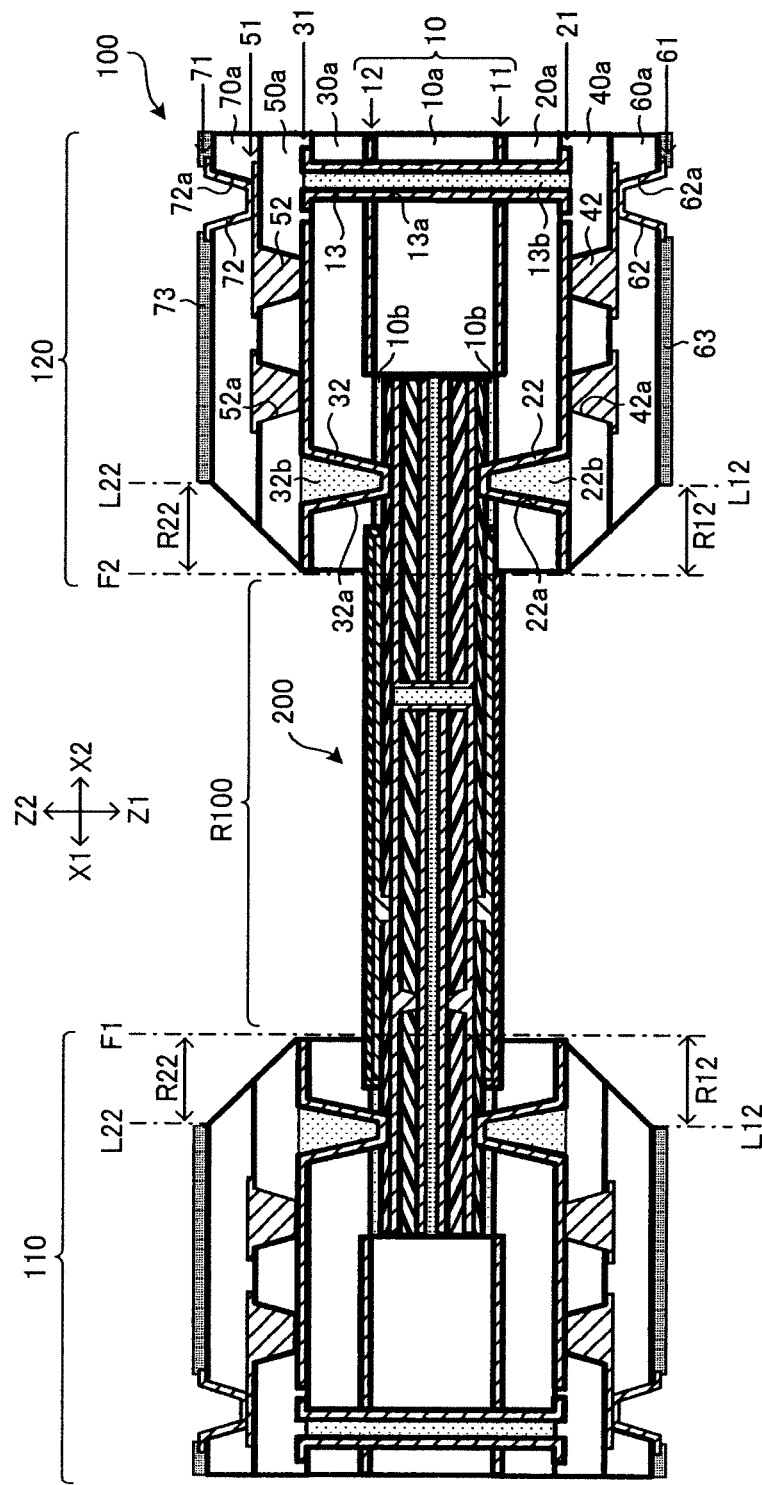
FIG. 45 is a view showing a second structure where insulation layers become continuously thinner as they come closer to the flexible section.

As shown in FIGS. 43-45, insulation layers (20*a*, 40*a*, 60*a*) on the first-surface side and insulation layers (30*a*, 50*a*, 70*a*) on the second surface side may each contain a portion that becomes thinner as it comes closer to flexible section (R100). By employing such a structure, it is thought that both end portions of flexible connected body 200 will be sandwiched and held more firmly.

In examples shown in FIGS. 43-45, the number of layers is increased from those in flex-rigid wiring boards 100 of the above embodiments. Insulation layer (60*a*) is laminated on the first-surface side of insulation layer (40*a*), and insulation layer (70*a*) is formed on the second-surface side of insulation layer (50*a*). Wiring layer 61 is formed on insulation layer (60*a*), and wiring layer 71 is formed on insulation layer (70*a*). In addition, solder-resist layer 63 is formed on insulation layer (60*a*), and solder resist layer 73 is formed on insulation layer (70*a*). Also, hole (62*a*) is formed in insulation layer (60*a*), and hole (72*a*) is formed in insulation layer (70*a*). Connection conductors (62, 72) made of copper plating, for example, are formed respectively on the wall surfaces of holes (62*a*, 72*a*).

In an example shown in FIG. 43, on the flexible section (R100) side, in range (R12) located between position (L12) at an end of the first-surface-side outermost insulation layer (insulation layer 60*a*) in rigid section 110 or 120 and F-R boundary surface (F1) or (F2), first-surface-side insulation layers (20*a*, 40*a*, 60*a*) become thinner in steps as they come closer to flexible section (R100). Here, an end of insulation layer (60*a*) on the flexible section (R100) side is located at position (L12); an end of insulation layer (40*a*) on the flexible section (R100) side is located between position (L12) and F-R boundary surface (F1) or (F2) (for example, substantially in the middle); and an end of insulation layer (20*a*) on the flexible section (R100) side corresponds to F-R boundary surface (F1) or (F2). Such a structure also applies to insulation layers (30*a*, 50*a*, 70*a*) on the second-surface side. However, in that situation, position (L22) shown in FIG. 43 replaces position (L12), and range (R22) replaces range (R12).

By contrast, in an example shown in FIGS. 44 and 45, on the flexible section (R100) side, in range (R12) located between position (L12) at an end of the first-surface-side outermost insulation layer (insulation layer 60*a*) in rigid section 110 or 120 and F-R boundary surface (F1) or (F2), first-surface-side insulation layers (20*a*, 40*a*, 60*a*) become continuously thinner as they come closer to flexible section (R100). Also, on the flexible section (R100) side, in range (R22), which is located between position (L22) at an end of the second-surface-side outermost insulation layer (insulation layer 70*a*) in rigid section 110 or 120 and F-R boundary surface (F1) or (F2), second-surface-side insulation layers (30*a*, 50*a*, 70*a*) become continuously thinner as they come closer to flexible section (R100).

In an example shown in FIG. 44, end surfaces of first-surface-side insulation layers (20*a*, 40*a*, 60*a*) on the flexible section (R100) side are curved surfaces that continue through such insulation layers (20*a*, 40*a*, 60*a*). Also, the same applies to insulation layers (30*a*, 50*a*, 70*a*) on the second-surface side.

In an example shown in FIG. 45, end surfaces of first-surface-side insulation layers (20*a*, 40*a*, 60*a*) on the flexible section (R100) side are inclined surfaces that continue through such insulation layers (20*a*, 40*a*, 60*a*). Also, the same applies to insulation layers (30*a*, 50*a*, 70*a*) on the second-surface side.

Structures shown in FIGS. 43-45 may be formed, for example, by shifting insulation layers when arranging them from a lower layer toward an upper layer, by etching or by shaving insulation layers using a laser or the like when forming cut lines (4021-4024) (FIG. 29), and so forth.

Figure 46:
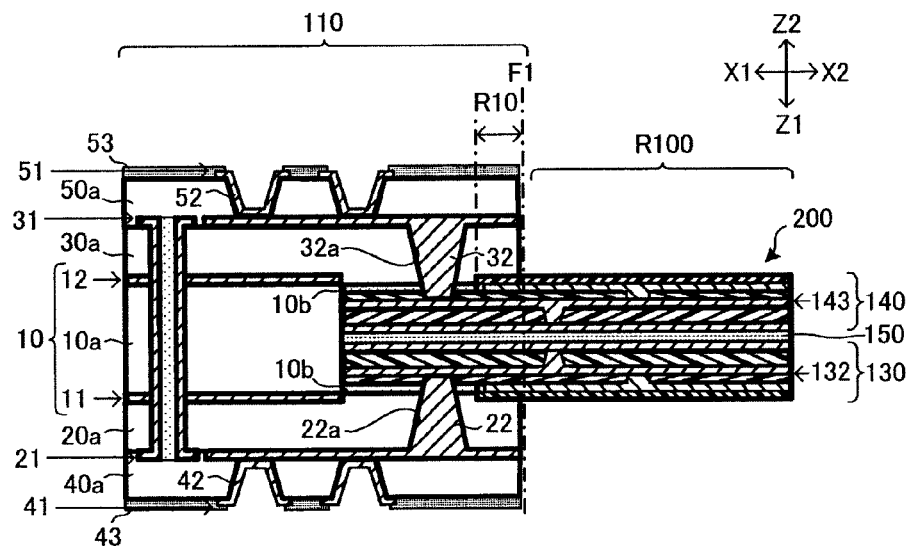
FIG. 46 is a view showing an example where connection conductors in the core section are made filled conductors.

Connection conductors (22, 32) to electrically connect conductive patterns in flexible connected body 200 (wiring layers 132, 143) and conductive patterns in rigid section 110 or 120 (wiring layers 21, 31) are not limited to conformal conductors, and they may be filled conductors as shown in FIG. 46. When connection conductors (22, 32) are filled conductors, it is thought that conductive patterns in flexible connected body 200 (wiring layers 132, 133) and conductive patterns in rigid section 110 or 120 (wiring layers 21, 31) will be connected more firmly.

Figure 47:
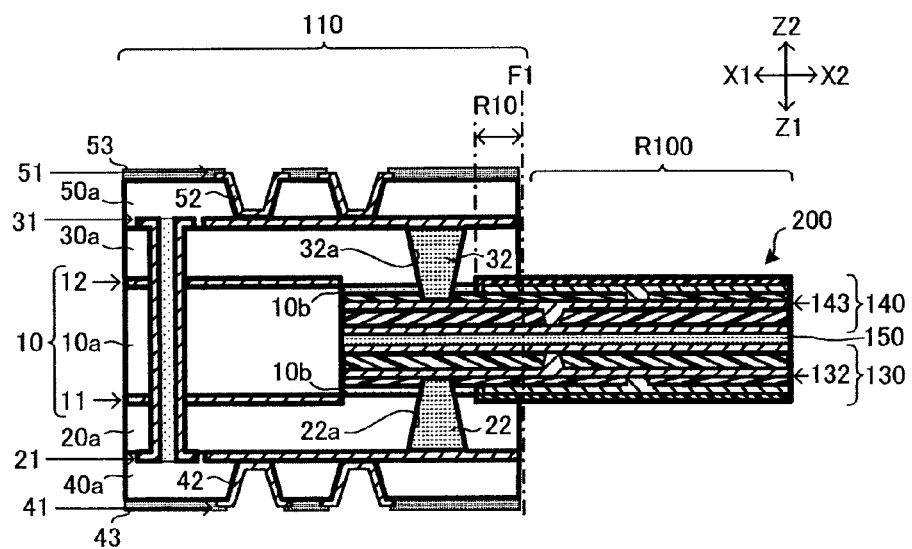
FIG. 47 is a view showing an example where connection conductors in the core section are made of conductive paste.

Connection conductors (22, 32) to electrically connect conductive patterns in flexible connected body 200 (wiring layers 132, 143) and conductive patterns in rigid section 110 or 120 (wiring layers 21, 31) may be formed using conductive paste as shown in FIG. 47. Connection conductors (22, 32) may be filled conductors or conformal conductors. Also, as shown in FIG. 47, wiring layer 21 or 31 and connection conductor 22 or 32 may be formed using different materials from each other.

Figure 48A:
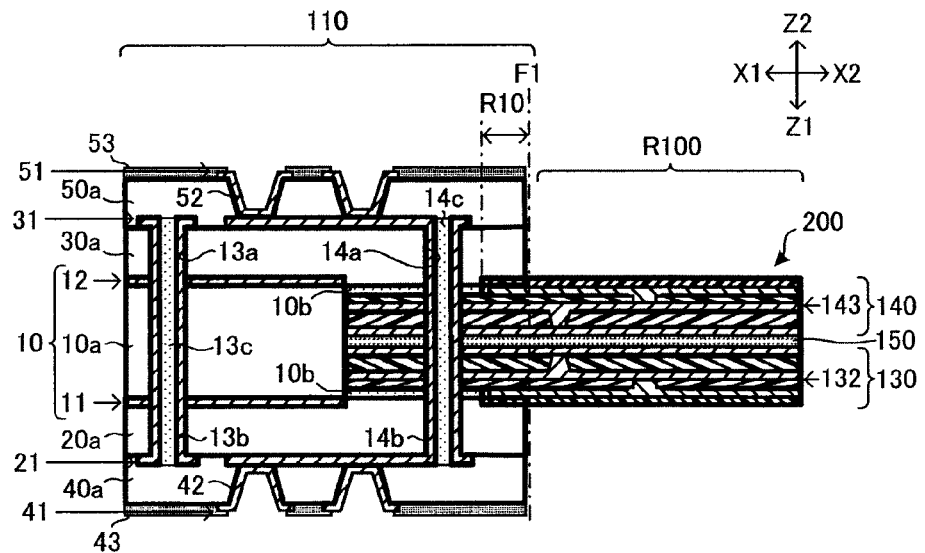
FIG. 48A is a view showing a first example where a connection conductor in the core section is the conductor in a through hole.
Figure 48B:
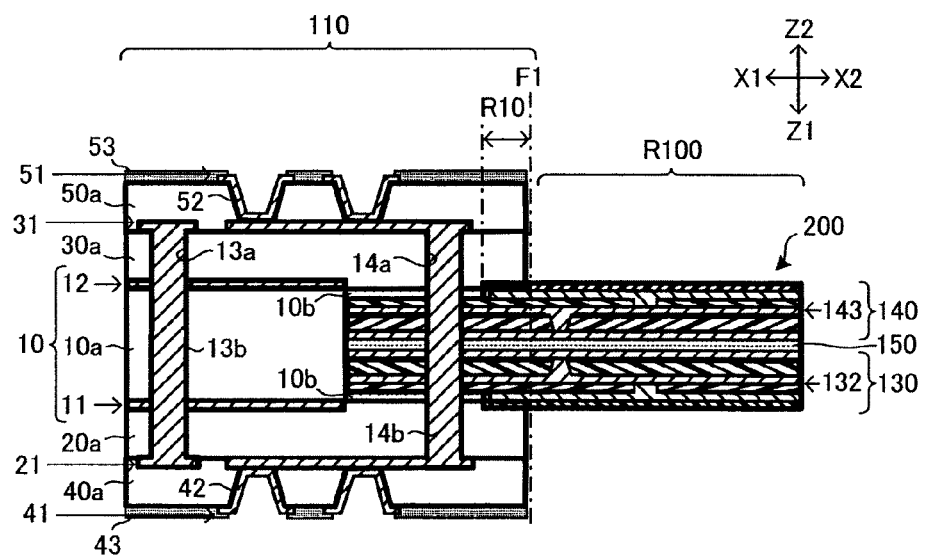
FIG. 48B is a view showing a second example where a connection conductor in the core section is the conductor in a through hole.

As shown in FIGS. 48A, 48B), conductive patterns in flexible connected body 200 (wiring layers 132, 143) and conductive patterns in rigid section 110 or 120 (wiring layers 21, 31) may be electrically connected to each other by conductor (14*b*) (conformal conductor or filled conductor) in through hole (14*a*) which penetrates through insulation layer (30*a*), flexible connected body 200 and insulation layer (20*a*). If conductor (14*b*) is a conformal conductor (FIG. 48A), insulative body (14*c*) is filled inside conductor (14*b*), for example.

In those examples, side surfaces of wiring layers (132, 133, 142, 143) are exposed, and wiring layers (21, 31, 132, 133, 142, 143) are electrically connected by conductor (14*b*). However, not all such wiring layers are required to be connected to each other, and it is sufficient if only the required wiring layers are connected to each other. If such a connection method is employed that uses conductor (14*b*) in through hole (14*a*), since holes in multiple layers may be formed all at once, manufacturing flex-rigid wiring board 100 becomes easier compared with situations in which holes are formed separately in each layer. Through hole (14*a*) may also penetrate through rigid section 110 or 120.

Figure 49:
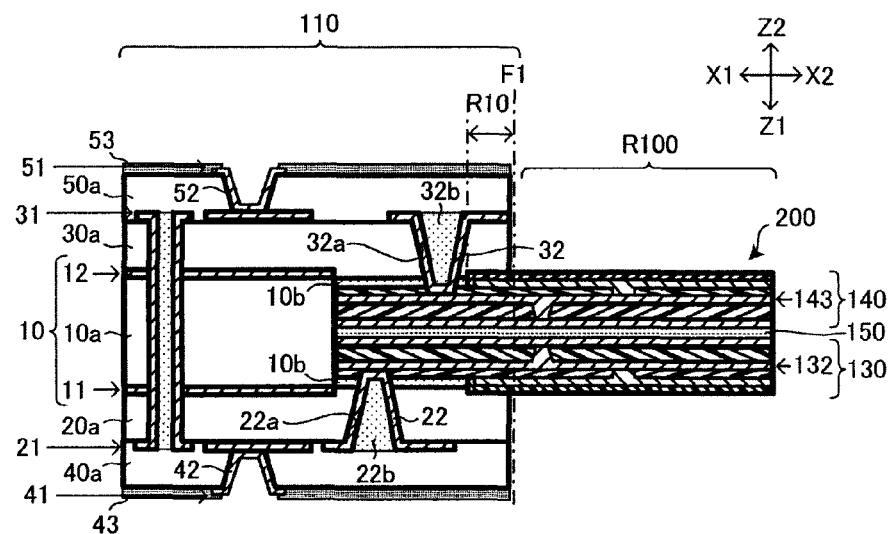
FIG. 49 is a view showing an example where connection conductors in the core section are positioned not to face each other.

As shown in FIG. 49, it is not always required that connection conductor 22 and connection conductor 32 face each other. Namely, connection conductor 22 and connection conductor 32 may be positioned away from axis Z (shifted in direction X or direction Y, for example).

Figure 50:
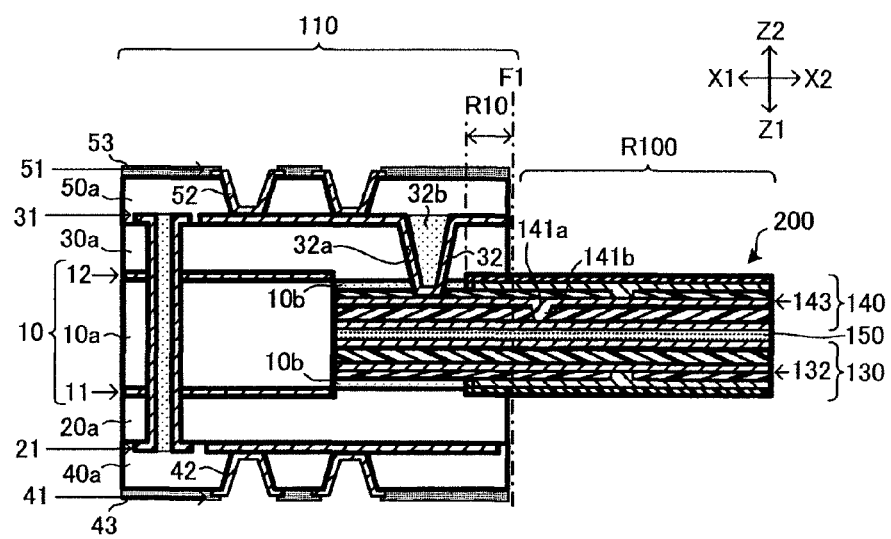
FIG. 50 is a view showing an example where only a wiring layer on one side of a flexible connected body is electrically connected to a conductive pattern in a rigid section.

As shown in FIG. 50, only one surface of flexible connected body 200 (either wiring layer 132 or 143) may be electrically connected to a conductive pattern (wiring layer 21 or 31) of rigid sections (110, 120) by connection conductor 22 or 32. In an example shown in FIG. 50, only wiring layer 31 is connected to wiring layer 143 by connection conductor 32. Also, as shown in FIG. 50, regarding connection conductors (131b, 141b), any unnecessary conductor (connection conductor (131b), for example) may be omitted.

Figure 51A:
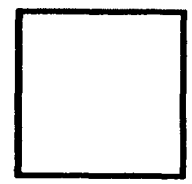

The shape of horizontal cross sections (X-Y plane) of connection conductors and their holes is not limited to a circle (completely round circle), and any other shape may be employed. The shape of such cross section may be a square as shown in FIG. 51A, for example, or may be any other regular polygon, such as a regular hexagon or a regular octagon. The shape of angles in such polygons is not limited to any type, and may be a right angle, an acute angle, or an obtuse angle, or may even be roundish, for example. However, to prevent thermal stress from being concentrated, it is preferred that angles be roundish.

Also, the shape of the above horizontal cross sections may be oval, rectangular, triangular or the like.

The above circles, ovals and regular polygons have advantages since their shapes tend to be similar to the shape of the holes.

Figure 51B:
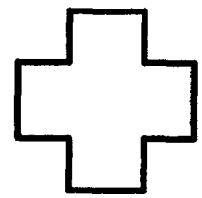
Figure 51C:
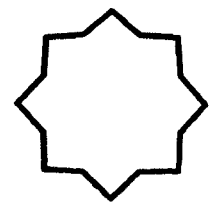

Alternatively, as shown in FIG. 51B or 51C, shapes such as a cross or a regular polygonal star formed by drawing straight lines to radiate out from the center (shapes in which multiple spokes are positioned in a radial pattern) may be effective as the shape of the above horizontal cross sections.

Figure 52A:
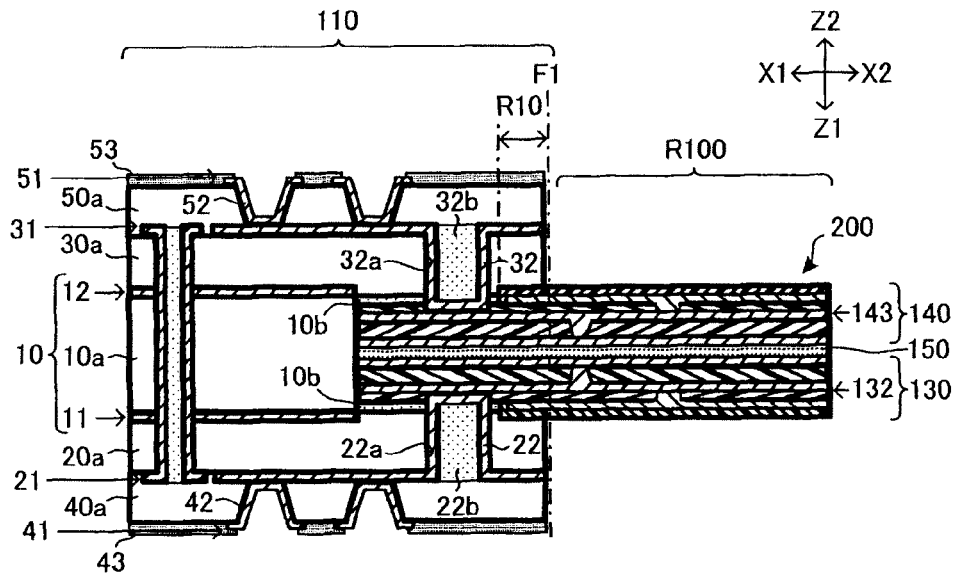
FIG. 52A is a view showing a first alternative example of a vertical cross-sectional shape of connection conductors in a core section.
Figure 52B:
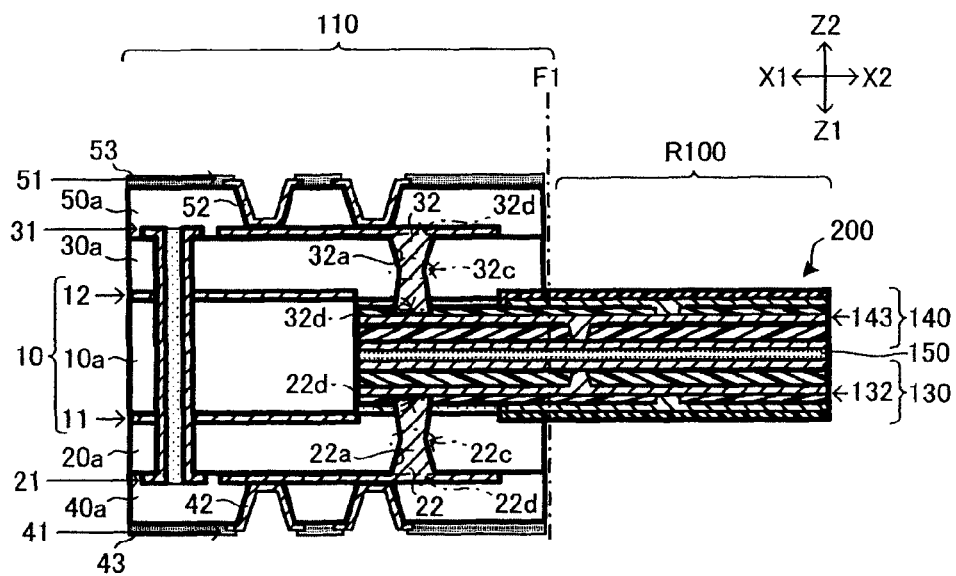
FIG. 52B is a view showing a second alternative example of a vertical cross-sectional shape of connection conductors in a core section.

The shape of vertical cross sections of connection conductors may be configured freely. For example, as shown in FIG. 52A, holes (22a, 32a) in which connection conductors (22, 32) are formed may be configured to be cylindrical. Alternatively, as shown in FIG. 52B, connection conductors (22, 32) may be configured in such a way that the width at middle portions (22c, 32c), which are positioned at substantially the middle in a thickness direction, is smaller than the width at opening portions (22d, 32d) on the first surface and the second surface. If holes are configured as such, since the width at opening portions (22d, 32d) is greater than the width at middle portions (22c, 32c), it is thought that better performance may be expected when the holes are filled by plating. As a result, it is thought that surface flatness features will be enhanced. Also, connection conductors (22, 32) have the smallest cross sections at middle portions (22c, 32c). Accordingly, it is thought that connection areas between insulation layers (20a, 30a) and connection conductors (22, 32) will increase. In addition, stress will be concentrated in portions on connected conductors (22, 32) away from wiring layers (21, 31). Accordingly, it is thought that stress from side directions (directions X or directions Y) will be dispersed and that connection conductors (22, 32) will be suppressed from peeling caused by concentrated stress. In addition, as a result, it is thought that connection reliability will increase.

Figure 53:
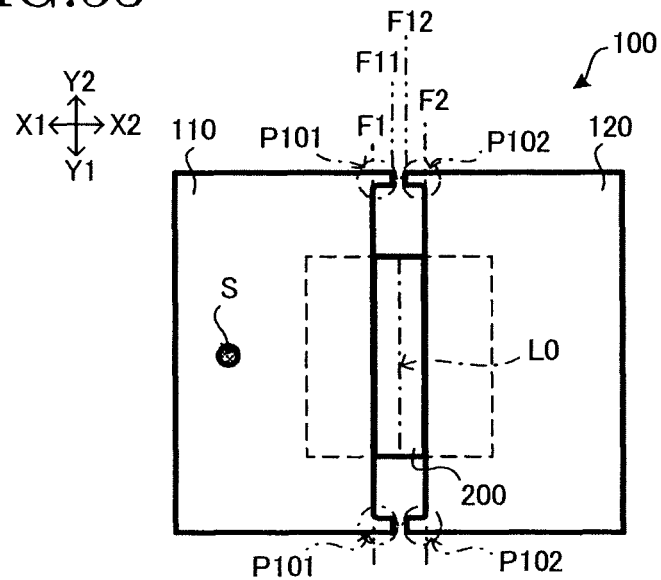
FIG. 53 is a view showing an example where rigid sections have protruding portions that protrude from the boundary with the flexible section.

As shown in FIG. 53, rigid sections (110, 120) may have protruding portions (P101, P102) which protrude from F-R boundary surfaces (F1, F2) between flexible section (R100) and the rigid sections. In an example shown in FIG. 53, rigid section 110 has two protruding portions (P101), and rigid section 120 has two protruding portions (P102). Protruding portions (P101) are positioned on the Y1 side and Y2 side of flexible connected body 200, and protrude toward the X2 side from F-R boundary surface (F1) between rigid section 110 and flexible section (R100). On the other hand, protruding portions (P102) are positioned on the Y1 side and Y2 side of flexible connected body 200, and protrude toward the X1 side from F-R boundary surface (F2) between rigid section 120 and flexible section (R100). The planar shape of protruding portions (P101, P102) (the shape on the X-Y plane) is rectangular, for example. Excessive stress may be suppressed from occurring in the F-R connection sections by forming such protruding portions (P101, P102). Descriptions of such an effect are provided in the following with reference to FIG. 54.

It is thought that flex-rigid wiring board 100 may be folded in two at line (L0) in FIG. 53, for example, and accommodated in casing 5001 of a cell phone or the like. When being folded in two, curved portion (P103) will be formed near line (L0) of flexible connected body 200. In such a case, flex-rigid wiring board 100 may be pressed against casing 5001 due to vibrations or swinging.

Figure 54:
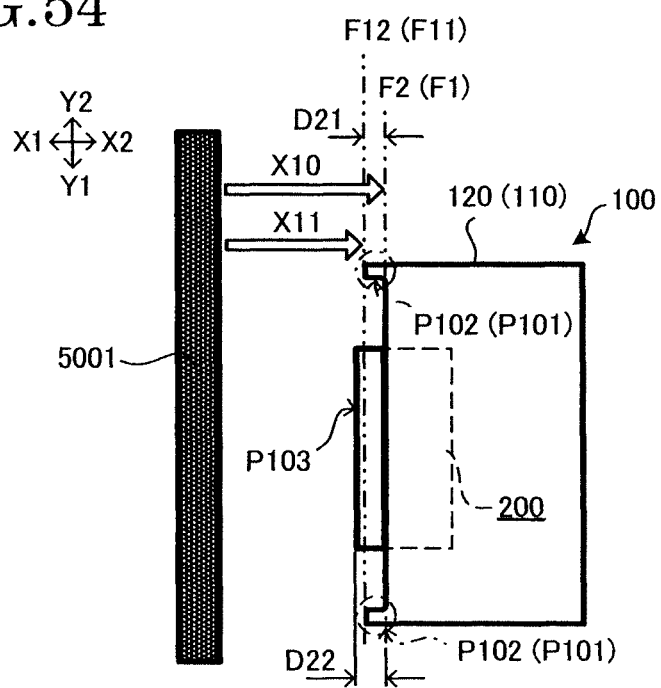
FIG. 54 is a view to illustrate the effects of the protruding portions shown in FIG. 53.

During such time, without protruding portions (P101, P102), casing 5001 may move freely until it touches F-R boundary surface (F1) or (F2) as indicated by arrow (X10) in FIG. 54. In such a situation, if force toward the X2 side is exerted on casing 5001 due to vibrations or the like, it is thought that curved portion (P103) of flexible connected body 200 will be pushed into the X2 side by casing 5001. Moreover, if curved portion (P103) of flexible connected body 200 is further pushed closer to F-R boundary surface (F1) or (F2), great force will be generated at the F-R connection sections, and line breakage or the like will become a concern.

By contrast, with protruding portions (P101, P102), as indicated by arrow (X11) in FIG. 54, the movement of casing 5001 will be restricted by top surfaces (F11) of protruding portions (P101) or top surfaces (F12) of protruding portions (P102). Therefore, casing 5001 will not push curved portion (P103) of flexible connected body 200 any further. Accordingly, stress will seldom be generated at the F-R connection sections. As a result, line breakage or the like will be suppressed from occurring at the F-R connection sections.

Figure 55:
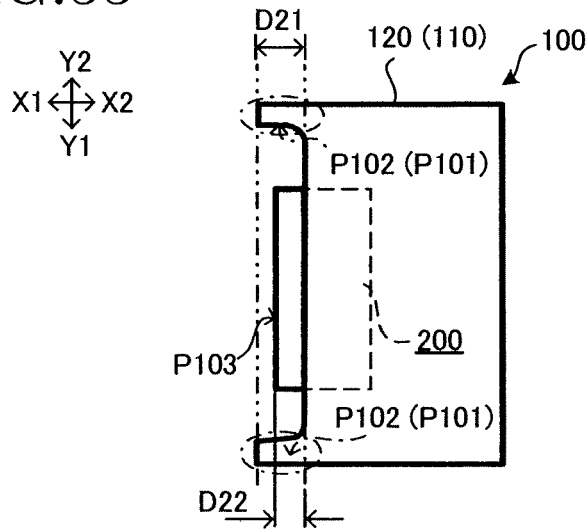
FIG. 55 is a view showing a first alternative example of the configuration of protruding portions.

The protruding amount (D21) of protruding portions (P101, P102) is approximately 1 mm, for example. The protruding amount (D22) of curved portion (P103) of flexible connected body 200 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 55, for example. By so setting, it is difficult for casing 5001 to even touch curved portion (P103) of flexible connected body 200.

Figure 56A:
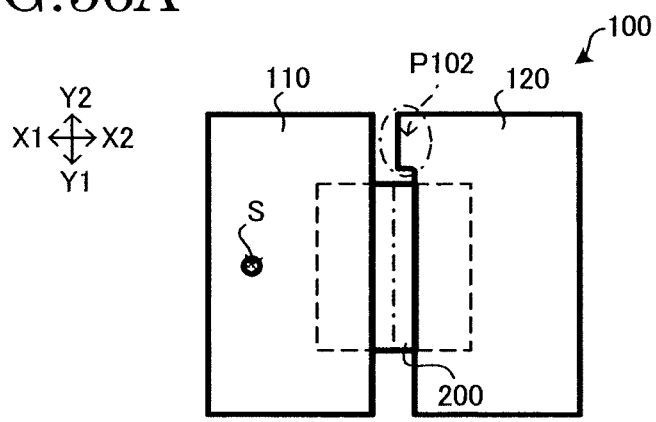
FIG. 56A is a view showing a second alternative example of the configuration of a protruding portion.
Figure 56B:
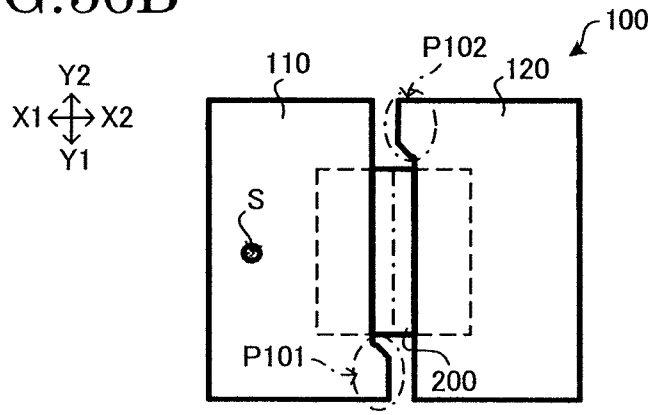
FIG. 56B a view showing a third alternative example of the configuration of protruding portions.

The number, shape, position and so forth of protruding portions (P101, P102) are not limited specifically. For example, as shown in FIG. 56A, one protruding portion (P102) may be formed only in either rigid section 110 or 120; for example, only in rigid section 120. Alternatively, as shown in FIG. 56B, for example, the planar shape of protruding portions (P101, P102) may be trapezoidal. As in the example shown in FIG. 56B, protruding portion (P101) may be formed on the Y1 side of flexible connected body 200, and protruding portion (P102) may be formed on the Y2 side of flexible connected body 200.

Figure 57A:
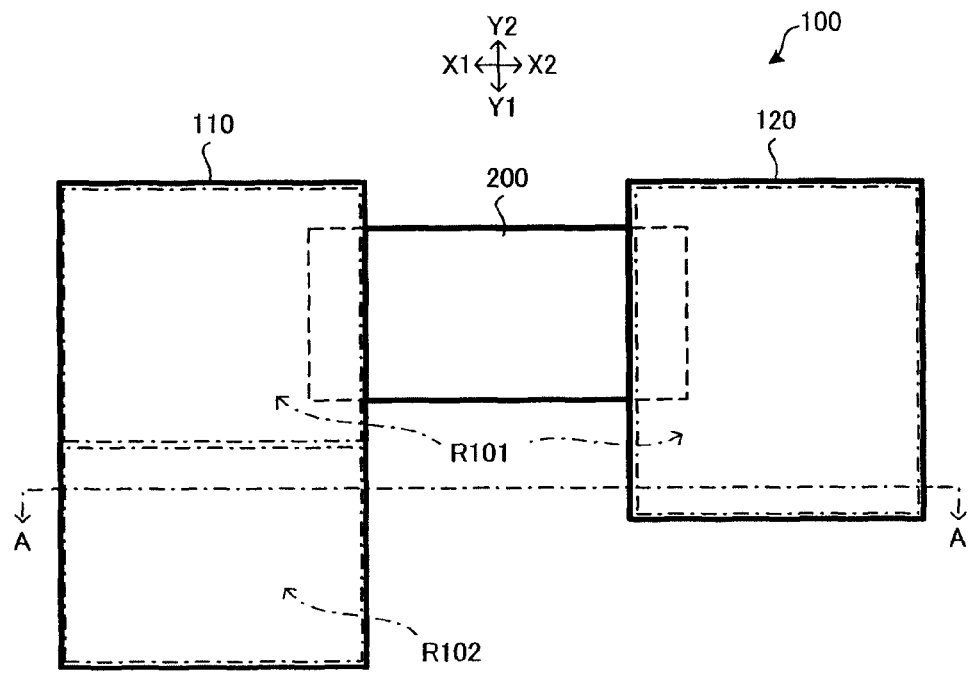
FIG. 57A is a view showing an example where a rigid section has multiple regions having a different number of layers from each other.
Figure 57B:
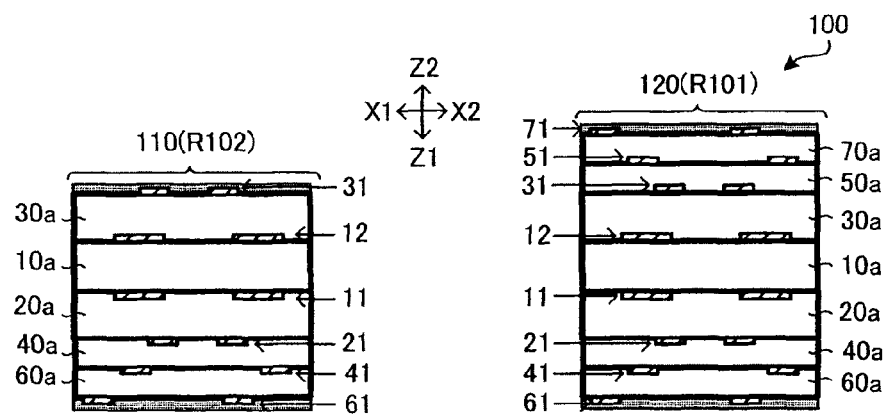
FIG. 57B is a cross-sectional view seen from the A-A line in FIG. 57A.

Rigid section 110 or 120 may contain multiple regions having a different number of layers from each other. For example, as shown in FIG. 57A and FIG. 57B (cross-sectional view seen from the (A-A) line in FIG. 57A), rigid section 110 may have nine-layered region (R101) and six-layered region (R102). Region (R102) having fewer layers than region (R101) may be formed by masking or the like so that more than a predetermined number of layers will not be laminated. However, forming methods are not limited to the above, and the number of layers may be adjusted by removing the unnecessary layers after they are laminated.

Figure 58A:
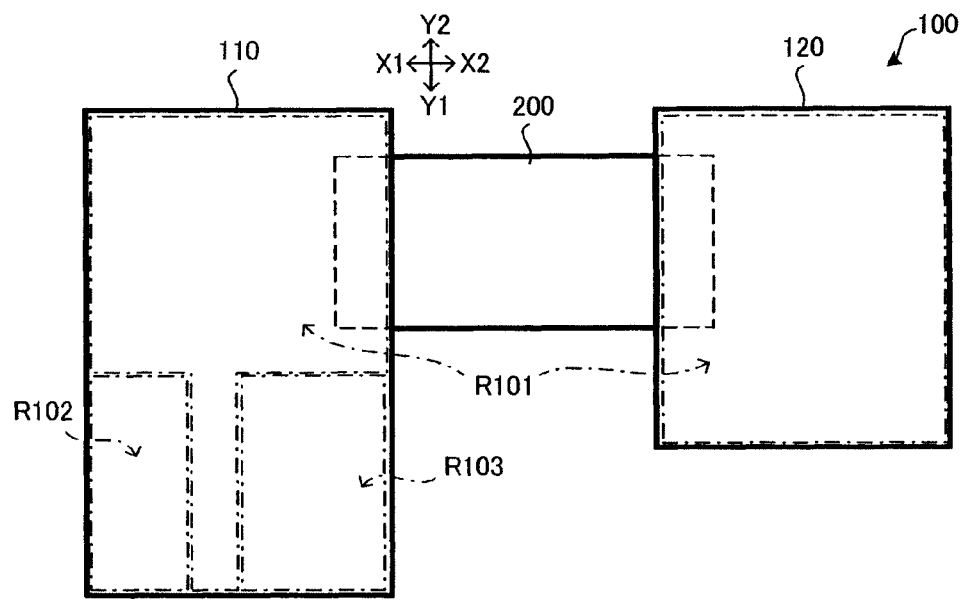
FIG. 58A is a view showing an example where a rigid section has three regions having a different number of layers from each other.

At least either rigid section 110 or 120 may contain three or more regions having a different number of layers from each other. For example, as shown in FIG. 58A, rigid section 110 may contain three regions (R101-R103) having a different number of layers from each other.

Figure 58B:
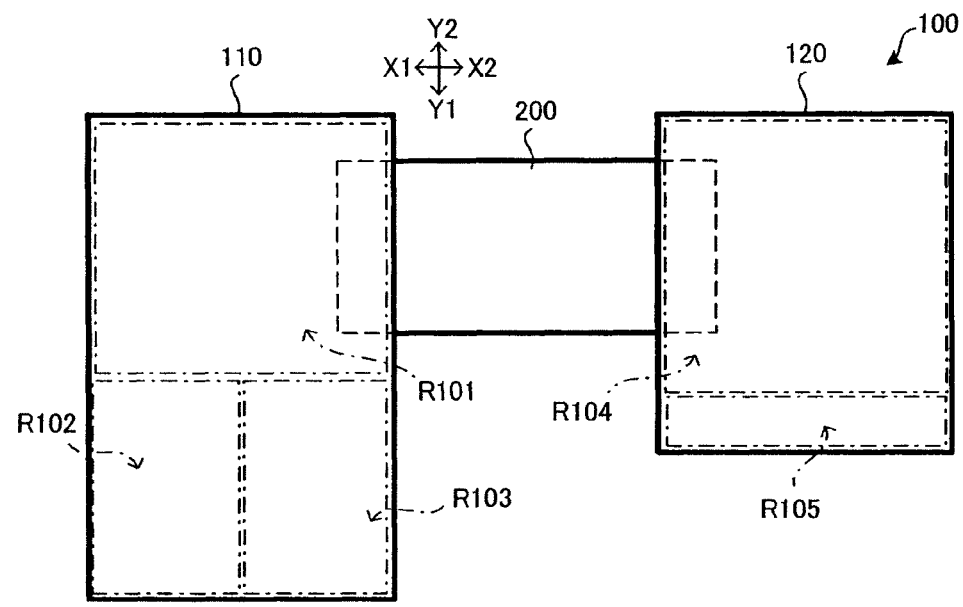
FIG. 58B is a view showing an example where two rigid sections each have multiple regions having a different number of layers from each other.

Both rigid sections 110 and 120 may contain multiple regions having a different number of layers from each other. For example, as shown in FIG. 58B, rigid section 110 may contain three regions (R101-R103) having a different number of layers from each other, and rigid section 120 may contain two regions (R104, R105) having a different number of layers from each other.

In FIGS. 57A-58B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

Basically, flexible connected body 200 may be configured freely. For example, as shown in FIGS. 59A-59C, the width of flexible connected body 200 may be partially enlarged.

Figure 59A:
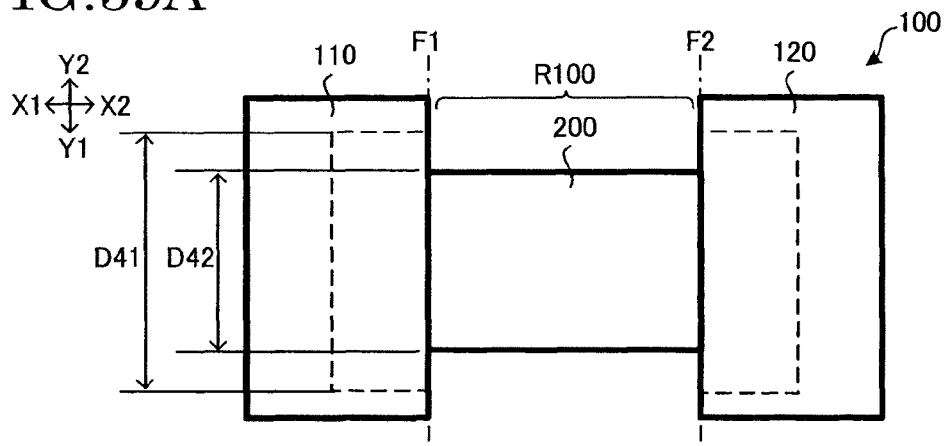
FIG. 59A is a view showing a first example where the width of a flexible wiring board is partially enlarged.

In an example shown in FIG. 59A, when flexible connected body 200 is divided into two regions at the boundary (F-R boundary surface F1 or F2) between rigid section 110 or 120 and flexible section (R100), width (D41) of the region in rigid section 110 or 120 (the portion where flexible connected body 200 is inserted into rigid section 110 or 120) is set greater than width (D42) of the region in flexible section (R100) (D41>D42). Accordingly, the connection area will increase between flexible connected body 200 and rigid section 110 or 120. As a result, it is thought that connection reliability will be enhanced in the F-R connection sections. If width (D41) or (D42) is not constant (for example, see FIGS. 59B and 59C), which width is greater may be determined by a comparison of their average values.

Figure 59B:
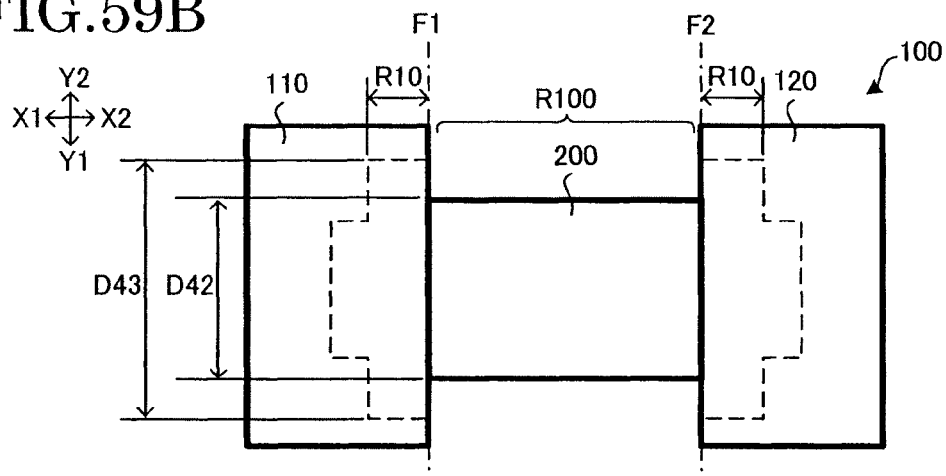
FIG. 59B is a view showing a second example where the width of a flexible wiring board is partially enlarged.

Alternatively, as shown in FIG. 59B, the width of flexible connected body 200 may be enlarged in region (R10) (see also FIG. 9) where rigid section 110 or 120 and flexible connected body 200 are laminated and connected. In such an example, width (D43) in region (R10) is set greater than width (D42) in flexible section (R100) (D43>D42). It is thought that such a structure may also enhance connection reliability in the F-R connection sections the same as in the example shown in FIG. 59A.

Figure 59C:
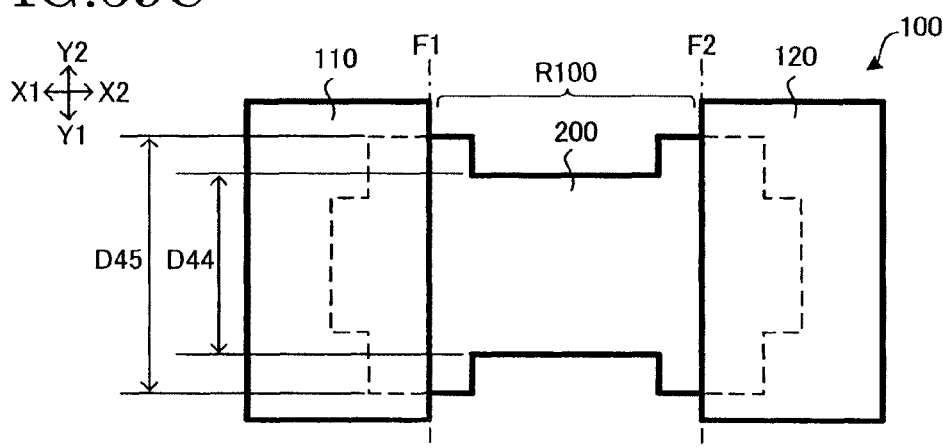
FIG. 59C is a view showing a third example where the width of a flexible wiring board is partially enlarged.

Yet alternatively, as shown in FIG. 59C, the width of flexible connected body 200 may also be enlarged near the boundary (F-R boundary surface F1 or F2) between rigid section 110 or 120 and flexible section (R100). In such an example, the width of flexible connected body 200 is enlarged from (D44) to (D45) near the boundary (D45>D44). It is thought that such a structure may also enhance connection reliability at the F-R connection sections the same as in the example shown in FIG. 59A.

Flex-rigid wiring board 100 may contain electronic components and be set as an electronic device.

Figure 60:
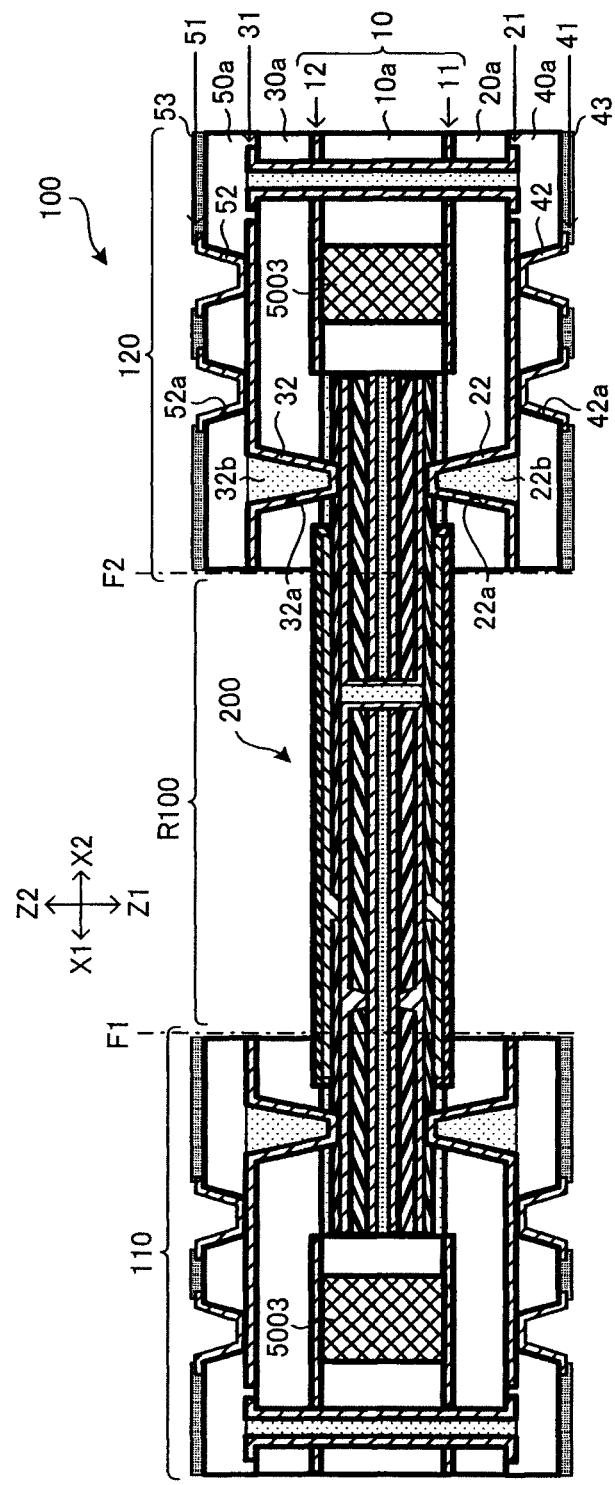
FIG. 60 is a view showing an example of a flex-rigid wiring board having built-in electronic components.

Flexible wiring board 100 may contain built-in electronic components. For example, as shown in FIG. 60, electronic components 5003 may be built in rigid sections (110, 120). In an example shown in FIG. 60, two electronic components 5003 are built into the board. However, the number of electronic components is not limited specifically. For example, rigid section 110 or 120 may have two or more built-in electronic components. Alternatively, an electronic component may only be built into either rigid section 110 or 120. Using flex-rigid wiring board 100 with built-in electronic components, the electronic device may become highly functional.

Figure 61:
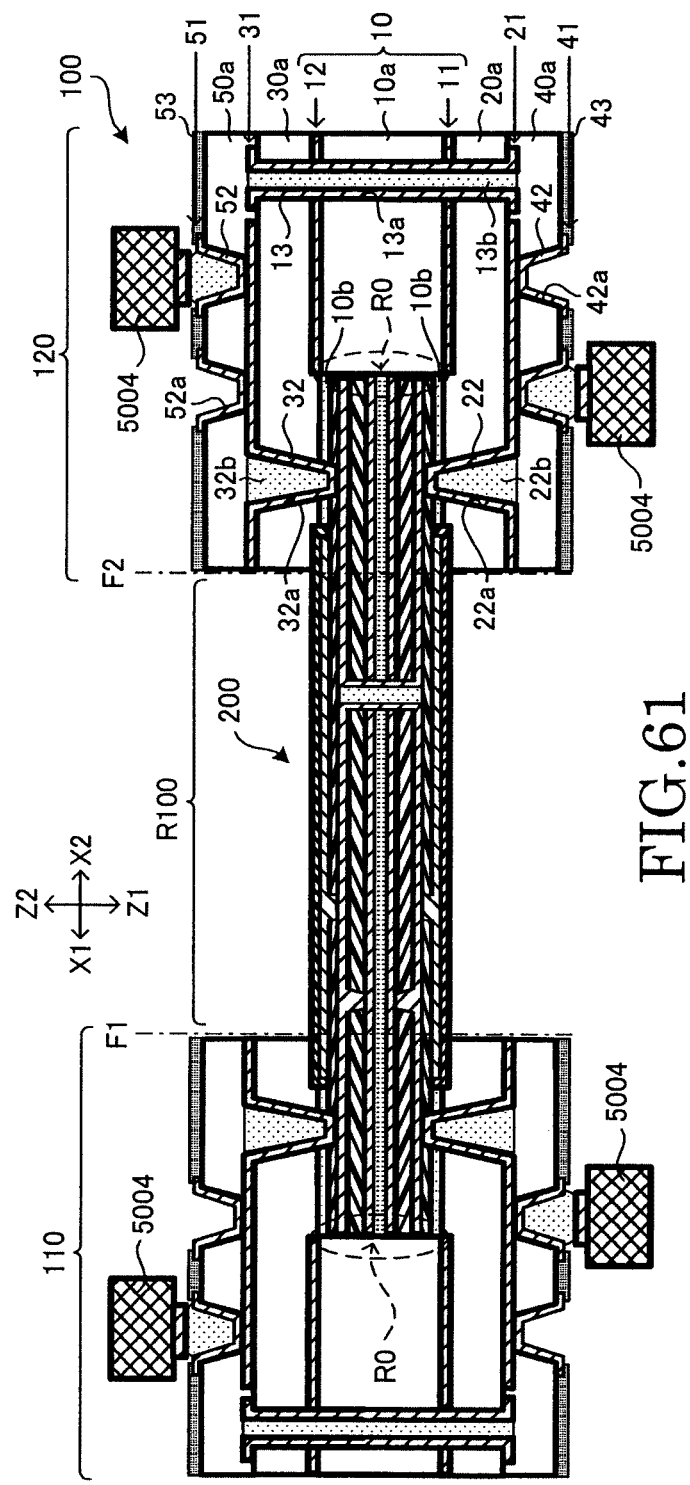
FIG. 61 is a view showing an example of a flex-rigid wiring board having electronic components mounted on its surface.

Alternatively, as shown in FIG. 61, for example, electronic components 5004 may be mounted on a surface of rigid sections (110, 120). In an example shown in FIG. 61, two electronic components 5004 are mounted. However, the number of electronic components is not limited specifically. For example, two or more electronic components may be mounted on rigid section 110 or 120. Yet alternatively, an electronic component may be mounted only on either rigid section 110 or 120.

Figure 62:
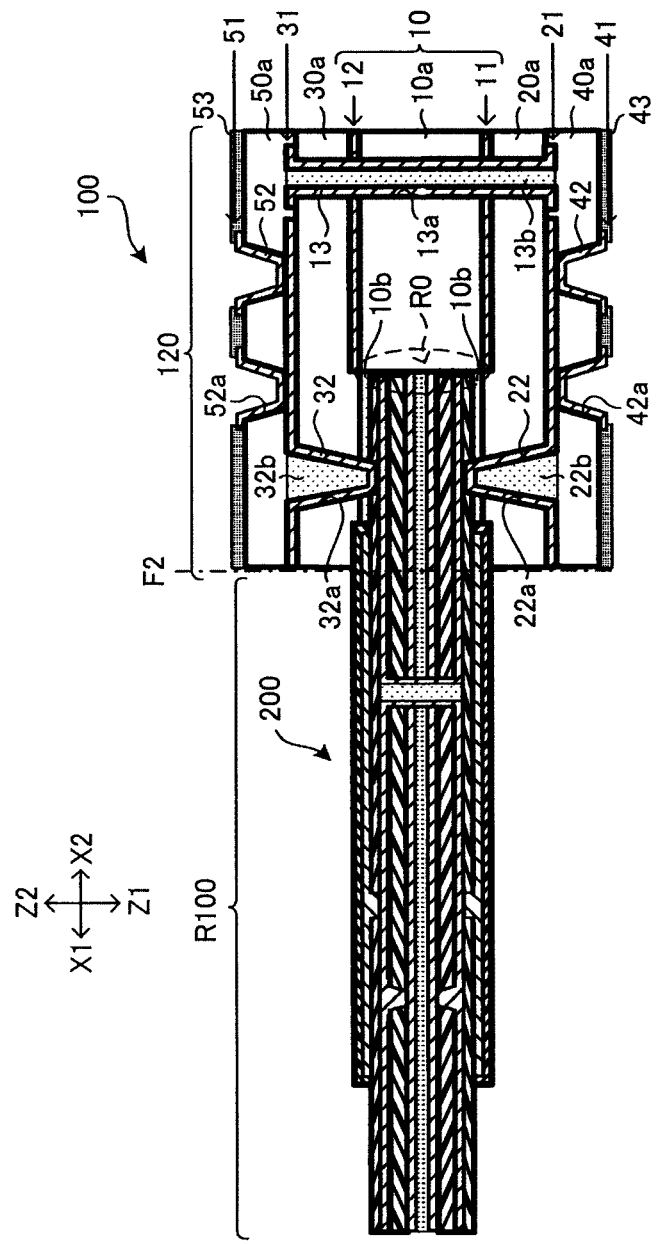
FIG. 62 is a view showing an example of a flying-tail structure.

The number of rigid sections is not limited specifically. For example, as shown in FIG. 62, the present invention may be applied to a structure in which only one end of flexible connected body 200 is connected to rigid section 110 and the other end is not connected to any, a so-called flying-tail structure. In a flying-tail structure, flexible connected body 200 protrudes like a tail from rigid section 110. Alternatively, three or more rigid sections may be connected by splitting flexible connected body 200, for example.

Figure 63:
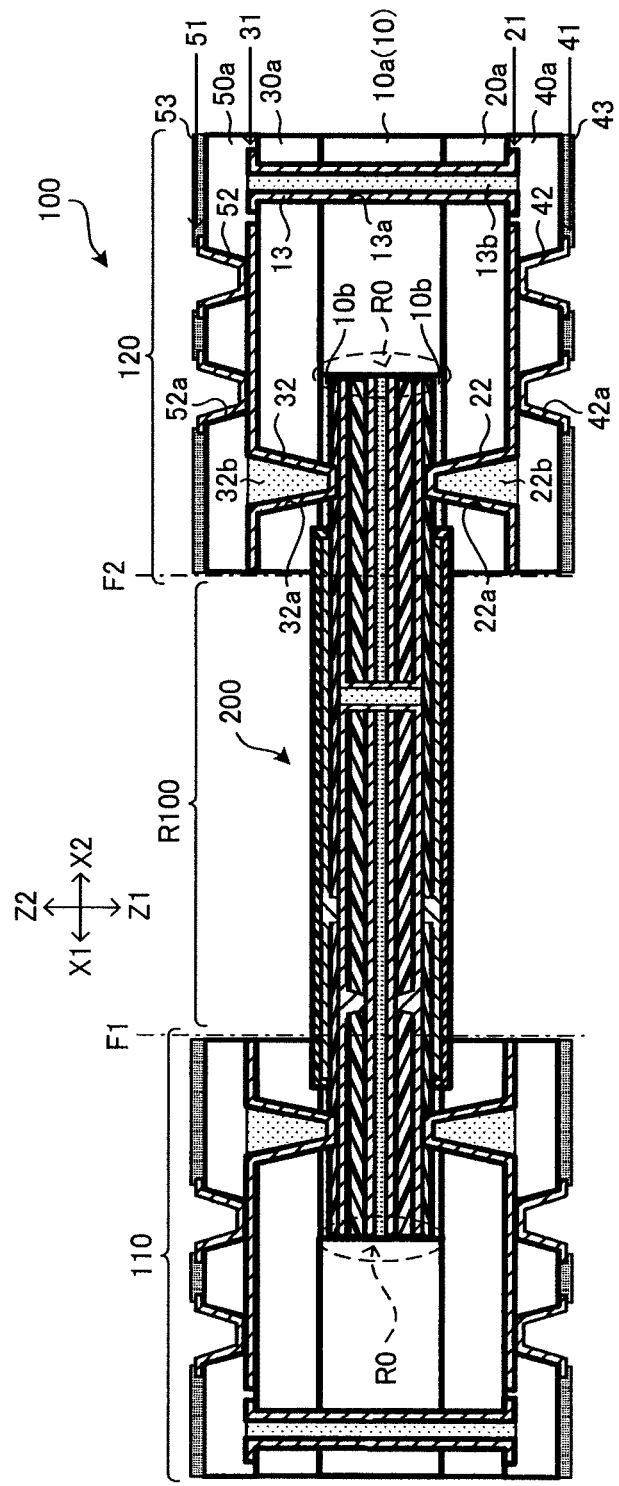
FIG. 63 is a view showing an example where the core substrate of a flex-rigid wiring board is formed only with insulation layers (insulative substrate).

As shown in FIG. 63, for example, substrate 10 (the core substrate of flex-rigid wiring board 100) may be structured only with insulation layer (10a) (insulative substrate). When manufacturing such flex-rigid wiring board 100, it is thought that the steps for forming wiring layers (11, 12) may be omitted. As a result, it is thought that a reduction in manufacturing costs may be achieved.

Regarding other factors, structures of rigid sections (110, 120), flexible connected body 200 and the like, as well as the type, performance, size, quality, shape, number of layers, position and so forth of the elements of such structures, may be modified freely within a scope that does not deviate from the gist of the present invention.

Flexible connected body 200 may contain three or more flexible wiring boards.

The number of layers in rigid sections (110, 120) and flexible connected body 200 is not limited specifically. For example, to achieve higher functionality, they may be structured as further multilayer wiring boards. Alternatively, they may be structured to have fewer layers. Yet alternatively, the number of layers may be different on each surface (first surface, second surface) of the core section. Furthermore, layers (wiring layers and insulation layers) may be formed (laminated) only on one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoint of insulation, dielectric properties, resistance to heat, mechanical features and so forth. In addition, the above resins may contain additives such as a curing agent, a stabilizer, filler or the like. Alternatively, each wiring layer and each insulation layer may be formed with multiple layers having different materials.

The conductors formed in holes in built-up sections may be connection conductors or conformal conductors. However, to secure wiring regions, connection conductors are preferred.

The steps in the above embodiments are not limited to the order and contents shown in the flowchart in FIG. 12. The order and contents may be modified freely within a scope that does not deviate from the gist of the present invention. Also, unnecessary steps may be omitted according to usage requirements or the like.

For example, forming various conductive patterns is not limited to any specific method. Conductive patterns may be formed by any one of the following, or any combination of two or more such methods: panel plating method, pattern plating method, full-additive method, semi-additive (SAP) method, subtractive method and tenting method.

The above alternative examples and the like may be combined. For example, the following structures may be combined freely: structures regarding connection sections of multiple flexible wiring boards shown in FIGS. 32-34C; structures regarding conductive patterns of flexible wiring boards shown in FIGS. 4A-5B, 10A, 10B, 35 and 36; structures regarding through holes in flexible wiring boards shown in FIGS. 7A, 7B and 37-42; structures regarding insulation layers shown in FIGS. 43-45; structures regarding F-R connection sections shown in FIG. 46-52B; and other structures shown in FIGS. 53-63.

A flex-rigid wiring board according to one aspect of the present invention has an insulative substrate (substrate: base material), a flexible connected body positioned beside the insulative substrate and formed by connecting multiple flexible wiring boards, and an insulation layer positioned on a boundary portion between the insulative substrate and the flexible connected body and exposing at least part of the flexible connected body. Here, at least one of the multiple flexible wiring boards is a double-sided flexible wiring board, and a conductor on one side of the flexible connected body and a conductor on the other side are electrically connected to each other by a conductor which penetrates from one side of the multiple flexible wiring boards through the conductor on the other side.

A method for manufacturing a flex-rigid wiring board according to another aspect of the present invention includes the following: forming a flexible connected body made by connecting multiple flexible wiring boards including at least one double-sided flexible wiring board, where a conductor on one side and a conductor on the other side are electrically connected by a conductor that penetrates from one side of the multiple flexible wiring boards through the other side; positioning the flexible connected body beside an insulative substrate; positioning an insulation layer on a boundary portion between the insulative substrate and the flexible connected body so that at least part of the flexible connected body is exposed; and connecting the insulative substrate, the flexible connected body and the insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising: an insulative substrate; a flexible connected body positioned beside the insulative substrate and comprising a plurality of flexible wiring boards; and an insulation layer positioned over the insulative substrate and the flexible connected body and having a portion exposing a portion of the flexible connected body, wherein the plurality of flexible wiring boards includes a double-sided flexible wiring board having a conductive layer on one surface of the double-sided flexible wiring board and a conductive layer on an opposite surface of the double-sided flexible wiring board, the flexible connected body has a conductor on one side of the flexible connected body, a conductor on an opposite side of the flexible connected body, and a through-hole conductor electrically connecting the conductor on the one side of the flexible connected body and the conductor on the opposite side of the flexible connected body, and the through-hole conductor of the flexible connected body is penetrating from one side of the plurality of flexible wiring boards through an opposite side of the plurality of flexible wiring boards, the insulation layer has a hole extending to the flexible connected body and a conductor formed along the hole of the insulation layer, and the conductive layer on the one surface of the double-sided flexible wiring board is connecting the through-hole conductor and the conductor formed along the hole of the insulation layer.

2. The flex-rigid wiring board according to claim 1, wherein the flexible connected body is a connected body formed with the plurality of flexible wiring boards, and the plurality of flexible wiring boards comprises a plurality of double-sided flexible wiring boards.

3. The flex-rigid wiring board according to claim 1, wherein the flexible connected body is a connected body formed with the plurality of flexible wiring boards, and the plurality of flexible wiring boards comprises the double-sided flexible wiring board and a single-sided flexible wiring board.

4. The flex-rigid wiring board according to claim 1, wherein the conductive layer on the one surface of the double-sided flexible wiring board is formed in a region that excludes an orthogonal projection region of the conductive layer on the opposite surface of the double-sided flexible wiring board.

5. The flex-rigid wiring board according to claim 1, wherein the plurality of flexible wiring boards includes a flexible wiring board comprising a flexible substrate, a conductor formed on the flexible substrate, and a coverlay coating the conductor on the flexible substrate.

6. The flex-rigid wiring board according to claim 1, wherein the flexible connected body comprises an adhesive member connecting the flexible wiring boards.

7. The flex-rigid wiring board according to claim 6, wherein the adhesive member has a portion positioned in a rigid section of the flex-rigid wiring board.

8. The flex-rigid wiring board according to claim 1, wherein the through-hole conductor is positioned in a rigid section of the flex-rigid wiring board.

9. The flex-rigid wiring board according to claim 1, wherein the through-hole conductor is a filled conductor.

10. The flex-rigid wiring board according to claim 1, further comprising a conductor layer formed on the insulation layer, wherein the conductor formed along the hole of the insulation layer is electrically connecting the conductor layer formed on the insulation layer and the conductor on the one side of the flexible connected body.

11. The flex-rigid wiring board according to claim 10, wherein the conductor formed along the hole of the insulation layer is filling the hole.

12. The flex-rigid wiring board according to claim 10, wherein the conductor formed along the hole of the insulation layer is formed by plating a metal.

13. The flex-rigid wiring board according to claim 1, further comprising:
a second insulation layer positioned on an opposite side of the insulation layer over the insulative substrate and the flexible connected body and having a portion exposing a portion of the flexible connected body; and
a conductor layer formed on the second insulation layer, wherein the second insulation layer has a hole extending to the flexible connected body and a conductor formed along the hole of the second insulation layer, and the conductor formed along the hole of the second insulation layer is electrically connecting the conductor layer formed on the second insulation layer and the conductor on the opposite side of the flexible connected body.

14. The flex-rigid wiring board according to claim 1, wherein the flexible connected body includes a shield layer formed on one of the flexible wiring boards.

15. The flex-rigid wiring board according to claim 1, wherein the plurality of flexible wiring boards includes a flexible wiring board having a full plain conductive pattern.

16. The flex-rigid wiring board according to claim 1, wherein the flexible wiring boards is positioned with a space which is decompressed.

17. The flex-rigid wiring board according to claim 1, wherein the flexible connected body includes a filler filling a space between the flexible wiring boards.

18. The flex-rigid wiring board according to claim 1, wherein the conductor on the one side of the flexible connected body includes a portion which is a triple-layer conductive layer made by laminating a metal foil, electroless plating and electrolytic plating.

19. The flex-rigid wiring board according to claim 1, wherein the conductor on the one side of the flexible connected body is a triple-layer conductive layer made by laminating a metal foil, electroless plating and electrolytic plating.

20. The flex-rigid wiring board according to claim 1, wherein the plurality of flexible wiring boards includes a flexible wiring board comprising a flexible substrate and a coverlay adhered on the flexible substrate through an adhesive member, the through-hole conductor is formed on a wall surface of a through-hole formed from the one side of the plurality of flexible wiring boards through the opposite side of the plurality of flexible wiring boards, and the adhesive member adhering the coverlay is filled inside the through-hole conductor.

21. The flex-rigid wiring board according to claim 1, wherein the through-hole conductor is formed on a wall surface of a through-hole formed from the one side of the plurality of flexible wiring boards through the opposite side of the plurality of flexible wiring boards, and the wall surface of the through-hole is treated with a surface treatment.

22. The flex-rigid wiring board according to claim 1, further comprising:
a second insulation layer positioned on an opposite side of the insulation layer over the insulative substrate and the flexible connected body and having a portion exposing a portion of the flexible connected body;
a conductor layer formed on the insulation layer;
a conductor layer formed on the second insulation layer; and
a connection conductor penetrating through the insulative substrate, the insulation layer and the second insulation layer and connecting the conductor on the insulation layer and the conductor on the second insulation layer.

23. The flex-rigid wiring board according to claim 1, further comprising:
a conductor formed on the insulation layer; and
a conductor formed on one of the flexible wiring boards,
wherein the insulation layer has a hole extending to the one of the flexible wiring boards and a conductor formed along the hole extending to the one of the flexible wiring boards, and the conductor formed along the hole extending to the one of the flexible wiring boards is connecting the conductor on the insulation layer and the conductor on the one of the flexible wiring boards.

24. The flex-rigid wiring board according to claim 1, further comprising a conductor formed on the insulation layer, wherein the conductor formed along the hole extending to the flexible connected body is connecting the conductor formed on the insulation layer and the conductor on the one side of the flexible connected body, and the conductor formed along the hole extending to the flexible connected body is made of a conductive paste.

25. The flex-rigid wiring board according to claim 1, further comprising a built-in electronic component.

26. The flex-rigid wiring board according to claim 1, further comprising an electronic component mounted on the insulation layer.

27. The flex-rigid wiring board according to claim 1, wherein only one end of the flexible connected body is connected to a rigid section of the flex-rigid wiring board.

28. The flex-rigid wiring board according to claim 1, wherein the flexible connected body has a width which is enlarged near a boundary between the insulation layer and the portion of the flexible connected body exposed by the portion of the insulation layer.

29. The flex-rigid wiring board according to claim 1, wherein the flexible connected body has a width which is enlarged in a region where the insulation layer and the flexible connected body are laminated and connected.

30. The flex-rigid wiring board according to claim 1, wherein the flexible connected body has a conductor layer having a conductive pattern which is formed to fan out.

31. The flex-rigid wiring board according to claim 1, wherein the insulation layer has a protruding portion protruding over a portion of the flexible connected body forming a flexible section of the flex-rigid wiring board.

32. The flex-rigid wiring board according to claim 1, wherein the flex-rigid wiring board has a first rigid section comprising the insulative substrate, a portion of the flexible connected body and the insulation layer, the flex-rigid wiring board has a second rigid section connected to a portion of the flexible connected body on an opposite end of the portion of the flexible connected body in the first rigid section, and the second rigid section comprises a plurality of layers which has a number of layers different from a number of layers forming the first section.

* * * * *